(12) United States Patent
Hasegawa et al.

(10) Patent No.: US 6,995,961 B2
(45) Date of Patent: Feb. 7, 2006

(54) MAGNETIC SENSING ELEMENT COMPRISING ANTIFERROMAGNETIC LAYER LAMINATED ON FREE MAGNETIC LAYER

(75) Inventors: Naoya Hasegawa, Niigata-ken (JP); Fumihito Koike, Niigata-ken (JP); Eiji Umetsu, Niigata-ken (JP); Masahiko Ishizone, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 153 days.

(21) Appl. No.: 10/400,946

(22) Filed: Mar. 27, 2003

(65) Prior Publication Data

US 2003/0184925 A1 Oct. 2, 2003

(30) Foreign Application Priority Data

Mar. 29, 2002 (JP) ............................. 2002-094031

(51) Int. Cl.
 *G11B 5/39* (2006.01)
(52) U.S. Cl. ................................................. 360/324.12
(58) Field of Classification Search ............. 360/324.1, 360/324.11, 324.12, 324.2
 See application file for complete search history.

(56) References Cited

U.S. PATENT DOCUMENTS

| | | | |
|---|---|---|---|
| 5,891,586 A | 4/1999 | Hasegawa et al. ........... 428/668 |
| 6,172,858 B1 | 1/2001 | Yoda et al. ................... 360/313 |
| 6,287,709 B1 | 9/2001 | Mizuguchi ..................... 428/611 |
| 6,301,089 B1 | 10/2001 | Saito et al. .................... 360/313 |
| 6,338,899 B1 | 1/2002 | Fukuzawa et al. ........... 428/332 |
| 6,704,175 B2 * | 3/2004 | Li et al. ...................... 360/324.11 |
| 6,710,984 B1 * | 3/2004 | Yuasa et al. ............. 360/324.11 |
| 6,724,585 B2 * | 4/2004 | Hayashi .................... 360/324.2 |
| 6,826,022 B2 * | 11/2004 | Umetsu .................. 360/324.12 |
| 6,831,817 B2 * | 12/2004 | Hasegawa et al. ..... 360/324.12 |
| 6,856,494 B2 * | 2/2005 | Ooshima et al. ....... 360/324.12 |
| 6,857,180 B2 * | 2/2005 | Horng et al. ............. 29/603.14 |
| 6,867,952 B2 * | 3/2005 | Hasegawa .............. 360/324.12 |
| 6,873,501 B2 * | 3/2005 | Zheng et al. .......... 360/324.12 |
| 2001/0050834 A1 * | 12/2001 | Hasegawa et al. ..... 360/324.12 |
| 2002/0034057 A1 * | 3/2002 | Noma et al. ........... 360/324.12 |
| 2002/0036878 A1 * | 3/2002 | Umetsu ................. 360/324.12 |

* cited by examiner

Primary Examiner—Jefferson Evans
(74) Attorney, Agent, or Firm—Brinks Hofer Gilson & Lione

(57) ABSTRACT

Changes of the direction of magnetization at the central region of the free magnetic layer are facilitated by using a layer of a magnetic material having a small exchange stiffness constant such as a $Ni_aFe_b$ layer (a and b are represented in at %, and satisfy the relation of a>80 and a+b=100) and NiFeX layer (X is at least one element selected from Mn, Cu, Zn, Ti, Al, Ge, Si, Cr, V, Sn, Ir, Ru, Nb, Sb, W, Mo, Os and Ta) for the magnetic material layer of the free magnetic layer.

49 Claims, 29 Drawing Sheets

MAGNETIC SENSING ELEMENT COMPRISING ANTIFERROMAGNETIC LAYER LAMINATED ON FREE MAGNETIC LAYER

This application claims the benefit of priority to Japanese Patent Application 2002-094031, filed on Mar. 29, 2002.

BACKGROUND OF THE INVENTION

1. Field of the Invention

The present invention mainly relates to a magnetic sensing element used for a hard disk and magnetic sensor, in particular to a magnetic sensing element being excellent in reproductive properties even in a narrow track-width structure, and a method for manufacturing the same.

2. Description of the Related Art

FIG. 35 is a partial cross section of the structure of a conventional magnetic sensing element viewed from the opposed face side to a magnetic recording medium.

In FIG. 35, the reference numeral 1 denotes a substrate, and a multilayer 6 comprising a first antiferromagnetic layer 2, a pinned magnetic layer 3, a nonmagnetic layer 4 and a free magnetic layer 5 are formed on the substrate 1. A ferromagnetic layer 7 and a second antiferromagnetic layer 8 are formed on each side region of the free magnetic layer 5, and an electrode layer 9 is formed on each second antiferromagnetic layer 8.

Magnetization of the pinned magnetic layer 3 is fixed in the Y-direction in the drawing by an exchange coupling magnetic field generated between the pinned magnetic layer and first antiferromagnetic layer 2. Magnetization of the ferromagnetic layers 7 located under each second antiferromagnetic layer 8 and magnetization at each side region C of the free magnetic layer 5 are tightly fixed in the X-direction in the drawing by an exchange magnetic field generated between the second antiferromagnetic layer 8 and these layers, and the central region D of the free magnetic layer 5 in the track width region Tw is weakly put into a single magnetic domain state to an extent capable of magnetic variation against an external magnetic field.

The method for controlling magnetization of the free magnetic layer 5 using a pair of the second antiferromagnetic layers 8 and 8 as shown in FIG. 35 is called an exchange bias method, and the optical track width Tw is defined by the distance between the second antiferromagnetic layers 8 in the track width direction (X-direction) as shown in FIG. 35.

Since the direction of magnetization of the free magnetic layer 5 is tightly fixed at each side region C of the free magnetic layer 5 located below each second antiferromagnetic layer 8 in the magnetic sensing element employing the exchange bias method, magnetization can be readily varied at the entire region of the central region D. In other words, substantially no region where magnetization is not varied by the external magnetic field—or a so called dead zone—exists within the optical track width Tw of the magnetic sensing element shown in FIG. 34. Accordingly, this magnetic sensing element is excellent in complying with a narrow track width structure.

It is required in recent years to reduce the optical track width of the magnetic sensing element to 0.15 μm or less, particularly in the range of 0.10 to 0.12 μm. However, the output of the sensed magnetic field of the magnetic sensing element is extremely reduced at an optical track width of 0.15 μm or less even in the magnetic sensing element using the exchange bias method.

FIG. 36 is a graph showing the relation between the optical track width and output of the sensed magnetic field in the exchange bias magnetic sensing element shown in FIG. 35. The output of the sensed magnetic field is obtained as a voltage change from the magnetic sensing element. In this graph, the ratio of the height MRh of the element to the optical track width is defined to be 0.75.

The first antiferromagnetic layer 2 and the second antiferromagnetic layers 8 are made of a PtMn alloy, the pinned magnetic layer 3 is made of a CoFe alloy, the nonmagnetic layer 4 is made of Cu, the free magnetic layer 5 is made of a $Ni_{80}Fe_{20}$ alloy or Co, and the electrode layers 9 are made of Cr.

In the graph in FIG. 36, the curve indicated by the marks (◇) shows the result using the free magnetic layer 5 made of the $Ni_{80}Fe_{20}$ alloy, and the curve indicated by the marks (□) shows the result using the free magnetic layer 5 made of Co.

FIG. 36 shows that the output of the sensed magnetic field becomes small as the optical track width is reduced. Particularly, the output of the sensed magnetic field rapidly decreases when the optical track width is decreased to 0.12 μm or less, particularly to 0.1 μm or less.

The same results were obtained when the free magnetic layer 5 is made of a $Co_{90}Fe_{10}$ alloy.

SUMMARY OF THE INVENTION

Accordingly, it is an object of the present invention for solving the problems as described above to provide a magnetic sensing element that is able to enhance the output of the sensed magnetic field even in the exchange bias magnetic sensing element having a narrow track width.

The present invention provides a magnetic sensing element having a multilayer comprising a first antiferromagnetic layer, pinned magnetic layer, nonmagnetic layer and free magnetic layer laminated in this order. A pair of second antiferromagnetic layers are formed with a distance apart in a track width direction so as to be stacked at least on both side regions of the free magnetic layers in the track width direction. The free magnetic layer comprises at least one of a NiFe layer with a composition of $Ni_aFe_b$, a NiFeX layer, an amorphous Co alloy layer comprising an amorphous Co based magnetic material and a CoFeX layer, wherein a and b in $Ni_aFe_b$ are represented by at % and satisfy the relations of a>80 and a+b=100, X in the NiFeX layer represents at least one element selected from Mn, Cu, Zn, Ti, Al, Ge, Si, Cr, V, Sn, Ir, Ru, Nb, Sb, W, Mo, Os and Ta, and X in the CoFeX layer represents at least one element selected from Ti, Al, Mn, Si, V, Cr, Ta, Zn, Sb, Ge, Mo and W.

As mentioned above, a $Ni_{80}Fe_{20}$ alloy, Co and a $Co_{90}Fe_{10}$ alloy have been used as the magnetic material constituting the free magnetic layer.

In contrast, the exchange bias magnetic sensing element has became to have a narrow track width while maintaining a high output of the sensed magnetic field by forming the free magnetic layer comprising the NiFe layer, NiFeX layer, amorphous Co alloy layer or CoFeX layer.

The NiFeX layer is a thin layer comprising the magnetic material having a composition represented by NiFeX (X is at least one element selected from Mn, Cu, Zn, Ti, Al, Ge, Si, Cr, V, Sn, Ir, Ru, Nb, Sb, W, Mo, Os and Ta), and the CoFeX layer is a thin layer comprising the magnetic material having a composition represented by CoFeX (X is at least one element selected from Ti, Al, Mn, Si, V, Cr, Ta, Zn, Sb, Ge, Mo and W).

The free magnetic layer is able to maintain a high output of the sensed magnetic field by forming it with the NiFe layer, NiFeX layer, amorphous Co alloy layer or CoFeX layer, and theoretical bases thereof will be described hereinafter.

The present invention is particularly effective when the optical track width O-Tw defined by the distance between a pair of the second antiferromagnetic layers in the track width direction is 0.15 μm or less.

The present invention is more effective when the optical track width O-Tw is 0.12 μm or less, particularly 0.10 μm or less.

Preferably, the free magnetic layer has a structure in which a magnetic layer containing Co is laminated on at least one of the NiFe layer with a composition of $Ni_aFe_b$ or NiFeX layer, wherein a and b in $Ni_aFe_b$ are represented by at % and satisfy the relations of a>80 and a+b=100, and X in the NiFeX layer represents at least one element selected from Mn, Cu, Zn, Ti, Al, Ge, Si, Cr, V, Sn, Ir, Ru, Nb, Sb, W, Mo, Os and Ta.

The exchange coupling magnetic field between the free magnetic layer and second antiferromagnetic layer increases by laminating a magnetic layer containing Co on the NiFe layer or NiFeX layer, and by laminating the second antiferromagnetic layer on the magnetic layer containing Co. Since the direction of magnetization of each side region of the free magnetic layer overlapping each layer of a pair of the second antiferromagnetic layers is tightly fixed in one direction, the proportion of side reading by which an external magnetic field (recording signal magnetic field) is sensed at the outside of the optical track width may be reduced. The magnetic layer containing Co may be formed of, for example, Co, a CoFe alloy, a crystalline CoFeCr alloy or an amorphous Co based alloy.

Preferably, the free magnetic layer has a structure comprising at least one of the amorphous Co alloy layer comprising the amorphous Co based magnetic material and the CoFeX layer, or a laminated structure of both layers. X in the CoFeX layer represents at least one element selected from Ti, Al, Mn, Si, V, Cr, Ta, Zn, Sb, Ge, Mo and W.

When the free magnetic layer is formed as a layer comprising the amorphous Co alloy layer, a magnetic layer having a smaller resistivity than the amorphous Co alloy layer is preferably laminated under the amorphous Co alloy layer. Alternatively, a magnetic layer having a smaller resistivity than the CoFeX layer is laminated under the CoFeX layer when the free magnetic layer is formed as a layer comprising the CoFeX layer.

Preferably, the magnetic layer having a small resistivity comprises at least one of the NiFe layer and NiFeX layer, wherein X in the NiFeX layer represents at least one element selected from Mn, Cu, Zn, Ti, Al, Ge, Si, Cr, V, Sn, Ir, Ru, Nb, Sb, W, Mo, Os and Ta.

Preferably, the free magnetic layer comprises a $(Co_xFe_y)_e Cr_f$ layer as the uppermost layer or lowermost layer closest to the second antiferromagnetic layer, in order to increase the exchange coupling magnetic field between the free magnetic layer and second antiferromagnetic layer, wherein x and y are represented in at % ratio of Co to Fe with a relation of x+y=1, and e and f represented by at % satisfy the relations of 0<f<20 and e+f=100. The layer structure above permits the proportion of side reading of the magnetic sensing element to be effectively reduced.

Preferably, x and y as the at % ratio of Co to Fe in the $(Co_xFe_y)_e Cr_f$ layer satisfy the relation of x>y, particularly the relations of $0 \leq y \leq 0.3$ and x+y=1. It is also preferable that e and f represented by at % satisfy the relation of 0<f<20 and e+f=100.

Preferably, the uppermost layer or the lowermost layer of the free magnetic layer is the $(Co_xFe_y)_e Cr_f$ layer, wherein x and y represent the at % ratio of Co to Fe satisfying the relation of x+y=1, and e and f represented by at % satisfy the relation of $5 \leq f \leq 15$ and e+f=100.

It is preferable for increasing the exchange coupling magnetic field between the free magnetic layer and second antiferromagnetic layer that the thickness of $(Co_xFe_y)_e Cr_f$ layer is 2 Å or more and 10 Å or less, more preferably 3 Å or more and 6 Å or less.

A high output of the sensed magnetic field may be maintained by forming the free magnetic layer with the NiFe layer, NiFeX layer, amorphous Co alloy layer or CoFeX layer, since the NiFe layer, NiFeX layer, amorphous Co alloy layer or CoFeX layer has a small exchange stiffness constant.

An exchange energy may be stored when spins of magnetic atoms constituting the magnetic material are not parallel with each other.

The exchange stiffness constant is a constant defining the magnitude of the exchange energy among the distributed spins.

According to the description by Satonobu Chikakaku (Physics of Ferromagnetic material, pp 166 to 169, 1984, Shoka-boh), the exchange energy Eex per unit volume of a magnetic material is represented by:

$$E_{ex} = A \left\{ \left( \frac{\partial \alpha}{\partial x} \right)^2 + \left( \frac{\partial \alpha}{\partial y} \right)^2 + \left( \frac{\partial \alpha}{\partial z} \right)^2 \right\} \quad (1)$$

and $$A = \frac{nJS^2}{a} \quad (2)$$

where α denotes a unit vector parallel to the direction of a spin at each lattice point of the magnetic material having a cubic crystal structure, (x, y, z) denote the coordinate of the cubic crystal axis, "a" denotes a lattice constant (the length of the edge of a unit cell), "n" denotes the number of atoms belonging to the unit cell, "S" denotes a spin quantum number of an atom contained in the magnetic material, and "J" denotes a constant representing a spin interaction strength of the atoms contained in the magnetic material.

The equations mean that the exchange energy Eex per unit volume of the magnetic material is given as a quadratic function of the angular deformation of the spin at each lattice point of the magnetic material. The constant A is called the exchange stiffness constant.

This mean that the directions of adjoining spins may be more rapidly changed as the exchange stiffness constant A is smaller.

Using a magnetic material having a small stiffness constant A such as the NiFe layer, NiFeX layer, amorphous Co alloy layer or CoFeX layer for the free magnetic layer permits the free magnetic layer to readily change its direction of magnetization in the entire track width region, enabling a high output of the sensed magnetic field to be maintained even when the magnetic sensing element has a narrow track width.

Since the magnetic material having a small exchange stiffness constant A has a small saturation magnetization Ms at room temperature, the NiFe layer, NiFeX layer, amorphous Co alloy layer or CoFeX layer formed of the magnetic material having a small exchange stiffness constant A also has a small magnetic moment Ms×t per unit area. Accordingly, the direction of magnetization of the sensitive region (track width region) of the free magnetic layer comprising the NiFe layer, NiFeX layer, amorphous Co alloy layer or CoFeX layer is readily changed by the external magnetic field (recording magnetic field), thereby improving the sensitivity for sensing the magnetic field.

It is particularly preferable that the exchange stiffness constant of the magnetic material constituting the NiFe layer with a composition of $Ni_aFe_b$, NiFeX layer, amorphous Co alloy layer comprising the amorphous Co based magnetic material or CoFeX layer to be used for the free magnetic layer is smaller than the exchange stiffness constant of the magnetic material represented by a composition of $Ni_{80}Fe_{20}$ that has been used as the material of the free magnetic layer of the conventional magnetic sensing element. Here, a and b in $Ni_aFe_b$ are represented by at % and satisfy the relations of a>80 and a+b=100, X in the NiFeX layer represents at least one element selected from Mn, Cu, Zn, Ti, Al, Ge, Si, Cr, V, Sn, Ir, Ru, Nb, Sb, W, Mo, Os and Ta, and X in the CoFeX layer represents at least one element selected from Ti, Al, Mn, Si, V, Cr, Ta, Zn, Sb, Ge, Mo and W.

The $Ni_{80}Fe_{20}$ magnetic material has an exchange stiffness constant of $0.8\times10^{-6}$ to $1.0\times10^{-6}$ (erg/cm), or $0.8\times10^{-11}$ to $1.0\times10^{-11}$ (J/m). The $Co_{90}Fe_{10}$ magnetic material has an exchange stiffness constant of $1.3\times10^{-6}$ to $1.8\times10^{-6}$ (erg/cm), or $1.3\times10^{-11}$ to $1.8\times10^{-11}$ (J/m).

The magnetic material having a small exchange stiffness constant also has a low Curie temperature. When the Curie temperature of the magnetic material constituting the free magnetic layer is close to or lower than the operating temperature of the magnetic sensing element, magnetization of the free magnetic layer is largely fluctuated or magnetic properties of the free magnetic layer are lost, thereby making it impossible for the magnetic sensing element to fully display its function.

Since the operating temperature of the magnetic sensing element is about 100° C., it is preferable in the present invention that the exchange stiffness constant of the magnetic material constituting the NiFe layer, NiFeX layer, amorphous Co alloy layer or CoFeX layer for forming the free magnetic layer is $4\times10^{-7}$ (erg/cm) or more, or $4\times10^{-12}$ (J/m) or more. Here again, X in the NiFeX layer represents at least one element selected from Mn, Cu, Zn, Ti, Al, Ge, Si, Cr, V, Sn, Ir, Ru, Nb, Sb, W, Mo, Os and Ta, and X in the CoFeX layer represents at least one element selected from Ti, Al, Mn, Si, V, Cr, Ta, Zn, Sb, Ge, Mo and W.

Preferably, a third antiferromagnetic layer is laminated between the second antiferromagnetic layer and free magnetic layer in the present invention.

The third antiferromagnetic layer serves as an antiferromagnetic-oxidation layer in the process for forming the magnetic sensing element according to the present invention.

The third antiferromagnetic layer preferably has a thickness of larger than 10 Å and 50 Å or less, more preferably has a thickness of larger than 30 Å and 40 Å or less.

Suppressing the thickness of the third antiferromagnetic layer permits a large exchange coupling magnetic field to be prevented from being generated between the third antiferromagnetic layer and free magnetic layer at the central regions thereof.

It becomes difficult to allow the direction of magnetization of the first antiferromagnetic layer to be orthogonal to the direction of magnetization of the second antiferromagnetic layer in manufacturing the magnetic sensing element as will be described hereinafter, when the thickness of the third antiferromagnetic layer is larger than 50 Å.

It is also preferable that a nonmagnetic layer comprising a precious metal is formed between the second antiferromagnetic layer and free magnetic layer, or between the second antiferromagnetic layer and third antiferromagnetic layer.

The nonmagnetic layer is provided for protecting the free magnetic layer from being oxidized as a result of exposure to the atmosphere in the manufacturing process of the magnetic sensing element. The nonmagnetic layer is formed of a hardly oxidized precious metal in the present invention.

A Ta layer has been used for forming the nonmagnetic layer between the second antiferromagnetic layer and free magnetic layer, or between the second antiferromagnetic layer and third antiferromagnetic layer in the conventional art. However, Ta is not preferable since it is more readily oxidized as compared with the precious metal. A sufficient oxidation preventive effect may be manifested even with a small thickness of the nonmagnetic layer, by using the precious metal layer in place of the Ta layer in the present invention.

Accordingly, low energy ion milling may be used for removing an oxide layer formed on the nonmagnetic layer prior to the process for laminating the second antiferromagnetic layer on the nonmagnetic layer.

Low energy milling as used herein is defined to be ion-milling using an ion beam with a beam voltage (an acceleration voltage) of less than 1000 V. For example, a beam voltage of 100 to 500 V may be used.

Since the milling rate by low energy ion milling is so slow that the margin for the milling limit may be narrowed, enabling the free magnetic layer to be free from a large damage by ion-milling.

The damage that the free magnetic layer suffers includes invasion of inert gases such as Ar used for ion-milling into the free magnetic layer from the exposed surface thereof, and generation of lattice defects due to breakage of the crystal structure on a part of the surface of the free magnetic layer. Magnetic characteristics on the surface of the free magnetic layer tend to be deteriorated by these damages.

Preferably, the precious metal for forming the nonmagnetic layer include at least one of Ru, Rh, Pd, Ir, Os, Re, Pt and Au.

It is preferable to use these precious metals for forming the nonmagnetic layer, since a mixture formed by mixing the material of the nonmagnetic layer with the material of the second antiferromagnetic layer exhibits antiferromagnetic properties, and the antiferromagnetic property of the second antiferromagnetic layer are not deteriorated when the precious metal is diffused in the second antiferromagnetic layer.

Alternatively, a nonmagnetic layer comprising Cr or Cu may be formed between the second antiferromagnetic layer and free magnetic layer, or between the second and third antiferromagnetic layers in the present invention. Oxidation is hardly advanced in Cr and Cu as compared with Ta, and Cr and Cu can exhibit an oxidation preventive effect. Cr is more preferable than Cu, since oxidation is more retarded in Cr than in Cu.

A ferromagnetic layer may be also formed between the second antiferromagnetic layer and free magnetic layer, or between the second antiferromagnetic layer and nonmagnetic layer in the present invention.

The magnetic sensing element of the present invention may have an opening as well as a groove having a prescribed width in the track width on the surface of the second antiferromagnetic layer.

The track width of the magnetic sensing element is defined by the width of the groove in the present invention. In other words, the direction of magnetization of the magnetic layer such as the free magnetic layer, which changes the direction of magnetization depending on the external magnetic field, can be changed only in the region overlapping the bottom face of the groove. Moreover, since the second antiferromagnetic layer deposited with a uniform thickness may be formed only by milling using reactive ion-etching (RIE) or ion-milling, the groove can be formed with a precise width, or the track width of the magnetic sensing element can be precisely defined.

It is preferable that the side faces of the groove are perpendicular to the surface of the second antiferromagnetic layer, in order to precisely define the track width of the magnetic sensing element.

The bottom face of the groove is provided, for example, within the second antiferromagnetic layer in the present invention.

It is preferable that the bottom face of the groove is provided within the second antiferromagnetic layer so that the thickness of the second antiferromagnetic layer in the region overlapping the bottom face of the groove, or the combined thickness of the second and third antiferromagnetic layers in the region overlapping the bottom face of the groove, is 10 Å or more and 50 Å or less, more preferably 30 Å or more and 40 Å or less, since the direction of magnetization of the first antiferromagnetic layer is readily allowed to be orthogonal to the direction of magnetization of the second antiferromagnetic layer in the process for forming the magnetic sensing element.

Otherwise, the bottom face of the groove may be provided within the third antiferromagnetic layer. The thickness of the third antiferromagnetic layer in the region overlapping the bottom face of the groove is larger than 10 Å and 50 Å or less, more preferably 30 Å or more and 40 Å or less, since the direction of magnetization of the first antiferromagnetic layer is readily allowed to be orthogonal to the direction of magnetization of the second antiferromagnetic layer in the process for forming the magnetic sensing element.

The bottom face of the groove may be provided within the nonmagnetic layer, or within the ferromagnetic layer.

It is preferable in the present invention that the thickness of the nonmagnetic layer is smaller at both side regions than at the central region thereof. The thickness of the nonmagnetic layer at the central region is preferable 3 Å or more and 20 Å or less, more preferably 10 Å or less.

The thickness at the central region of the nonmagnetic layer is determined in the deposition step. Forming the thin nonmagnetic layer in the deposition step enables low energy ion-milling to be used when the side regions of the nonmagnetic layer are further thinned by ion-milling. Accordingly, ion-milling is readily controlled in the present invention so as to leave a part of the side regions of the nonmagnetic layer behind. Consequently, troubles in the conventional art that all the nonmagnetic layer is milled off may be prevented from occurring, and magnetic characteristics at both side regions of the free magnetic layer are properly protected from being deteriorated. Therefore, magnetization of the side regions of the free magnetic layer can be effectively fixed by a ferromagnetic coupling between the free magnetic layer and ferromagnetic layer.

The nonmagnetic layer may be formed with a uniform thickness from the central region through both side regions thereof.

The present invention may be applied to a so-called CIP (current in the plane) type magnetic sensing element, wherein electrode layers are provided on both side regions of the multilayer comprising the free magnetic layer, nonmagnetic layer and pinned magnetic layer in the track width direction, and the sense current flows in the direction parallel to the surface of each layer of the multilayer.

The present invention may be also applied to a so-called CPP (current perpendicular to the plane) magnetic sensing element having upper electrodes and lower electrodes provided on and under the multilayer, respectively, comprising the free magnetic layer, nonmagnetic layer and pinned magnetic layer, wherein the sense current flows in the direction perpendicular to the surface of each layer of the multilayer.

It is also preferable in the present invention that the nonmagnetic layer is formed of a non magnetic conductive material. The magnetic sensing element comprising the nonmagnetic layer formed of the nonmagnetic conductive material is called a spin-valve GMR magnetoresistive element (CPP-GMR).

The nonmagnetic layer may be formed of an insulating material in the CCP magnetic sensing element according to the present invention. This magnetic sensing element is called a spin-valve tunnel effect magnetic sensing element (CPP-TMR).

Thinning the ferromagnetic layer formed under the second antiferromagnetic layer allows the exchange coupling magnetic field generated between the second antiferromagnetic layer and ferromagnetic layer to be strong, permitting magnetization at both side regions of the free magnetic layer to be tightly fixed. Consequently, side-reading is suppressed to enable a magnetic sensing element that can properly cope with narrow track width structure to be manufactured.

Thinning the ferromagnetic layer also enables excess static magnetic field to be suppressed from invading into the central region of the free magnetic layer from the inner side faces of the ferromagnetic layer, thereby enabling sensitivity to be prevented from being reduced at the central region of the free magnetic layer where magnetic inversion is possible.

Practically, the thickness of the ferromagnetic layer formed under the second antiferromagnetic layer is preferably 2 Å or more and 50 Å or less.

DESCRIPTION OF THE PREFERRED EMBODIMENTS

Figure 1:
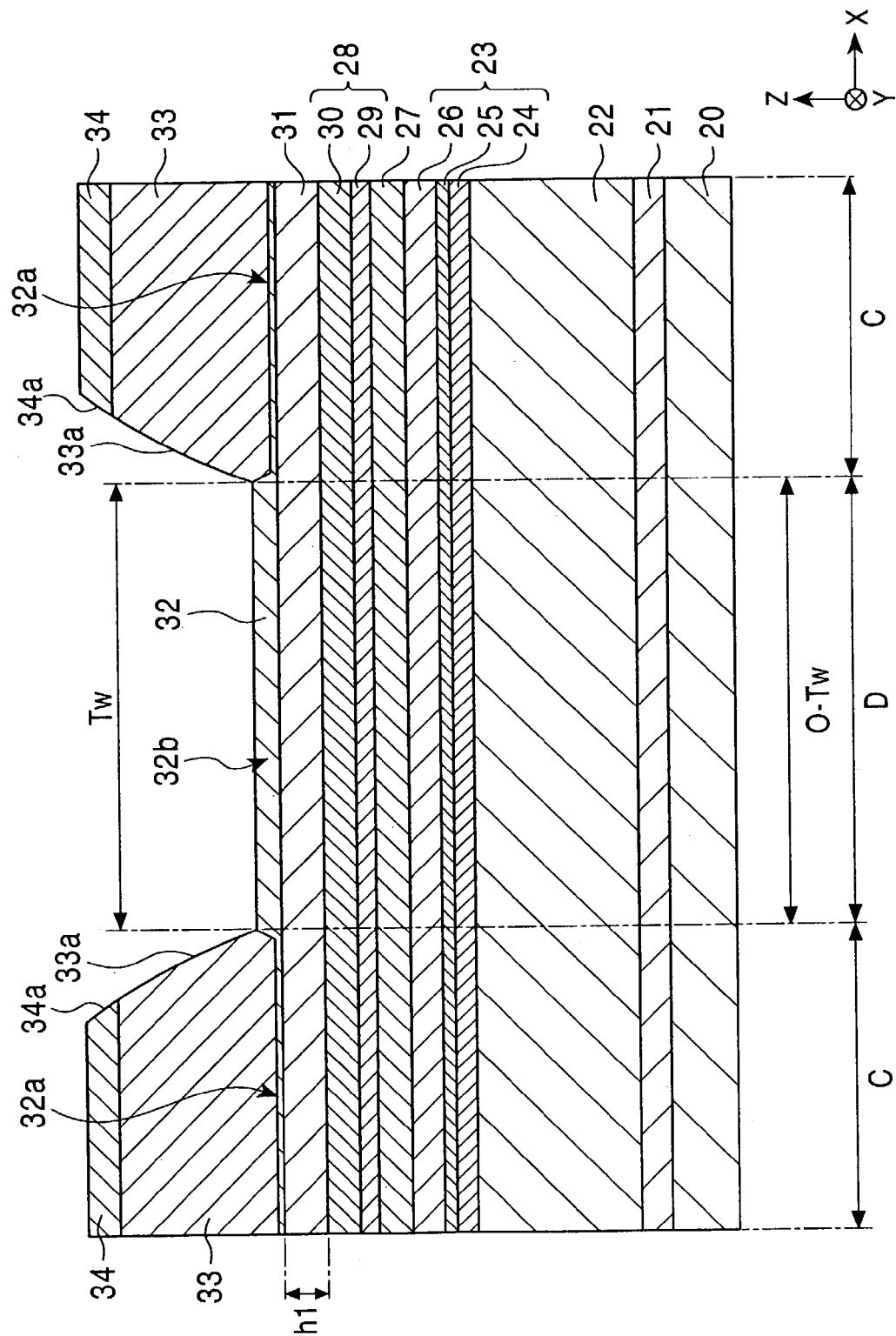
FIG. 1 is a partial cross section of the structure of the magnetic sensing element in a first embodiment of the present invention viewed from an opposed face side to a recording medium.

FIG. 1 shows a partial cross section of the structure of the magnetic sensing element in a first embodiment of the present invention viewed from an opposed face side to a recording medium.

In FIG. 1, the reference numeral 20 denotes a substrate. A seed layer 21 formed of a NiFe alloy, NiFeOr alloy or Cr is formed on the substrate 20. The seed layer 21 comprises, for example, a $(Ni_{0.8}Fe_{0.2})_{60at\%}Cr_{40at\%}$ alloy with a thickness of 60 Å.

A first antiferromagnetic layer 22 is formed on the seed layer 21. The first antiferromagnetic layer 22 is formed of a PtMn alloy, X—Mn alloy or Pt—Mn—X' alloy, wherein X denotes at least one element of Pd, Ir, Rh, Ru, Os, Ni and Fe, and X' denotes at least one element of Pd, Ir, Rh, Ru, Au, Ag, Os, Cr, Ni, Ar, Ne, Xe and Kr.

An exchange coupling layer between the first antiferromagnetic layer 22 and a pinned magnetic layer 23 that generates a large exchange coupling magnetic field can be obtained by using these alloys for the first antiferromagnetic layer 22 followed by heat-treatment of the layer. In particular, an excellent exchange coupling layer between the first antiferromagnetic layer 22 and pinned magnetic layer 23 can be obtained using the PtMn alloy, whereby the exchange coupling layer has an exchange coupling magnetic field of 48 kA/m or more, for example exceeding 64 kA/m, and a blocking temperature of as high as 380° C. The blocking temperature means a temperature of a layer where the exchange coupling magnetic field is extinguished.

While these alloys have a disordered face centered cubic (fcc) structure immediately after deposition, it is transformed into an ordered face centered tetragonal (fct) structure of CuAuI type by a heat treatment.

The first antiferromagnetic layer 22 has a thickness of 80 to 300 Å at the central region in the track width direction.

The pinned magnetic layer 23 is formed on the first antiferromagnetic layer 22. The pinned magnetic layer 23 is an artificial ferrimagnetic structure. The pinned magnetic layer 23 has a three layer structure of magnetic layers 24 and 26 and a nonmagnetic intermediate layer 25 interposed between the magnetic layers.

The magnetic layers 24 and 26 are formed of a magnetic material such as a NiFe alloy, Co, CoNiFe alloy, CoFe alloy and CoNi alloy. The magnetic layers 24 and 26 are preferably formed of the same material with each other.

The nonmagnetic intermediate layer 25 is formed of a nonmagnetic material of an alloy comprising at least one of Ru, Rh, Ir, Cr, Re and Cu. The layer is preferably formed of Ru.

A nonmagnetic layer 27 is formed on the pinned magnetic layer 23. The nonmagnetic layer 27 is provided for preventing the pinned magnetic layer 23 and a free magnetic layer 28 from forming a magnetic coupling while allowing a sense current to flow through this layer, which is preferably formed of a conductive nonmagnetic material such as Cu, Cr, Au and Ag. Cu is preferable among them.

The free magnetic layer 28 is formed on the nonmagnetic layer 27. The free magnetic layer 28 has a two layer structure in the embodiment shown in FIG. 1. The layer with a reference numeral 29 is a diffusion preventive layer comprising Co or a CoFe alloy. The diffusion preventive layer 29 is provided for blocking mutual diffusion between the free magnetic layer 28 and nonmagnetic layer 27. A magnetic material layer 30 is formed on the diffusion preventive layer 29. The magnetic material layer 30 is a feature of the present invention, and the materials and functions thereof will be described hereinafter.

A third antiferromagnetic layer 31 is formed on the free magnetic layer 28. The third antiferromagnetic layer 31 is formed of the PtMn alloy, X—Mn alloy or Pt—Mn—X' alloy as in the first antiferromagnetic layer 22, wherein X denotes at least one element of Pd, Ir, Rh, Ru, Os, Ni and Fe, and X' denotes at least one element of Pd, Ir, Rh, Ru, Au, Ag, Os, Cr, Ni, Ar, Ne, Xe and Kr.

In the embodiment shown in FIG. 1, a nonmagnetic layer 32 is formed on the third antiferromagnetic layer 31. Second antiferromagnetic layers 33 are further formed on both side regions 32a of the nonmagnetic layer 32. The second antiferromagnetic layer 33 is formed of the PtMn alloy, X—Mn alloy or Pt—Mn—X' alloy as in the first antiferromagnetic layer 22, wherein X denotes at least one element of Pd, Ir, Rh, Ru, Os, Ni and Fe, and X' denotes at least one element of Pd, Ir, Rh, Ru, Au, Ag, Os, Cr, Ni, Ar, Ne, Xe and Kr. The second antiferromagnetic layer 33 is preferably formed of the same material as the third antiferromagnetic layer 31.

Electrode layers 34 are formed on respective second antiferromagnetic layers 33. The electrode layer 34 is formed, for example, of Au, W, Cr, Ru, Rh and Ta.

In the embodiment shown in FIG. 1, the inner side faces 33a of the second antiferromagnetic layers 33 and the inner side faces 34a of the electrode layers 34 are formed as inclined faces or curved faces by which the distance between the second antiferromagnetic layers 33 are gradually expanded from the lower face side to the upper face side (in the Z-direction in the drawing).

The characteristic features of the magnetic sensing element according to the present invention shown in FIG. 1 will be described hereinafter.

As shown in FIG. 1, the third antiferromagnetic layer 31 is formed on the free magnetic layer 28, and the second antiferromagnetic layers 33 are formed on both side regions C of the third antiferromagnetic layer 31 with interposition of the nonmagnetic layer 32. Each side region 32a of the nonmagnetic layer 32 interposing between the third antiferromagnetic layer 31 and second antiferromagnetic layer 33 is formed to be thin, and the thickness is preferably 3 Å or less in the present invention.

Forming the nonmagnetic layer 32 to be so thin as described above permits an antiferromagnetic interaction to be applied between the third antiferromagnetic layer 31 and second antiferromagnetic layer 33 with interposition of the nonmagnetic layer 32, permitting the third antiferromagnetic layer 31 and second antiferromagnetic layer 33 to readily function as if they were an integrated antiferromagnetic layer.

Accordingly, the embodiment shown in FIG. 1 has a construction resembles to an embodiment in which a thick antiferromagnetic layer having antiferromagnetic properties is formed on each side region C of the free magnetic layer 28. Consequently, magnetization of each side region C of the free magnetic layer 28 is properly fixed in the track width direction (X-direction) by the exchange coupling magnetic field generated between the third antiferromagnetic layer 31 and the side regions C of the free magnetic layer.

In the embodiment shown in FIG. 1, the third antiferromagnetic layer 31 is also formed on the central region D of the free magnetic layer 28. However, no second antiferromagnetic layer 33 is provided on the central region D.

The thickness h1 of the third antiferromagnetic layer 31 is appropriately adjusted in the present invention so that the central area D of the third antiferromagnetic layer 31 does not exhibit an antiferromagnetic property (or exhibits non-antiferromagnetic or nonmagnetic properties).

The thickness h1 of the third antiferromagnetic layer 31 is preferably 10 Å or more and 50 Å or less, more preferably 30 Å or more and 40 Å or less, in the present invention. The central region D of the third antiferromagnetic layer 31 is hardly transformed into an ordered lattice by annealing in a magnetic field, and a small exchange coupling magnetic field, if any, is generated between the central region D of the third antiferromagnetic layer 31 and the central region of the free magnetic layer 28, when the antiferromagnetic layer is formed with the thickness as described above.

The thickness of the third antiferromagnetic layer 31 is defined to be 10 Å or more, preferably 30 Å or more, because the exchange coupling magnetic field generated between each side region C of the third antiferromagnetic layer 31 and each side region of the free magnetic layer 28 is weakened when the third antiferromagnetic layer 31 is too thin, thereby causing a possibility that the side regions C of the free magnetic layer 28 cannot be properly fixed in the track width direction.

An antiferromagnetic interaction works between the third antiferromagnetic layer 31 and second antiferromagnetic layer 33 formed on the second antiferromagnetic with interposition of the nonmagnetic layer 32 at both end regions C of the third antiferromagnetic layer 31, and both end regions C of the third antiferromagnetic layer 31 and second antiferromagnetic layer 33 function as if they were an integrated antiferromagnetic layer. However, since these layers are not physically integrated, the ordering modification of the third antiferromagnetic 31 becomes weak when the thickness of the third antiferromagnetic layer 31 is small, and the exchange coupling magnetic field generated between each end regions C of the third antiferromagnetic layer 31 and free magnetic layer 28 becomes weak. Accordingly, the thickness of the third antiferromagnetic layer 31 was defined to be 10 Å or more, preferably 30 Å or more.

On the other hand, shunt loss at the central region D may be reduced, or the regenerative output may be increased, by adjusting the thickness of the third antiferromagnetic layer 31 at 10 Å or more and 50 Å or less, more preferably at 30 Å or more and 40 Å or less.

The total thickness as a sum of the thickness of the third antiferromagnetic layer 31 at each side region C and the thickness of the second antiferromagnetic layer 33 is preferably 80 Å or more and 300 Å or less. This range of thickness permits each end region C of the third antiferromagnetic layer 31 to have an appropriate antiferromagnetic property, each side region C of the third antiferromagnetic layer 31 to be transformed into an ordered state by annealing in a magnetic field, and an exchange coupling magnetic field to be generated between each side region C of the third antiferromagnetic layer 31 and each side region C of the free magnetic layer 28, thereby enabling each side region C of the free magnetic layer 28 to be magnetically fixed in the track width direction.

The nonmagnetic layer 32 will be described below. The nonmagnetic layer 32 serves as a protective layer provided for protecting the third antiferromagnetic layer 31 from being oxidized by exposure in the atmosphere.

However, the nonmagnetic layer 32 is preferably made of a material that is hardly oxidized by exposure to the atmosphere as compared with the Ta layer. In addition, it is preferable that the properties of the antiferromagnetic layer hardly deteriorate even when the elements constituting the nonmagnetic layer 32 diffuse into the third antiferromagnetic layer 31 and second antiferromagnetic layer 32 in the deposition step and by annealing in the magnetic field for adjusting the direction of magnetization of the pinned magnetic layer 23 and free magnetic layer 28.

The nonmagnetic layer 32 preferably formed of at least one element of Ru, Re, Pd, Os, Ir, Pt, Au and Rh. Ru is preferably selected among these elements. The nonmagnetic layer 32 formed of these elements is hardly oxidized by exposure to the atmosphere. Accordingly, the nonmagnetic layer is not swelled by oxidation caused by exposure to the atmosphere as is seen in the Ta layer.

The property of the antiferromagnetic layer is not deteriorated even when the elements constituting the nonmagnetic layer 32 comprising precious metals are diffused into the third antiferromagnetic layer 31 and second antiferromagnetic layer 33.

Whether the elements constituting the nonmagnetic layer 32 have been diffused into the third antiferromagnetic layer 31 and second antiferromagnetic layer 33 or not may be determined, for example, with a SIMS analyzer. For example, the third antiferromagnetic layer 31 is formed of the PtMn alloy in the diffusion region, and a diffusion layer comprising a RuPtMn alloy is formed by annealing in the magnetic field, when the nonmagnetic layer 32 is formed of Ru. The RuPtMn alloy properly functions as an antiferromagnetic layer.

The thickness of the nonmagnetic layer 32 will be described hereinafter. The nonmagnetic layer 32 is formed with a thickness as thin as 3 Å or more and 10 Å or less by deposition. Since the nonmagnetic layer 32 comprising Ru as described above is a dense layer that is hardly oxidized by exposure to the atmosphere, such thin layer can properly protect the third antiferromagnetic layer 31 from being oxidized by exposure to the atmosphere.

The thickness of the layer during deposition remains at the central region 32b of the nonmagnetic layer 32, since the central region 32b is not affected by ion-milling as will be described hereinafter.

On the other hand, both side regions 32a of the nonmagnetic layer 32 are milled as a result of ion-milling, and the thickness of the side regions 32a is more reduced than the central region 32b of the nonmagnetic layer 32 is. The thickness of each side region 32a is more reduced than the thickness of the central region 32b in order to allow each side region C of the third antiferromagnetic layer 31 to properly exhibit an antiferromagnetic interaction with the antiferromagnetic layer 33 formed on the third antiferromagnetic layer with interposition of the nonmagnetic layer 32, and in order to allow the second antiferromagnetic layer 33 and each side region C of the third nonmagnetic layer 31 to function as an integrated antiferromagnetic layer. When the nonmagnetic layer 32 is formed with a large thickness, a thick nonmagnetic layer 32 is left behind after annealing without appropriately reducing the concentration of nonmagnetic materials such as Ru. Consequently, the third antiferromagnetic layer 31 fails in exhibiting an antiferromagnetic interaction with the second antiferromagnetic later 33. Since the third antiferromagnetic layer 31 is formed so thin that it cannot generate an exchange coupling magnetic field between the free magnetic layer 28, magnetization of the side regions C of the free magnetic layer 28 cannot be properly fixed.

The thickness of each side region 32a of the nonmagnetic layer 32 is preferably 3 Å or less as described previously. Thinning the nonmagnetic layer 32 to this extent permits an antiferromagnetic interaction to be generated between the each side region C of the third antiferromagnetic layer 31 and second antiferromagnetic layer 33, and permits the each side region C of the third antiferromagnetic layer 31 and the second antiferromagnetic layer 33 to function as if they were an integrated antiferromagnetic layer.

Leaving a part of the side regions 32a of the nonmagnetic layer 32 makes the third antiferromagnetic layer 31 to be free from damages by ion-milling, and magnetic properties of the third antiferromagnetic layer 31 is not deteriorated.

Using low energy ion-milling enables the each side region 32a of the nonmagnetic layer 32 to be left behind with a thickness as small as 3 Å or less as shown in FIG. 1. The nonmagnetic layer 32 is intrinsically formed to be as thin as 3 Å to 10 Å. Accordingly, it is possible to sufficiently adjust the thickness of the nonmagnetic layer 32 even by using low energy ion-milling, because the milling rate is slower in low energy ion-milling than in high energy ion-milling. Consequently, it is relatively easy to control ion-milling so that ion-milling is stopped at a stage when the nonmagnetic layer 32 is milled to its half depth.

In the embodiment shown in FIG. 1, the third antiferromagnetic layer 31 is formed on the free magnetic layer 28, and the nonmagnetic layer 32 is milled by ion-milling. Accordingly, the free magnetic layer 28 is not milled by ion-milling as in the conventional art, and magnetic properties of the free magnetic layer 28 are not deteriorated by the damage caused by ion-milling.

Low energy ion-milling is defined as ion-milling using an ion beam with a beam voltage (acceleration voltage) of less than 1000 V, for example 100 V to 500 V.

Magnetization of the free magnetic layer 28 can be properly controlled in this invention even in the narrow width track region by forming a construction in which the third antiferromagnetic layer 31 is formed on the free magnetic layer 28, and the second antiferromagnetic layer 33 is stacked on both side regions C of the third antiferromagnetic layer 31 with interposition of the nonmagnetic layer 32. Consequently, a magnetic sensing element capable of properly comply with the narrow track width structure can be produced.

The magnetic sensing element of the invention is also characterized by the magnetic material layer 30 constituting the free magnetic layer 28.

The material of the free magnetic layer shown in FIG. 1 is selected from a NiFe layer comprising $Ni_aFe_b$ (a and b are represented in at %, and satisfy the relations of a>80 at % and a+b=100%), a NiFeX layer (X is at least one element selected from Mn, Cu, Zn, Ti, Al, Ge, Si, Cr, V, Sn, Ir, Ru, Nb, Sb, W, Mo Os and Ta), an amorphous Co alloy later comprising amorphous Co based magnetic materials, and a CoFeX layer (X is at least one element selected form Ti, Al, Mn, Si, V, Cr, Ta, Zn, Sb, Ge, Mo and W).

The NiFeX layer is a thin layer comprising a magnetic material with a composition represented by NiFeX (X is at least one element selected from Mn, Cu, Zn, Ti, Al, Ge, Si, Cr, V, Sn, Ir, Ru, Nb, Sb, W, Mo, Os and Ta), and the CoFeX layer is a thin layer comprising a magnetic material with a composition represented by CoFeX (X is at least one element selected from Ti, Al, Mn, Si, V, Cr, Ta, Zn, Sb, Ge, Mo and W).

A $Ni_{80}Fe_{20}$ alloy, Co or a $Co_{90}Fe_{10}$ alloy has been used for the magnetic material layer 30 as described above.

On the contrary, a high output of the sensed magnetic field can be maintained in the present invention by forming the exchange bias magnetic sensing element having a narrow track width, and by forming the magnetic material layer 30 comprising the NiFe layer, NiFeX layer, amorphous Co alloy layer or CoFeX layer.

Figure 2:
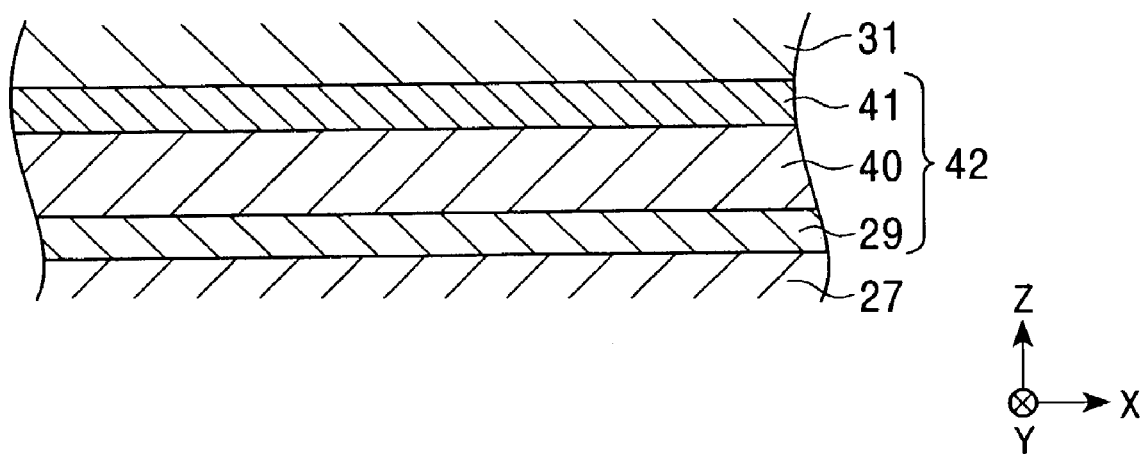
FIG. 2 is a partial cross section of the free magnetic layer in another embodiment of the present invention viewed from an opposed face side to a recording medium.

In FIG. 1, the optical track width O-Tw defined by the distance in the track width direction of a pair of the second antiferromagnetic layers 33 is 0.15 μm or less, or 0.12 μm or less. FIG. 2 shows the second aspect of the free magnetic layer.

The free magnetic layer 42 has a three layer structure of magnetic layers. A second magnetic material layer 41 is laminated on a first magnetic layer 40, which is laminated on a diffusion preventive layer 29.

The diffusion preventive layer 29 is formed of the same material as the material for forming the diffusion preventive layer 29 of the free magnetic layer 28. At least the NiFe layer comprising $Ni_aFe_b$ (a and b are represented by at %, and satisfy the relations of a>80 and a+b=100), and NiFeX layer (X is at least one element selected from Mn, Cu, Zn, Ti, Al, Ge, Si, Cr, V, Sn, Ir, Ru, Nb, Sb, W, Mo, Os and Ta) are laminated on the first magnetic material layer 40.

The second magnetic material layer 41 is a magnetic layer containing Co, and comprises, for example, Co, a CoFe alloy, an amorphous Co based magnetic material and a CoFeCr alloy.

A magnetic layer comprising Co is laminated on the NiFe layer or NiFeX layer, and the exchange coupling magnetic field between the free magnetic layer 42 and third antiferromagnetic layer 31 is enhanced by laminating the third antiferromagnetic layer 31 and each second antiferromagnetic layer 33 on the magnetic layer comprising Co. Consequently, since the direction of magnetization is tightly fixed at each side region C of the free magnetic layer 42 stacked on the third antiferromagnetic layer 31, the proportion of side-reading by which the external magnetic field (recording magnetic field) is sensed at the region outside of the optical track width O-Tw can be reduced.

It is preferable to laminate a magnetic material layer having a smaller resistivity than the amorphous Co alloy layer under the amorphous Co alloy layer, when the magnetic material layer 30 of the free magnetic layer 28 in FIG. 1 is formed as a layer containing the amorphous Co alloy layer comprising the amorphous Co based magnetic material. It is also preferable to laminate a magnetic material layer having a smaller resistivity than the CoFeX layer under the CoFeX layer, when the magnetic material layer 30 of the free magnetic layer 28 is formed as a layer containing the CoFeX layer (X is at least one element selected from Ti, Al, Mn, Si, V, Cr, Ta, Zn, Sb, Ge, Mo and W).

The magnetic material layer having a small resistivity may comprise at least one of the NiFe layer and NiFeX layer (X is at least one element selected from Mn, Cu, Zn, Ti, Al, Ge, Si, Cr, V, Sn, Ir, Ru, Nb, Sb, W, Mo, Os and Ta).

This means that the magnetic material layer having a smaller resistivity than the amorphous Co alloy layer is laminated under the amorphous Co alloy layer, or a magnetic material layer having a smaller resistivity than the CoFeX layer is laminated under the CoFeX layer, in the structure of the free magnetic layer 42 shown in FIG. 2.

The exchange coupling magnetic field between the free magnetic layer 42 and third antiferromagnetic layer 31 is enhanced in the magnetic sensing element shown in FIG. 1, when the element has a structure in which the magnetic material layer 30 of the free magnetic layer 28 is formed of at least one of the amorphous Co layer comprising the amorphous Co based magnetic material and the CoFeX layer (X is at least one element selected from Ti, Al, Mn, Si, V, Cr, Ta, Zn, Sb, Ge, Mo and W), or in which both layers are laminated, and by laminating the third antiferromagnetic layer 31 and each second antiferromagnetic layer 33 on the free magnetic layer. Consequently, the proportion of side reading by which the external magnetic field (recording magnetic field) is sensed at the region outside of the optical track width O-Tw may be reduced.

In particular, when the layer closest to the second antiferromagnetic layer of the free magnetic layer 28 (the magnetic material layer 30 in FIG. 1, and the second magnetic material layer 41 in FIG. 2) is a CoFeCr layer, the exchange coupling magnetic field acting between each side region C of the third antiferromagnetic layer 31 and each side region C of the free magnetic layer 28 is more increased under the second antiferromagnetic layer 33, thereby enabling side-reading to be more effectively suppressed.

It is preferable to form the CoFeOr layer (the magnetic material layer 30 in FIG. 1, and the second magnetic material layer 41 in FIG. 2) with a $(Co_xFe_y)_eCr_f$ layer (x and y denote an at % ratio between Co and Fe satisfying the relation of x+y=1; e and f are represented by at %, and satisfy the relation of 0 at % <f<20 at % and e+f=100 at %). More preferably, the CoFeX layer is formed of the $(Co_xFe_y)_eCr_f$ layer (x and y denote an at % ratio between Co and Fe satisfying the relation of x+y=1; e and f are represented by at %, and satisfy the relation of 5 at % <f<15 at % and e+f=100 at %).

It is also preferable that the relations between the at % ratios x and y between Co and Fe in the $(Co_xFe_y)_eCr_f$ layer are represented by x>y, particularly $0 \leq y \leq 0.3$, and x+y=1. The relations between e and f represented by at % are preferably 0 at %<f<20 at %, more preferably 5 at %<f<15 at %, and e+f=100 at %.

The thickness of the CoFeCr layer is preferably 2 Å or more and 10 Å or less, in order to increase the exchange coupling magnetic field between the CoFeCr layer (the magnetic material layer 30 in FIG. 1, and the second magnetic material layer 41 in FIG. 2) and third antiferromagnetic layer. The thickness of the CoFeCr layer is more preferably 3 Å or more and 6 Å or less.

A thickness of 2 Å or more and 6 Å or less, or 2 Å or more and 4 Å or less, is sufficient for generating the exchange coupling magnetic field, when the CoFeCr layer is the $(Co_xFe_y)_eCr_f$ layer (x and y represented by at % satisfy the relation of x+y=1; f represented by at % satisfied the relation of 10 at %≦f≦15 at %; and e and f satisfy the relation of e+f=100).

While the exchange coupling magnetic field between the free magnetic layer 28 and third antiferromagnetic layer 31 forming the CiFeCr layer increases by forming the CoFeCr layer on the free magnetic layer, sensitivity of the sensing element decreases by an increase of a magnetic moment Ms×t per unit area of the entire free magnetic layer 28, or stability of the regenerated waveform becomes poor by an increase of magnetostriction. Accordingly, the thickness of the CoFeCr layer is preferably 2 Å or more and 6 Å or less, or 2 Å or more and 4 Å or less, from the view point of maintaining the stability of the regenerated waveform.

The NiFe layer, NiFeX layer, amorphous Co alloy layer or CoFeX layer forming the magnetic material layer 30 of the free magnetic layer 28 has a small exchange stiffness constant. Accordingly, the magnetic sensing element of the invention can maintain a high output of the sensed magnetic field.

The relation between the exchange stiffness constant and the output of the sensed magnetic field will be described hereinafter.

With respect to magnetic atoms constituting the magnetic material layer 30 of the free magnetic layer 28, and the first magnetic material layer 40 and second magnetic material layer 41 of the free magnetic layer 42, an exchange energy is accumulated when adjoining spins of magnetic atoms in the planes of these layers are not parallel with each other.

The exchange fitness constant defines the magnitude of the exchange energy related to the distribution of the spins.

According to "Physics of Ferromagnetic Material, Vol. II, pp 166–169" by Satonobu Chikakaku (Shokabo, 1984), the exchange energy Eex per unit volume of the magnetic material is represented by the following equation:

$$E_{ex} = A\left\{\left(\frac{\partial \alpha}{\partial x}\right)^2 + \left(\frac{\partial \alpha}{\partial y}\right)^2 + \left(\frac{\partial \alpha}{\partial z}\right)^2\right\} \quad (3)$$

wherein α denotes a unit vector parallel to the direction of a spin located at each lattice point of a magnetic material having a cubic crystal structure, the coordinate of the crystal axis of the cubic crystal is represented by (x, y, z), "a" denotes the length of the lattice constant (the length of a unit cell), "n" denotes the number of atoms belonging to the unit cell, S denotes a spin quantum number of the atoms contained in the magnetic material, and J denote an exchange integral as a constant representing the strength of interaction among the atoms contained in the magnetic material, where $$A = \frac{nJS^2}{a} \quad (4)$$

The exchange energy Eex per unit volume of the magnetic material is given as a quadric function of the angular deformation of the spin at each lattice point of the magnetic body. The constant A is called an exchange stiffness constant.

In other words, accumulation of the exchange energy Eex when the direction of magnetization is changed is more reduced as the exchange stiffness constant A is smaller, and the direction of magnetization can be rapidly changed more easily within a short distance in the X-direction.

In the embodiment shown in FIG. 1, the distance in the track width direction (X-direction) between the lower faces of the second antiferromagnetic layers 33 is defined as the optical track width O-Tw.

Magnetization at each end region C of the free magnetic layers 28 is properly fixed in the track width direction (X-direction) in the embodiment shown in FIG. 1, while magnetization at the central region D of the free magnetic layer 28 is weakly put into a single magnetic domain state to an extent capable of magnetic inversion against the external magnetic field, and this region is enabled to invert its magnetization against the external magnetic field.

The direction of magnetization at the central regions of the free magnetic layer 28 and free magnetic layer 42 are rapidly and readily changed by the external magnetic field (recording magnetic field) even at near the side regions C in this embodiment, by forming the magnetic material layer 30, first magnetic material layer 40 and second magnetic material layer 41 with a magnetic material having a small exchange stiffness constant A.

Accordingly, the width of the central region D of the free magnetic layer 28 (the width of the region where magnetic inversion is easy) in the track width direction of the magnetic sensing element shown in FIG. 1 is approximately the same as the optical track width O-Tw, thereby maintaining a high output of the sensed magnetic field even when the magnetic sensing element has a narrow track width.

Since saturation magnetization Ms at room temperature is small in the magnetic material having a small exchange stiffness constant A, the magnetic moments Ms×t per unit area of the NiFe layer, NiFeX layer, amorphous Co alloy layer or CoFeX layer formed of magnetic materials having small stiffness constants A also becomes small. Consequently, the direction of magnetization of the sensitive region (track width region) of the free magnetic layer comprising the NiFe layer, NiFeX layer, amorphous Co alloy layer or CoFeX layer is readily changed by the external magnetic field (recording magnetic field), and sensitivity for sensing the magnetic field is improved.

The exchange stiffness constants of the magnetic materials constituting the NiFe layer comprising $Ni_aFe_b$ (a and b represented by at %, and satisfy the relations of a>80 at % and a+b=100 at %) of the free magnetic layer 28, and the first magnetic material layer 40 and second magnetic material layer 41 of the free magnetic layer 42, and the exchange stiffness constants of the magnetic material constituting the NiFeX layer (X is at least one element selected from Mn, Cu, Zn, Ti, Al, Ge, Si, Cr, V, Sn, Ir, Ru, Nb, Sb, W, Mo, Os and Ta), amorphous Co alloy layer comprising the amorphous Co based magnetic material, and CoFeX layer (X is one or at least two elements selected from Ti, Al, Mn, Si, V, Cr, Ta, Zn, Sb, Ge, Mo and W) for forming the magnetic material layer 30 are smaller than the exchange stiffness constant of the magnetic material having a composition formula of $Ni_{80}Fe_{20}$ that has been used as the material of the free magnetic layer of the conventional magnetic sensing element.

The exchange stiffness constant of the $Ni_{80}Fe_{20}$ alloy is in the range of $0.8 \times 10^{-6}$ erg/cm to $1.0 \times 10^{-6}$ erg/cm ($0.8 \times 10^{-11}$ J/m to $1.0 \times 10^{-11}$ J/m).

However, when the exchange stiffness constant of a magnetic material is reduced, the Curie temperature of the magnetic material also decreases. As a result, the magnetic sensing element cannot sufficiently work due to large fluctuation of magnetization of the free magnetic layer, or because the free magnetic layer loses the properties as the magnetic material, when the Curie temperature of the magnetic material forming the free magnetic layer is near or lower than the operating temperature of the magnetic sensing element.

Since the operating temperature of the magnetic sensing element is about 100° C., the exchange stiffness constants of the magnetic materials constituting the NiFe layer, NiFeX layer (X is at least one element selected from Mn, Cu, Zn, Ti, Al, Ge, Si, Cr, V, Sn, Ir, Ru, Nb, Sb, W, Mo, Os and Ta), amorphous Ci alloy layer, and CoFeX layer (X is one or at least two elements selected from Ti, Al, Mn, Si, V, Cr, Ta, Zn, Sb, Ge, Mo and W) for forming the free magnetic layer are preferably $4 \times 10^{-7}$ erg/cm ($4 \times 10^{-12}$ J/m) in the present invention.

Figure 3:
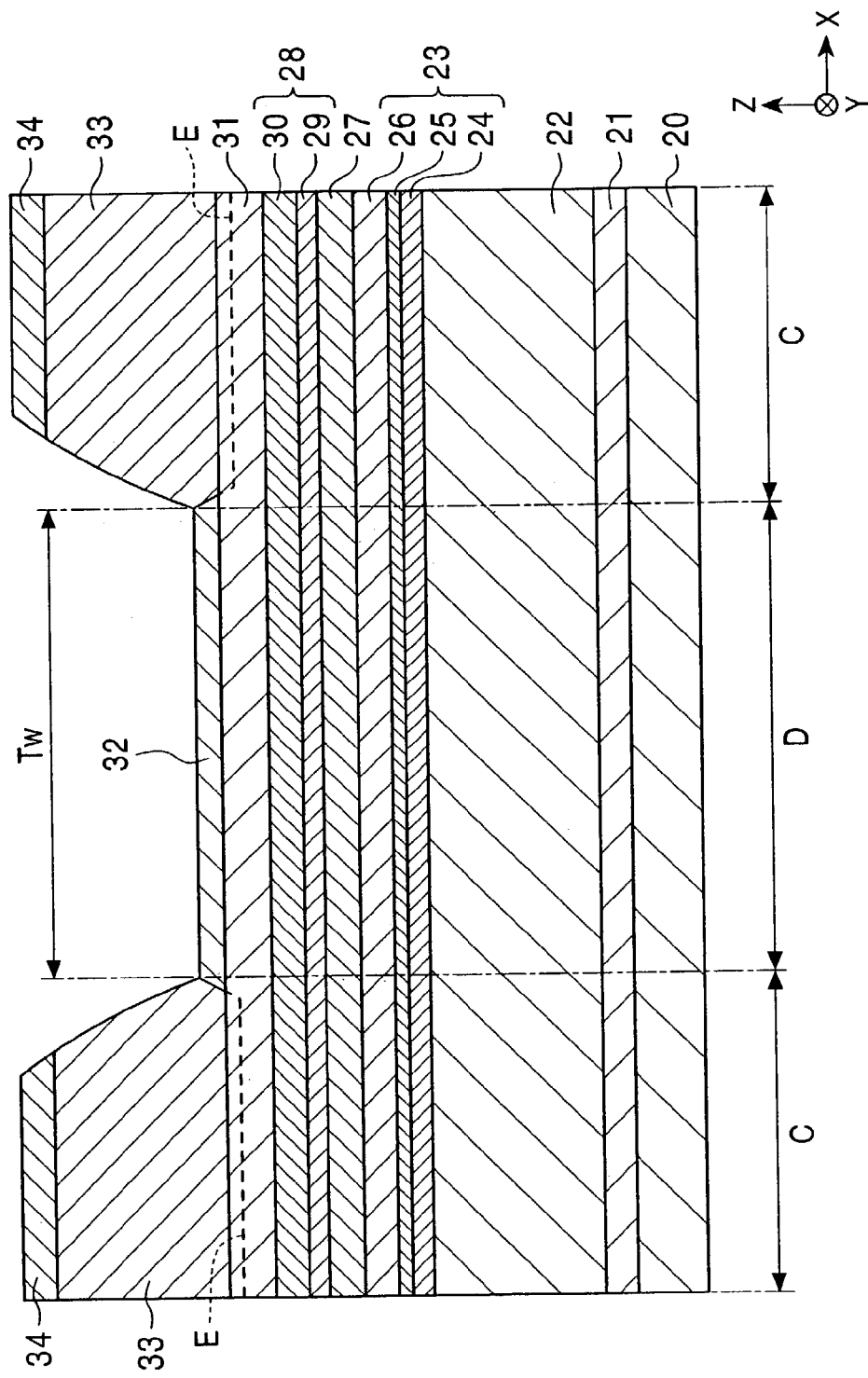
FIG. 3 is a partial cross section of the structure of the magnetic sensing element in a second embodiment of the present invention viewed from an opposed face side to a recording medium.

FIG. 3 shows a partial cross section of the structure of the magnetic sensing element in the second embodiment of the present invention viewed from the opposed side face to a recording medium.

The structure of the magnetic sensing element shown in FIG. 3 differs from the structure of the magnetic sensing element shown in FIG. 1. The nonmagnetic layer 32 is provided only between the second antiferromagnetic layers 33, and is not provided between each side region C of the second antiferromagnetic layer 33 and third antiferromagnetic layer 31.

The nonmagnetic layer 32 shown in FIG. 3 is preferably formed of at least one element of Ru, Re, Pd, Os, Ir, Pt, Au and Rh. The nonmagnetic layer 32 formed of these precious metals is hardly oxidized by exposure to the atmosphere. The nonmagnetic layer 32 formed of Ru and the like can reliably protect the third antiferromagnetic layer 31 from being oxidized by exposure to the atmosphere. The nonmagnetic layer 32 is preferably formed with a thickness as small as 3 Å or more and 10 Å or less in the present invention.

Each side region of the nonmagnetic layer 32 formed on the entire surface of the third antiferromagnetic layer 31 is milled by ion-milling, and the second antiferromagnetic layer is laminated on the exposed each side region C of the third antiferromagnetic layer 31. However, since the nonmagnetic layer 32 is as thin as 3 Å to 10 Å, the nonmagnetic layer 32 may be properly milled even by low energy ion-milling. The milling process may be readily controlled so as not to mill the third antiferromagnetic layer 31 as compared with the high energy ion-milling process. Accordingly, little damage is given by ion-milling to the third antiferromagnetic layer 31 under the nonmagnetic layer 32.

The surface of each side region C of the third antiferromagnetic layer 31 shown in FIG. 3 suffers little damage by ion-milling as described above, and good magnetic properties of the third antiferromagnetic layer 31 are maintained.

The third antiferromagnetic layer 31 is preferably formed with a thickness as small as 10 Å or more and 50 Å or less in the embodiment shown in FIG. 3 as in the magnetic sensing element shown in FIG. 1. The central region D of the third antiferromagnetic layer 31 has non-antiferromagnetic properties, and a small exchange coupling magnetic field, if any, is generated between the central region D of the third antiferromagnetic layer 31 and the central region D of the free magnetic layer 28. Consequently, magnetization of the central region D of the free magnetic layer 28 is properly aligned in the track width direction (X-direction), and is magnetically opposes the external magnetic field.

On the other hand, the third antiferromagnetic layer 31 and the second antiferromagnetic layer 33 in direct contact with the third antiferromagnetic layer 31 are formed on each side region of the free magnetic layer 28. The third antiferromagnetic layer 31 has antiferromagnetic properties by antiferromagnetic interaction generated between the third antiferromagnetic layer 31 and second antiferromagnetic layer 33. Accordingly, each side region C of the third antiferromagnetic layer 31 is transformed into an ordered state by annealing in the magnetic field, an exchange coupling magnetic field is generated between the each region C of the third antiferromagnetic layer 31 and each side region C of the free magnetic layer 28, and magnetization at each side region C of the free magnetic layer 28 is tightly fixed in the track width direction (X-direction).

The third antiferromagnetic layer 31 is formed on the free magnetic layer 28 in the embodiment shown in FIG. 3, and the nonmagnetic layer 32 is milled by ion-milling. Accordingly, since the free magnetic layer 28 is not milled by ion-milling in FIG. 3, magnetic properties are not deteriorated by the damage caused by ion-milling of the free magnetic layer 28.

Magnetization of the free magnetic layer 28 can be properly controlled even in the magnetic sensing element having a narrow track width structure shown in FIG. 3, and the magnetic sensing element capable of properly complying with the narrow track width structure can be manufactured.

The surface of each side region C of the third antiferromagnetic layer 31 is also slightly milled as shown in FIG. 3, and the thickness of each side region C of the third antiferromagnetic layer 31 becomes smaller than the thickness of the central region D of the third antiferromagnetic layer 31. However, since each side region C of the third antiferromagnetic layer 31 is milled by low energy ion-milling, each side region C is less damaged by low energy ion-milling as compared with milling by high energy ion-milling. Consequently, each side region C of the third antiferromagnetic layer 31 retains antiferromagnetic properties, and an exchange coupling magnetic field that is enough for tightly fixing magnetization of each side region C of the free magnetic layer 28 may be generated between each side region of the free magnetic layer 28 and third antiferromagnetic layer.

Figure 4:
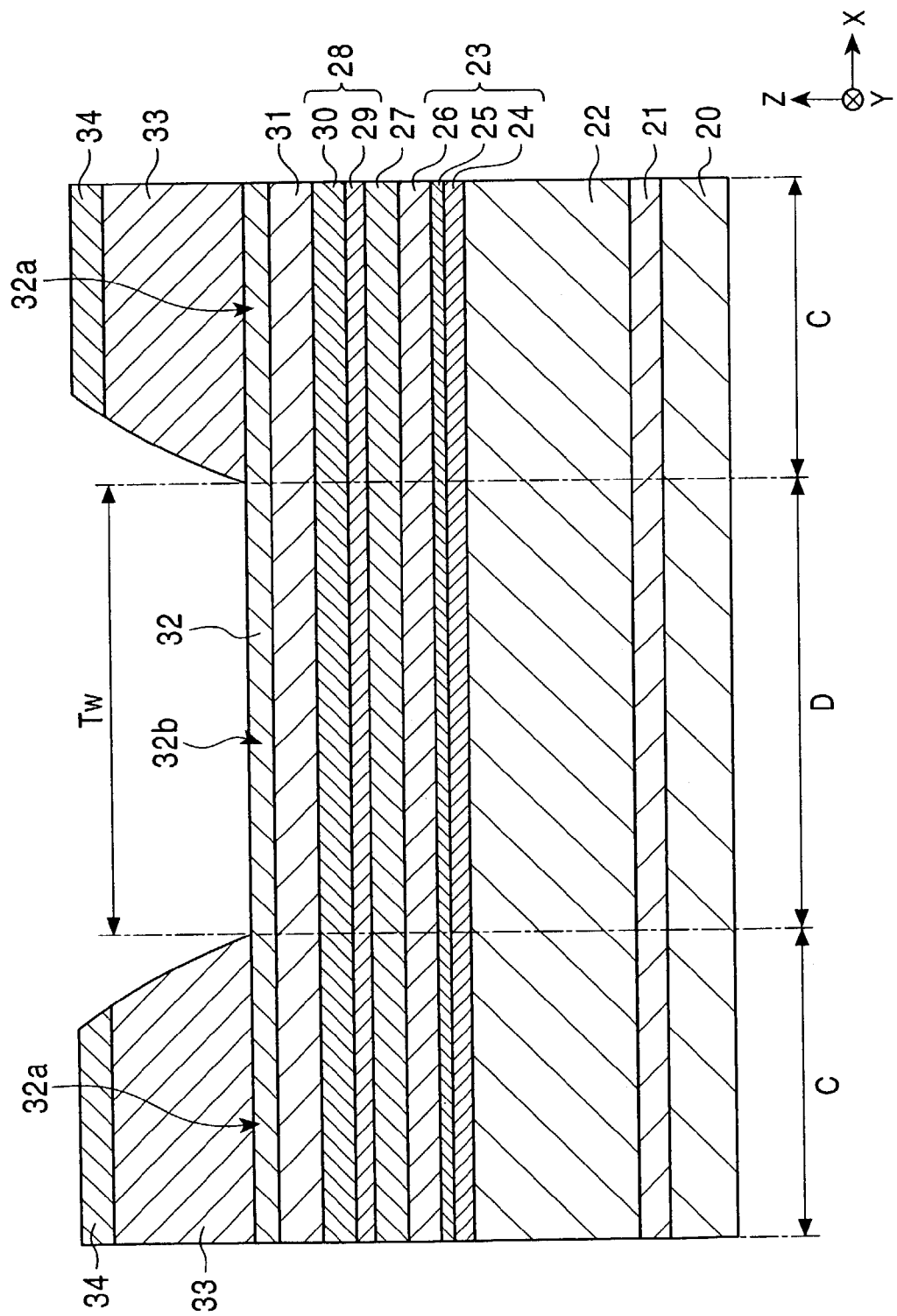
FIG. 4 is a partial cross section of the structure of the magnetic sensing element in a third embodiment of the present invention viewed from an opposed face side to a recording medium.

FIG. 4 is a partial cross section of the structure of the magnetic sensing element of the third embodiment according to the present invention viewed from the opposed face side to a recording medium.

FIG. 4 differs from FIG. 1 in that the nonmagnetic layer 32 having a uniform thickness is formed on the third antiferromagnetic layer 31. In other words, the central region 32b and each side region 32a of the nonmagnetic layer 32 are formed with the same thickness with each other. The nonmagnetic layer 32 is preferably formed to be as thin as 1 Å or more and 3 Å or less.

A thickness of the nonmagnetic layer 32 of smaller than 1 Å is not preferable, since the layer poorly serves as a protective layer for protecting the third antiferromagnetic layer 31 from oxidation by exposure to the atmosphere.

When the thickness of the nonmagnetic layer 32 is larger than 3 Å, on the other hand, a thick nonmagnetic layer 32 is left behind after annealing without properly reducing the concentration of the nonmagnetic material such as Ru by diffusion. Accordingly, an antiferromagnetic interaction is hardly applied between each side region C of the third antiferromagnetic layer 31 and second antiferromagnetic layer 33, and the third antiferromagnetic layer 31 and second antiferromagnetic layer 33 function with difficultly, as if they were an integrated antiferromagnetic layer. Since the third antiferromagnetic layer 31 is formed with a small thickness that cannot generate an exchange coupling magnetic field between this layer and free magnetic layer 28 in this case, each side region C of the third antiferromagnetic layer 31 is not properly transformed into an ordered structure by annealing in the magnetic field. No exchange coupling magnetic field or a small exchange coupling magnetic field, if any, is generated between each side region C of the third antiferromagnetic layer 31 and each side region C of the free magnetic layer 28, and magnetization of each side region C of the free magnetic layer 28 is not tightly fixed in the track width direction (X-direction).

Accordingly, the thickness of the nonmagnetic layer 32 is adjusted within a range of 1 Å or more and 3 Å or less in the present invention.

The third antiferromagnetic layer 31 is also formed with a thickness as small as 10 Å or more and 50 Å or less in the embodiment shown in FIG. 4 as in the magnetic sensing element shown in FIG. 1. The central region D of the third antiferromagnetic layer 31 has non-antiferromagnetic (or nonmagnetic) properties, and a small exchange coupling magnetic field, if any, is generated between the central region D of the third antiferromagnetic layer 31 and the central region D of the free magnetic layer 28. Accordingly, magnetization of the central region D of the free magnetic layer 28 is aligned in the track width direction (X-direction) to an extent capable of magnetic inversion against the external magnetic field.

On the other hand, the third antiferromagnetic layer 31 is formed on each side region C of the free magnetic layer 28, and the second antiferromagnetic layer 33 is formed on the third antiferromagnetic layer 31 with interposition of the nonmagnetic layer 32. Therefore, an antiferromagnetic interaction is applied between the third antiferromagnetic layer 31 and second antiferromagnetic layer 33, and each side region C of the third antiferromagnetic layer 31 has antiferromagnetic properties. Accordingly, each side region C of the third antiferromagnetic layer 31 is transformed into an ordered structure, an exchange coupling magnetic field is generated between each side region C of the third antiferromagnetic layer 31 and each region C of the free magnetic layer 28, and magnetization of each side region C of the free magnetic layer 28 is tightly fixed in the track width direction (X-direction).

Since the free magnetic layer 28 is not milled by ion-milling in the embodiment shown in FIG. 4, magnetic properties are not deteriorated by the damage of the free magnetic layer 28 caused by ion-milling.

Magnetization of the free magnetic layer 28 can be properly controlled even in the magnetic sensing element having a narrow track width structure as shown in FIG. 4, and a magnetic sensing element capable of complying with the narrow track width structure can be manufactured.

Figure 5:
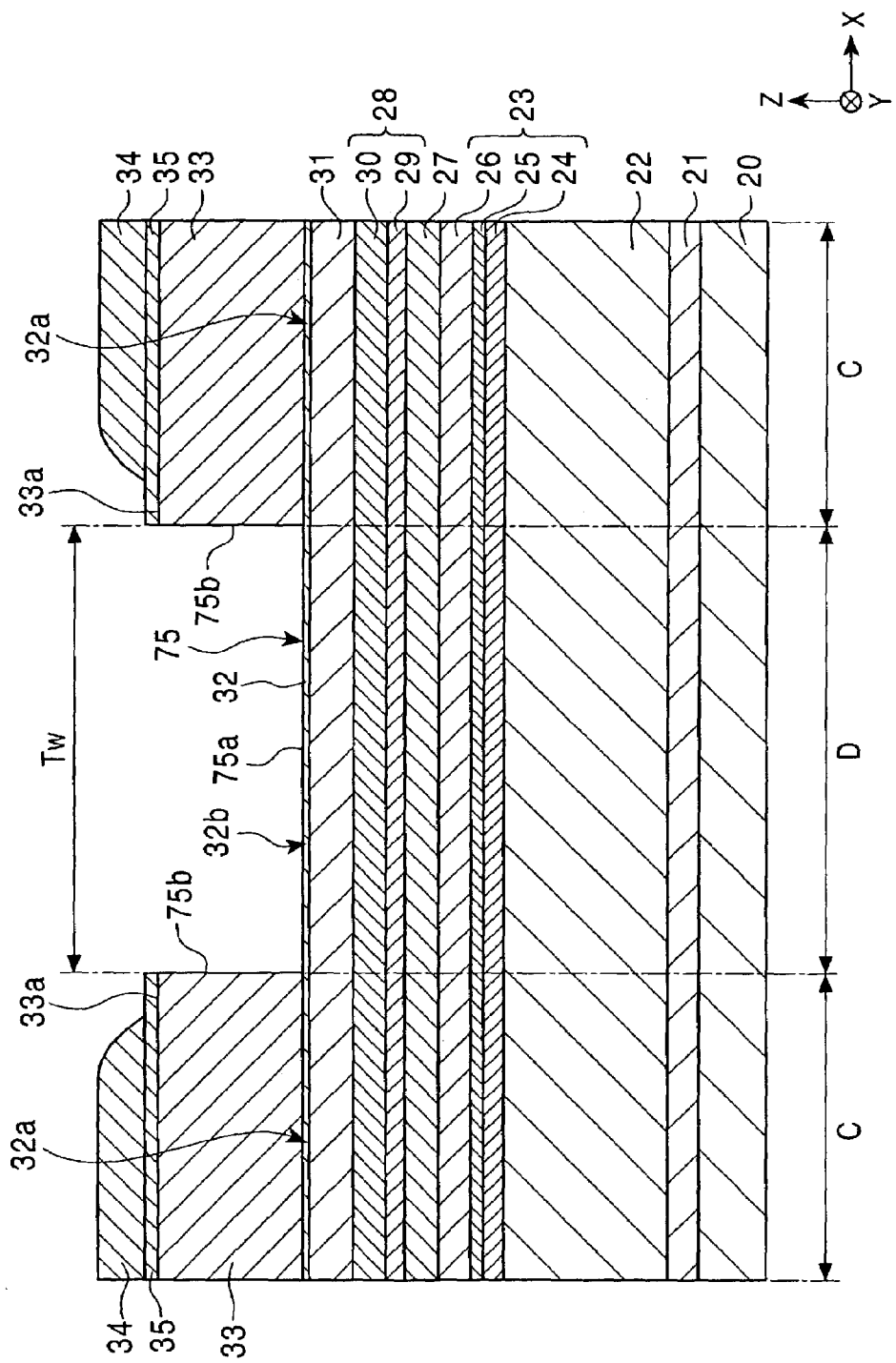
FIG. 5 is a partial cross section of the structure of the magnetic sensing element in a fourth embodiment of the present invention viewed from an opposed face side to a recording medium.

FIG. 5 shows a partial cross section of the magnetic sensing element of the third embodiment according to the present invention viewed from the opposed side face to a recording medium.

In FIG. 5, a seed layer 21, a first antiferromagnetic layer 22, a pinned magnetic layer 23, a nonmagnetic layer 27, a free magnetic layer 28, a third antiferromagnetic layer 31 and nonmagnetic layer 32 are laminated on a substrate 20. The material of each layer is the same as that described in FIG. 1.

Second antiferromagnetic layers 33 are formed on both side regions 32a of the nonmagnetic layer 32 as shown in FIG. 5. An electrode layer 34 is formed on each second antiferromagnetic layer 33 with interposition of an intermediate layer 35 formed of Ta and the like. The track width Tw is preferably formed with a length of 0.15 µm or less.

The nonmagnetic layer 32 is formed on the entire surface of the third antiferromagnetic layer 31 in the embodiment shown in FIG. 5, and the nonmagnetic layer 32 is formed with a small thickness. The nonmagnetic layer 32 is preferably formed of a material that is hardly oxidized by exposure to the atmosphere, and the elements constituting the nonmagnetic layer 32 preferably do not deteriorate the properties of the antiferromagnetic layers even when the elements are diffused into the third antiferromagnetic layer 31 and second antiferromagnetic layer 33. The nonmagnetic layer 32 is actually formed of at least one precious metal of Ru, Re, Pd, Os, Ir, Pt, Au and Rh, and the nonmagnetic layer 32 is preferably formed with a thickness of 0.2 Å or more and 3 Å or less. The thickness of, for example, 0.2 Å as used herein is a mean thickness of the entire nonmagnetic layer 32. Since the thickness of 0.2 Å is smaller than the thickness of an atomic layer, sites occupied by the atoms of the nonmagnetic layer 32 and sites not occupied are distributed as islets. Accordingly, the thickness of 0.2 Å corresponds to the mean thickness of the entire nonmagnetic layer 32.

The nonmagnetic layer 32 formed with a thickness as small as described above can generate an antiferromagnetic interaction between the third antiferromagnetic layer 31 and second antiferromagnetic layer 33 even when the nonmagnetic layer 32 is interposed between the side regions C of the third antiferromagnetic layer 31 and second antiferromagnetic layers 33, and each side region C of the third antiferromagnetic layer 31 has antiferromagnetic properties. Accordingly, each side region C of the antiferromagnetic layer 31 is transformed into an ordered structure, an exchange coupling magnetic field is generated between each side region C of the antiferromagnetic layer 31 and each side region C of the free magnetic layer 28, and magnetization of each side region C of the free magnetic layer 28 is tightly fixed in the track width direction (X-direction).

Although the third antiferromagnetic layer 31 is formed on the central region D of the free magnetic layer 28, the third antiferromagnetic layer 31 is formed so thin that the layer does not exhibit antiferromagnetic properties by itself. The thickness of the antiferromagnetic layer 31 is preferably 10 Å or more and 50 Å or less, more preferably 30 Å or more and 40 Å or less, in the present invention.

Accordingly, the central region D of the third antiferromagnetic layer 31 is hardly transformed into an ordered structure even by annealing in the magnetic field, a small exchange coupling magnetic field, if any, is generated between the central region D of the free magnetic layer 28 and central region D of the third antiferromagnetic layer 31, and magnetization of the free magnetic layer 28 is weakly put into a single magnetic domain state to an extent that enables magnetic inversion against the external magnetic field.

While the nonmagnetic layer 32 is formed of a precious metal such as Ru, the materials constituting the nonmagnetic layer 32 may happen to be diffused into the third antiferromagnetic layer 31 and second antiferromagnetic layer 33 by annealing in the magnetic field for controlling magnetization of the free magnetic layer 28 and pinned magnetic layer 23.

In other words, when the third antiferromagnetic layer 31 and second antiferromagnetic layer 33 are formed of the PtMn alloy, and when the nonmagnetic layer 32 is formed of Ru, an antiferromagnetic layer comprising a Ru—Pt—Mn alloy is formed particularly in the vicinity of the surface of the third antiferromagnetic layer 31 and in the vicinity of the lower face of the second antiferromagnetic layer 33 by thermal diffusion.

Since the material comprising Ru—Pt—Mn containing precious metals functions as an antiferromagnetic material, diffusion of the materials in the nonmagnetic layer 32 into the third antiferromagnetic layer 31 and second antiferromagnetic layer 33 does not deteriorate the antiferromagnetic properties of the antiferromagnetic layers. Instead, the third antiferromagnetic layer 31 and second antiferromagnetic layer 33 can properly function as the antiferromagnetic layers even after diffusion of the materials in the nonmagnetic layer 32 into the antiferromagnetic layers 31 and 33.

The surface 33a of the second antiferromagnetic layer 33 has an opening in the embodiment shown in FIG. 5, and a concave region 75 having the same width as the track width is formed. The bottom face 75a of the concave region 75 lies on the nonmagnetic layer 32. The side faces 75b of the concave region 75 is perpendicular to the surface 33a of the second antiferromagnetic layer 33. This difference of the shape is ascribed to the difference of the manufacturing method to be described hereinafter.

The inner side faces 33a of the second antiferromagnetic layer 33 may be formed as inclined or curved surfaces that gradually expand the distance between the second antiferromagnetic layers 33 from the bottom face to the upper face in FIG. 5 as in FIGS. 1, 3 and 4.

Figure 6:
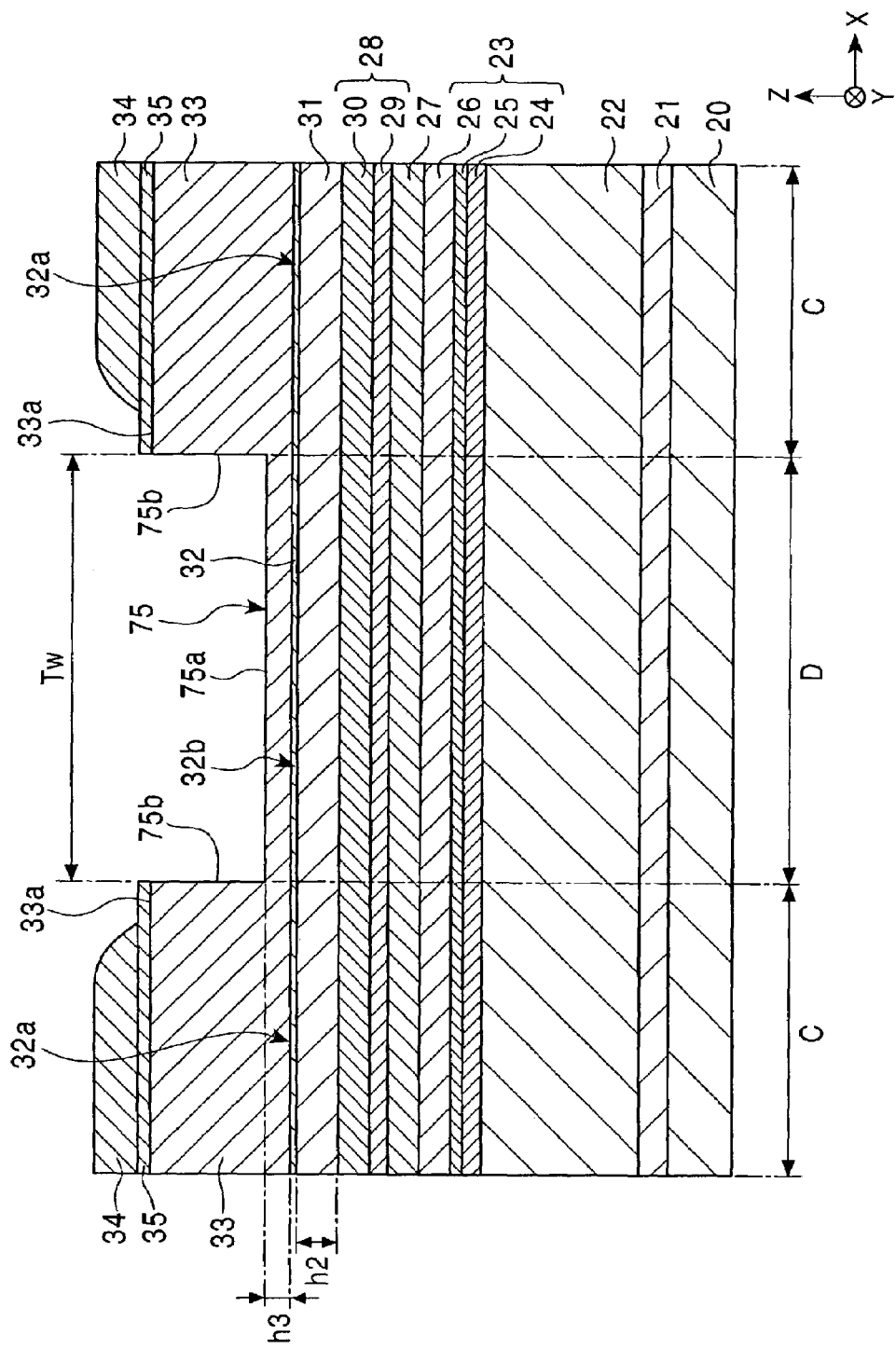
FIG. 6 is a partial cross section of the structure of the magnetic sensing element in a fifth embodiment of the present invention viewed from an opposed face side to a recording medium.
Figure 7:
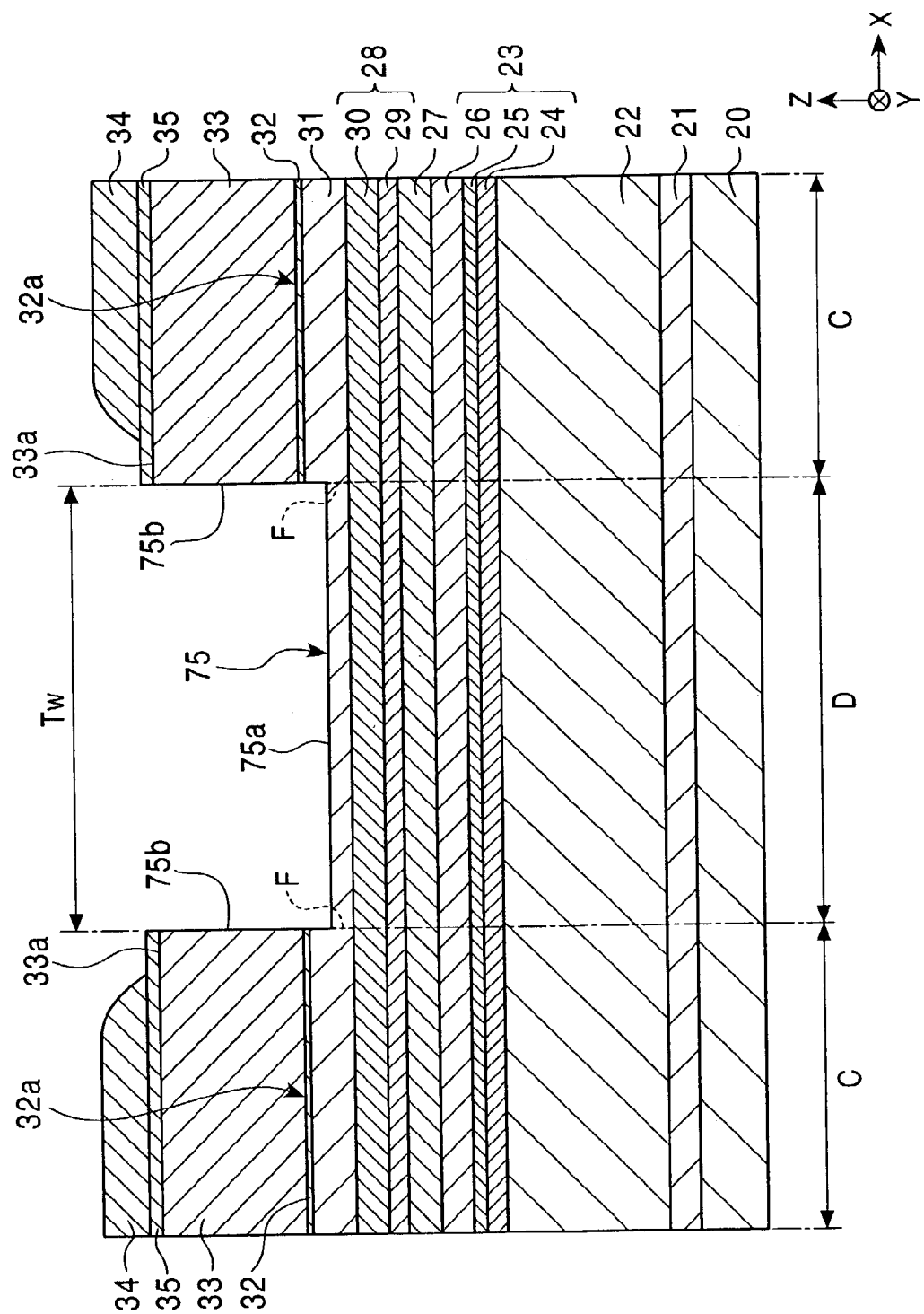
FIG. 7 is a partial cross section of the structure of the magnetic sensing element in a sixth embodiment of the present invention viewed from an opposed face side to a recording medium.

While the magnetic sensing elements shown in FIGS. 1, 3 and 4 are manufactured by the same manufacturing method, the magnetic sensing elements shown in FIGS. 5 to 7 are manufactured by a different method from the method for manufacturing the magnetic sensing elements shown in FIGS. 1, 3 and 4. The common part in the structures of the magnetic sensing elements shown in FIGS. 1, 3 and 4 is that the central region 32b of the nonmagnetic layer 32 is always left behind in the space between the second antiferromagnetic layers 33. On the other hand, the common part in the structures of the magnetic sensing elements shown in FIGS. 5 to 7 is that the nonmagnetic layer 32 is left behind between the side regions C of the third antiferromagnetic layer 31 and second antiferromagnetic layer 33.

The structures of the other magnetic sensing elements formed by the same manufacturing method as in FIG. 5 will be described hereinafter.

FIG. 6 shows a partial cross section of the magnetic sensing element of the fifth embodiment according to the present invention viewed from the opposed face to a recording medium.

The structure of the magnetic sensing element shown in FIG. 6 duffers from the structure in FIG. 5 in that a part of the second antiferromagnetic layer 33 is formed on the central region 32b of the nonmagnetic layer 32. The surface 33a of the second antiferromagnetic layer 33 has an opening to form a concave region 75 having a width equal to the optical track width, and the bottom face 75a of the concave region 75 is formed within the second antiferromagnetic layer 33. The side faces 75b of the concave portion 75 are perpendicular to the surface 33a of the second antiferromagnetic layer 33.

In the embodiment shown in FIG. 6, the gap between the side regions C of the antiferromagnetic layer 31 and second antiferromagnetic layer 33 serves as an integrated antiferromagnetic layer by an antiferromagnetic interaction with interposition of the nonmagnetic layer 32 having a thickness of as thin as 0.2 Å (mean thickness) to 3 Å. Consequently, the side regions C of the third antiferromagnetic layer 31 have antiferromagnetic properties. Therefore, each side region C of the third antiferromagnetic layer 31 is transformed into an ordered structure, an exchange coupling magnetic field is generated between each side region C of the third antiferromagnetic layer 31 and each region C of the free magnetic layer 28, and magnetization of each side region C of the free magnetic layer 28 is tightly fixed in the track width direction (X-direction).

The second antiferromagnetic layer 33 is formed on the central region D of the third antiferromagnetic layer 31, although the thickness thereof is smaller than the thickness of each side region.

Accordingly, the third antiferromagnetic layer 31 has antiferromagnetic properties due to an antiferromagnetic interaction between the first antiferromagnetic layer and second antiferromagnetic layer 33, unless the total thickness as a sum of the thickness h2 of the central region D of the third antiferromagnetic layer 31 and the thickness h3 of the central region D of the second antiferromagnetic layer 33 is sufficiently small. This is not preferable since an exchange coupling magnetic field is generated between the central region D of the third antiferromagnetic layer 31 and the central region D of the free magnetic layer 28.

It is preferable in the present invention to form the layers with a total thickness of 10 Å or more and 50 Å or less, more preferably with a total thickness of 30 Å or more and 40 Å or less. However, the thickness of the third antiferromagnetic layer 31 is preferably 10 Å or more, more preferably 30 Å or more. Each side region C of the third antiferromagnetic layer 31 has weak antiferromagnetic properties even by forming the second antiferromagnetic layer 33 thereon, unless the thickness of the third antiferromagnetic layer 31 is 10 Å or more. This is because a large exchange magnetic field is not generated between each side region C of the third antiferromagnetic layer 31 and each side region C of the free magnetic layer 28, and magnetization of each side region C of the free magnetic layer 28 is not tightly fixed in the track width direction.

When the total thickness of the thickness h2 at the central region D of the third antiferromagnetic layer 31 and the thickness h3 of the second antiferromagnetic layer 33 formed thereon is so small as described above, the central region D of the third antiferromagnetic layer 31 is hardly transformed into an ordered structure, an antiferromagnetic interaction is hardly generated between the third antiferromagnetic layer 31 and second antiferromagnetic layer 33, and the third antiferromagnetic layer 31 hardly has antiferromagnetic properties. Consequently, a small exchange coupling magnetic field, if any, is generated between the central region D of the third antiferromagnetic layer 31 and central region D of the free magnetic layer 28, and magnetization of the central region D of the free magnetic layer 28 is not tightly fixed as magnetization of the side regions thereof is.

Magnetization of the central region D of the free magnetic layer 28 is thus weakly put into a single magnetic domain state and is capable of magnetic inversion against the external magnetic field, and the magnetic sensing element has a narrow track width structure that has excellent reproduction sensitivity.

FIG. 7 is a partial cross section of the sixth embodiment of the magnetic sensing element according to the present invention viewed from the opposed face side to a recording medium.

The structure of the magnetic sensing element shown in FIG. 7 is different from the structure shown in FIG. 5 in that the nonmagnetic layer 32 exposed between the second antiferromagnetic layers 33 is removed, and a part of the surface of the third antiferromagnetic layer 31 under the nonmagnetic layer 32 is also removed. In other words, the surface 33a of the second antiferromagnetic layer 33 has an opening to form a concave region 75 having a width equal to the optical track width, and the bottom face 75a of the concave region 75 is formed within the third antiferromagnetic layer 31. The side faces 75b of the concave region 75 are perpendicular to the surface 33a of the second antiferromagnetic layer 33.

The second antiferromagnetic layers 33 formed of Ru is formed on the side regions of the third antiferromagnetic layer 31 with interposition of the nonmagnetic layer 32 having a thickness of about 0.2 Å to 3 Å. The total thickness as a sum of the thickness of both side regions of the third antiferromagnetic layer 31 and the thickness of the second antiferromagnetic layer 33 is preferably 80 Å or more and 300 Å or less.

Accordingly, an antiferromagnetic interaction is applied between each side region C of the third antiferromagnetic layer 31 and second antiferromagnetic layer 33 through the nonmagnetic layer 32, and each side region C of the third antiferromagnetic layer 31 and second antiferromagnetic layer 33 function as if they were an integrated antiferromagnetic layer. Consequently, each side region C of the third antiferromagnetic layer 31 has antiferromagnetic properties, and each side region C of the third antiferromagnetic layer 31 is transformed into an ordered structure by annealing in the magnetic field. Each side region C of the free magnetic layer 28 is tightly fixed in the track width direction (X-direction) by an exchange coupling magnetic field generated between the third antiferromagnetic layer 31 and each side region C of the free magnetic layer 28.

While the third antiferromagnetic layer 31 is also formed on the central region D of the free magnetic layer 28, the thickness of the central region D of the third antiferromagnetic layer 31 is 5 Å or more and 50 Å or less, preferably 10 Å or more and 40 Å or less. Such a thickness prevents the central region D of the third antiferromagnetic layer 31 from having antiferromagnetic properties, the central region D of the third antiferromagnetic layer 31 is hardly transformed into an ordered structure by annealing in the magnetic field, and a small exchange coupling magnetic field, if any, is generated between the central region D of the third antiferromagnetic layer 31 and central region D of the free magnetic layer 28. Accordingly, magnetization of the central region D of the free magnetic layer 28 is weakly put into a single magnetic domain state to an extent capable of magnetic inversion against the external magnetic field, and a magnetic sensing element that has excellent regenerative sensitivity can be manufactured even when the sensing element has a narrow track width.

The central region D of the third antiferromagnetic layer 31 may be completely removed to expose the surface of the central region D of the free magnetic layer 28 as shown by the dotted line F in FIG. 7. However, since the exposed surface of the central region D of the free magnetic layer 28 is liable to be damaged by ion-milling or RIE, it is preferable to leave the third antiferromagnetic layer 31 behind on the central region D of the free magnetic layer 28, although the thickness thereof may be very small.

While the central region D of the third antiferromagnetic layer 31 is liable to be deteriorated by being damaged by ion-milling because the central region D of the third antiferromagnetic layer 31 is milled by in the embodiment shown in FIG. 7, the central region D of the third antiferromagnetic layer 31 is thin enough so that it is not antiferromagnetic, and the magnetic action is not exerted on each layer such as the free magnetic layer 28. Consequently, reproduction properties are conjectured not to be highly affected even when the central region of the third antiferromagnetic layer 31 is damaged by ion-milling.

Meanwhile, the magnetic sensing elements shown in FIG. 1 to 7 comprise electrode layers 34 on both side regions of the multilayer from the substrate 20 through the third antiferromagnetic layer 31 with interposition of the second antiferromagnetic layer 33, and have a structure called a CIP (current in the plane) magnetic sensing element in which an electric current flows through the multilayer parallel to the surface of each layer.

Figure 8:
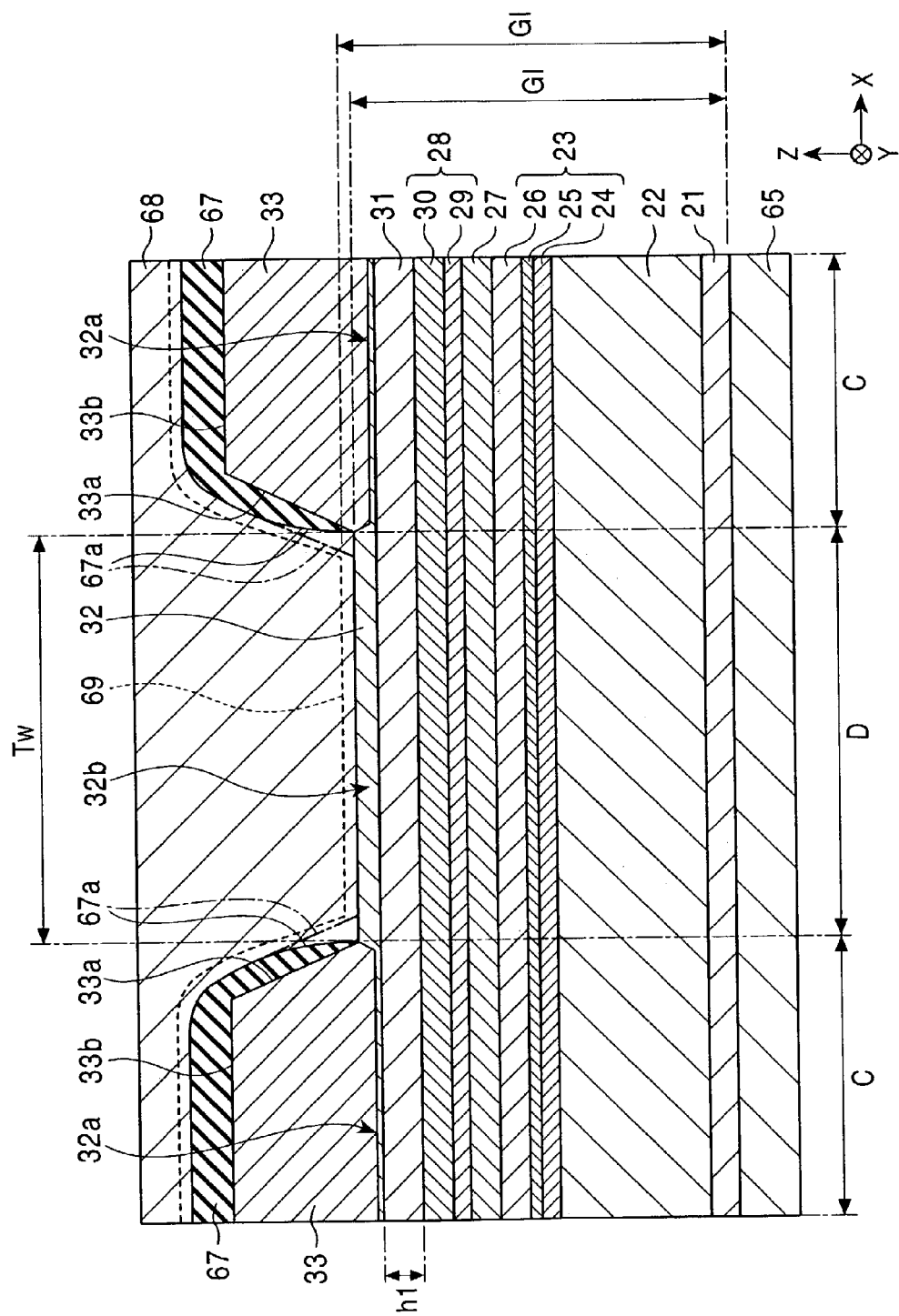
FIG. 8 is a partial cross section of the structure of the magnetic sensing element in a seventh embodiment of the present invention viewed from an opposed face side to a recording medium.

On the other hand, electrode layers 65 and 68 are provided on and under the multilayer (from the seed layer 21 through the third antiferromagnetic layer 31) in the magnetic sensing element shown in FIG. 8. The magnetic sensing element has a structure called a CPP (current perpendicular to the plane) magnetic sensing element in which the electric current flows from the electrodes 65 and 68 into each layer of the multilayer. The present invention is also applicable to the CCP magnetic sensing element.

Descriptions of the structure of the multilayer is omitted herein, since it is the same as that described in FIG. 1. The seed layer 21 shown in FIG. 8 may be omitted.

A lower electrode layer 65 that also serves as a lower shield layer is provided under the seed layer 21. The lower electrode 65 is formed by being plated with a magnetic material such as permalloy (NiFe).

The second antiferromagnetic layer 33 is formed on the side regions C of the multilayer in the track width direction (X-direction) with interposition of the nonmagnetic layer 32 as shown in FIG. 8. An insulation layer 67 is formed on the surface 33b of the second antiferromagnetic layer 33 and on the inner side face 33a.

As shown in FIG. 8, an upper electrode 68 that also serves as an upper shield is provided from on the insulation layer 67 through on the central region 32b of the nonmagnetic layer 32.

The lower electrode layer 65 and upper electrode layer 68 that also serve as protective layers are provided on and under the multilayer, respectively, in the magnetic sensing element shown in FIG. 8. The electric current flowing between the lower electrode layer 65 and upper electrode layer 68 flows perpendicular to the surface of each layer in the multilayer.

Since the surfaces 33b and the inner side face 33a of the second antiferromagnetic layer 33 are covered with the insulation layer 67 in the magnetic sensing element shown in FIG. 8, the electric current flowing from the upper electrode layer 68 into the multilayer does not shunt into the second antiferromagnetic layer 33, and properly flows in the multilayer. Therefore, the current flow passageway is prevented from being expanded out of the track width Tw, and consequently a CCP magnetic sensing element having a large regenerative output can be manufactured.

It is preferable for more efficiently preventing the electric current from shunting into the second antiferromagnetic layer 33 that the inner side region 67a of the insulation layer 67 is formed so as to be extended to both side regions of the central region 32b of the nonmagnetic layer 32 as shown by dotted broken line in FIG. 8.

A nonmagnetic layer 69 (dotted line) may be formed from on the insulation layer 67 through the central region 32b of the nonmagnetic-layer 32, if necessary. The nonmagnetic layer 69 is preferably formed of a nonmagnetic conductive material such as Ta, Ru, Rh, Ir, Cr, Re and Cu. While the nonmagnetic layer 69 serves as an upper gap layer, it is not preferable that the central region D of the multilayer as an inlet and outlet of the current flow passageway is covered with, for example, the nonmagnetic layer 69 comprising an insulation material, because the nonmagnetic layer 69 formed on the central region D of the multilayer blocks the electric current from flowing into the magnetic sensing element. Accordingly, the nonmagnetic layer 69 is preferably formed of the nonmagnetic conductive material.

The nonmagnetic material layer 27 constituting the magnetic sensing element may be formed of the nonmagnetic conductive element, or the nonmagnetic material layer 27 may be formed of an insulation material such as $Al_2O_3$ and $SiO_2$ in the magnetic sensing element shown in FIG. 8. The former magnetic sensing element has a structure called a spin valve GMR magnetoresistive element (CPP-GMR), while the latter magnetic sensing element has a structure called a spin valve tunnel magnetoresistive element (CPP-TMR).

Resistivity in the tunnel magnetoresistive element is changed by taking advantage of a spin tunnel effect. A tunnel electric current becomes most difficult to flow through the nonmagnetic material layer 27 when magnetization of the pinned magnetic layer 23 is antiparallel to magnetization of the free magnetic layer magnetic layer 28, and the resistance becomes maximum. On the other hand, the tunnel electric current becomes most ready to flow when magnetization of the pinned magnetic layer 23 is antiparallel to magnetization of the free magnetic layer 28, and resistance becomes minimum.

The leakage magnetic field from the recording medium is sensed by taking advantage of the principle above by detecting the varying electrical resistance as a voltage change (in a constant current operation) or current change (in a constant voltage operation) as a result of magnetic variation of the free magnetic layer 28 by an influence of the external magnetic field.

Figure 9:
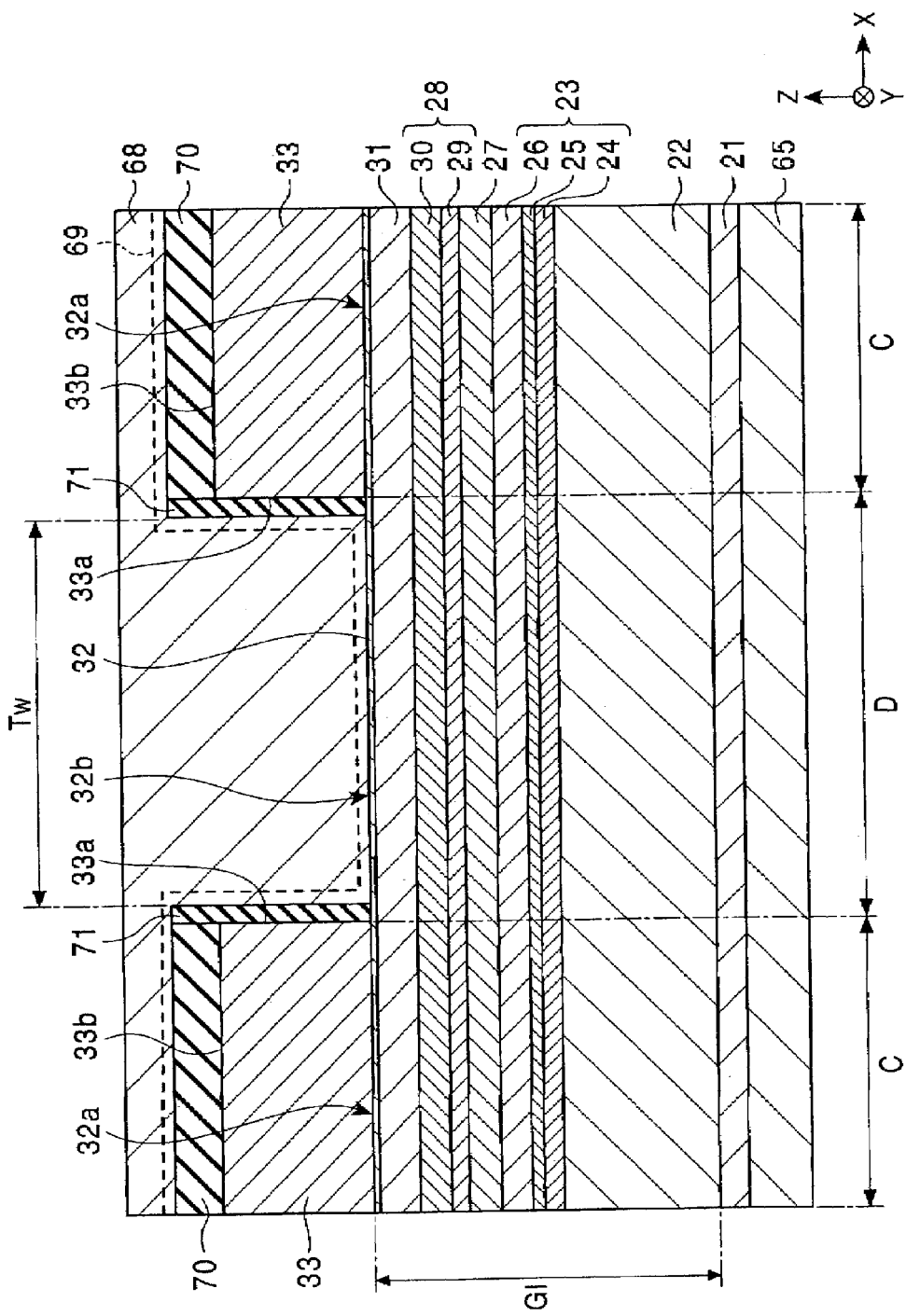
FIG. 9 is a partial cross section of the structure of the magnetic sensing element in a eighth embodiment of the present invention viewed from an opposed face side to a recording medium.

FIG. 9 shows an embodiment in which the magnetic sensing element shown in FIG. 5 was manufactured as a CCP magnetic sensing element. The magnetic sensing element shown in FIG. 9 differs from the magnetic sensing element in FIG. 8 in that a first insulation layer 70 is formed on the surface 33b of the second antiferromagnetic layer 33, and a second insulation layer 71 different from the first insulation layer 70 is formed on the inner side face 33a of the second antiferromagnetic layer 33. Such difference is ascribed to the difference of the manufacturing method as will be described hereinafter.

The functions of the first insulation layer 70 and second insulation layer 71 are the same as the function of the insulation layer 68 shown in FIG. 8, and serve for properly preventing the electric current flowing from the upper electrode layer 68 from shunting into the second antiferromagnetic layer 33.

The first insulation layer 70 and second insulation layer 71 are formed of an insulating material such as $Al_2O_3$, $SiO_2$, AlN, Al—Si—O—N, Al—Si—O, $Ti_2O_3$ and $Ti_3O_5$.

While the inner side face 33a of the second antiferromagnetic layer 33 is perpendicular to the track width direction (X-direction) in the embodiment shown in FIG. 9, the inner side region may be formed as an inclined face or a curved face by which the distance between the second antiferromagnetic layers 33 gradually increases in the direction remote from the free magnetic layer 28.

It is preferable to form the inner side face 33a with the inclined or curved face, since the second insulation layer 71 having an appropriate thickness is readily formed on the inner side face 33a to properly reduce the shunt current loss.

Since the surface 33b and the inner side region 33a of the second antiferromagnetic layer 33 are covered with the insulation layers 70 and 71, the electric current flowing form the upper electrode 68 through the multilayer does not shunt into the second antiferromagnetic layer 33, and properly flows within the track width Tw determined by the distance between the second insulation layers 71 in the track width direction. Accordingly, a CCP magnetic sensing element capable of suppressing the electric current flow passageway from spreading out of the track width TW and having a large regenerative output can be manufactured by the magnetic sensing element with the structure shown in FIG. 9.

A nonmagnetic layer 69 shown by a dotted line may be provided from on the first insulation layer 70 through the second insulation layer 71, and through the central region of the multilayer, as shown in FIG. 9. The nonmagnetic layer 69 is preferably formed of a nonmagnetic conductive material such as Ta, Ru, Rh, Ir, Cr, Re and Cu. While the nonmagnetic layer 69 serves as an upper gap layer, it is not preferable that the central region D of the multilayer as an inlet and outlet of the current flow passageway is covered with, for example, the nonmagnetic layer 69 comprising an insulation material, because the nonmagnetic layer 69 formed on the central region D of the multilayer blocks the electric current from flowing into the magnetic sensing element. Accordingly, the nonmagnetic layer 69 is preferably formed of the nonmagnetic conductive material.

The nonmagnetic material layer 27 constituting the magnetic sensing element may be formed of a nonmagnetic conductive material such as Cu, or the nonmagnetic material layer 27 may be formed of an insulation material such as $Al_2O_3$ and $SiO_2$ in the magnetic sensing element shown in FIG. 9. The former magnetic sensing element has structure called a spin valve GMR magnetoresistive element (CPP-GMR), and the latter former magnetic sensing element has structure called a spin valve tunnel magnetoresistive element (CPP-TMR).

The direction of magnetization at the central region D of the free magnetic layer 28 can be rapidly and readily changed by the external magnetic field (signal recording magnetic field) even at near the side regions C in the embodiments shown in FIGS. 3 to 9, by forming the magnetic material layer 30 with the NiFe layer, NiFeX layer, amorphous Co alloy layer or CoFeX layer that are magnetic materials having small exchange stiffness constants A.

Consequently, the width of the central region D of the free magnetic layer 28 of the magnetic sensing element is approximately equal to the optical track width O-Tw, and a high output of the sensed magnetic field can be maintained even when the magnetic sensing element has a narrow track width.

Figure 10:
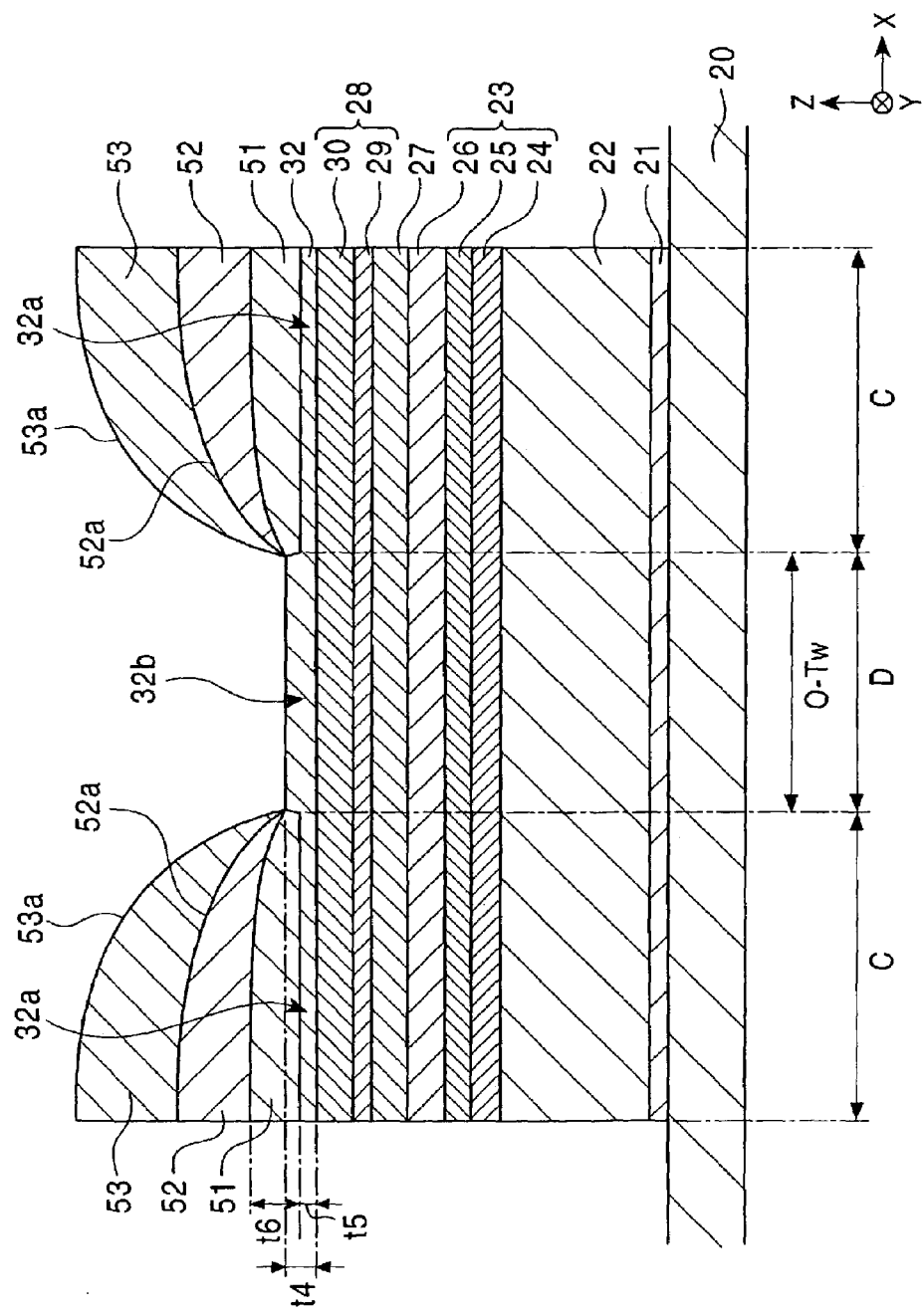
FIG. 10 is a partial cross section of the structure of the magnetic sensing element in a ninth embodiment of the present invention viewed from an opposed face side to a recording medium.

FIG. 10 is a partial cross section of the magnetic sensing element in the ninth embodiment of the present invention viewed from the opposed face side to a recording medium.

The materials, shapes and thickness of the first antiferromagnetic layer 22, pinned magnetic layer 23, nonmagnetic material layer 27 and free magnetic layer 28 of the magnetic sensing element shown in FIG. 10 are the same as those of the magnetic sensing element shown in FIG. 1.

The nonmagnetic layer 32 is formed on the nonmagnetic material layer 30 of the free magnetic layer 28 in the magnetic sensing element shown in FIG. 10. A ferromagnetic layer 51 is further formed on each side region 32a of the nonmagnetic layer 32. A second antiferromagnetic layer 52 is further formed on each ferromagnetic layer. The second antiferromagnetic layer 52 is formed of the PtMn alloy, X—Mn (X is any at least one element of Pd, Ir, Rh, Ru, Os, Ni and Fe) alloy or Pt—Mn—X' (X' is any at least one element of Pd, Ir, Rh, Ru, Au, Ag, Os, Cr, Ni, At, Ne, Xe and Kr) alloy as the first antiferromagnetic 22 is.

An electrode layer 53 is formed on each second antiferromagnetic layer 52. The electrode layer 53 is formed of, for example, Au, W, Cr, Ru and Ta.

Figure 11:
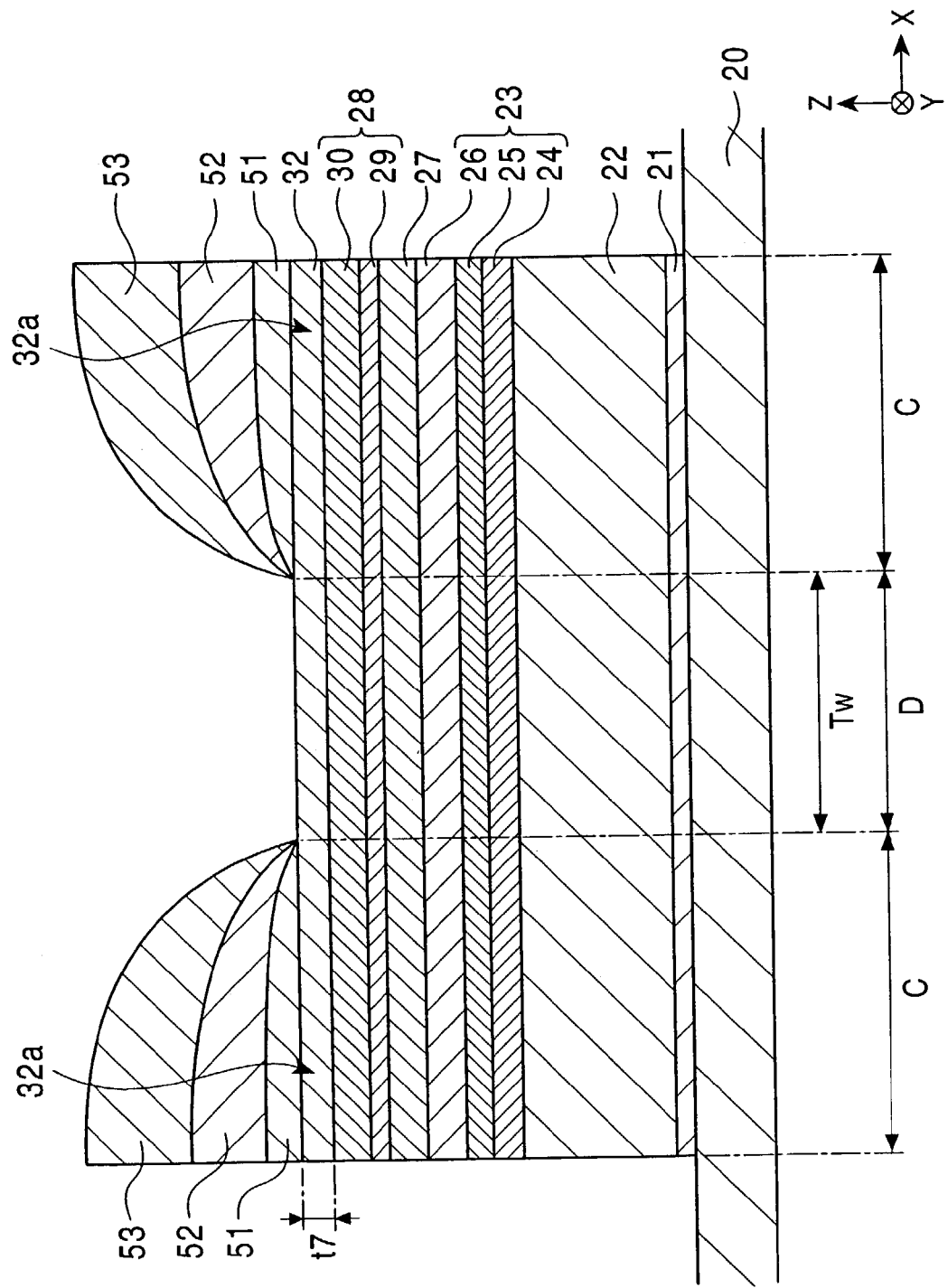
FIG. 11 is a partial cross section of the structure of the magnetic sensing element in a tenth embodiment of the present invention viewed from an opposed face side to a recording medium.

An inclined or a curved surface is formed on the inner side region 52a of each antiferromagnetic layer 52, and on the inner side region 53a of each electrode layer 53 so that the distance between the inner side regions gradually expands from the lower face to the upper face (in the Z-direction) in the embodiment shown in FIG. 10. The same configuration is seen in FIG. 11.

The features of the magnetic sensing element in the embodiment shown in FIG. 10 will be described hereinafter.

As shown in FIG. 10, the nonmagnetic layer 32 is formed on the free magnetic layer 28, and the ferromagnetic layer 51 and second antiferromagnetic layer 52 are formed on each side region 32a of the nonmagnetic layer 32.

Each side region of the nonmagnetic layer 32 is formed to have a thickness t5 smaller than the thickness t4 of the central region 32b of the nonmagnetic layer 32.

A ferromagnetic coupling is readily applied between each ferromagnetic layer 51 and each side region of the free magnetic layer 28, when each side region 32a of the nonmagnetic layer 32 is formed to have a thickness of, for example, 5 Å or less, preferably 3 Å or less.

An antiferromagnetic coupling is readily applied between the ferromagnetic layer 51 and each region C of the free magnetic layer 28, when each side region 32a of the nonmagnetic layer 32 is formed to have a thickness of, for example, 5 Å to 15 Å, preferably 7 Å to 11 Å. The ferromagnetic layer 51 is tightly put into a single magnetic domain sate in the track width direction (X-direction) by an exchange coupling magnetic field generated between the ferromagnetic layer and second antiferromagnetic layer 52 formed thereon. Consequently, the each region C of the free magnetic layer 28 receiving a ferromagnetic or antiferromagnetic coupling force from the antiferromagnetic layer 51 is tightly put into a single magnetic domain state in the track width direction (X-direction) or in the direction antiparallel to the track width direction.

The terms "ferromagnetic coupling" as used herein means that magnetization at each side region C of the free magnetic layer 28 is oriented in the same direction as the direction of magnetization of the ferromagnetic layer 51 by a RKKY ferromagnetic coupling between each side region C of the free magnetic layer 28 and the nonmagnetic layer 32, or by a direct exchange interaction through defects such as pinholes formed on the nonmagnetic layer 32.

The term "antiferromagnetic coupling" as used herein means that magnetization at each side region C of the free magnetic layer 28 is oriented in the direction antiparallel to the direction of magnetization of each ferromagnetic layer 51 by a RKKY antiferromagnetic coupling between each side region C of the free magnetic layer 28 and each side region 51a of the ferromagnetic layer 51 through the nonmagnetic layer 32.

On the other hand, magnetization of the central region D of the free magnetic layer 28 is weakly put into a single magnetic domain state to an extent capable of magnetic inversion.

The optical track width O-Tw is defined by the distance in the track width direction between the lower faces of the ferromagnetic layers 51 in the embodiment shown in FIG. 10.

Magnetization of the central region D of the free magnetic layer 28 is also weakly put into a single magnetic domain state to an extent capable of magnetic inversion against the external magnetic field in the embodiment shown in FIG. 10, while magnetization of each side region C of the free magnetic layer 28 is properly fixed in the track width direction (X-direction) or in the direction antiparallel to the track width direction.

The direction of magnetization at the central region D of the free magnetic layer 28 can be rapidly and readily changed by the external magnetic field (signal recording magnetic field) even at near the side regions C in this embodiment, by forming the magnetic material layer 30 with the NiFe layer, NiFeX layer, amorphous Co alloy layer or CoFeX layer, that is a magnetic material having a small exchange stiffness constant A.

Accordingly, the free magnetic layer 28 of the magnetic sensing element shown in FIG. 10 has the same order of track width (the width at the region capable of easy inversion of magnetization) and optical track width in the track width direction at the central area D, and a high out put of the sensed the magnetic field can be maintained even in the narrow track width structure.

The non magnetic layer 32 will be then described hereinafter. In the manufacturing method to be described hereinafter, the nonmagnetic layer 32 serves as a protective layer for protecting the free magnetic layer 28 from being oxidized by exposure to the atmosphere.

However, the nonmagnetic layer 32 is preferably formed of a material that is hardly oxidized as compared with the Ta layer. The elements constituting the nonmagnetic layer 32 hardly deteriorate the properties of the ferromagnetic material layer, even when the elements are diffused into the free magnetic layer 28 and ferromagnetic layers 51 in the deposition step and by annealing in the magnetic field for controlling the directions of magnetization of the pinned magnetic layer 23 and free magnetic layer 28.

The nonmagnetic layer 32 is preferably formed of any at least one element of Ru, Rh, Re, Pd, Os, Ir, Cr, Cu, Pt and Au. Ru is preferably selected among them. The nonmagnetic layer 32 formed of these precious metals is hardly oxidized by exposure to the atmosphere. Accordingly, the layer is never swelled by oxidation caused by exposure to the atmosphere as the Ta layer is.

The properties as the ferromagnetic material layer are not deteriorated even when the elements constituting the nonmagnetic layer 32 formed of the precious metals are diffused into the free magnetic layer 28 and ferromagnetic layers 51 and 51.

Whether the elements constituting the nonmagnetic layer 32 are diffused into the free magnetic layer 28 and each ferromagnetic layer 51 or not is measured, for example, with a SIMS analyzer (secondary ion mass spectrometer).

The thickness of the nonmagnetic layer 32 will be described below. The nonmagnetic layer 32 is preferably formed with a thickness as small as 3 Å or more and 20 Å or less, more preferably 3 Å or more and 10 Å or less, in the deposition process. Since the nonmagnetic layer 32 comprising Ru and the like is a dense layer that is hardly oxidized by exposure to the atmosphere, such thin layer is enough for properly protecting the free magnetic layer 28 from being oxidized by exposure to the atmosphere.

The thickness in the deposition process remains unchanged at the central region 32b of the nonmagnetic layer 32, because the central region 32b is not affected by ion-milling as will be described in the manufacturing method hereinafter. Accordingly, the thickness t4 of the central portion 32b of the nonmagnetic layer 32 shown in FIG. 10 is preferably 3 Å for more and 20 Å or less, more preferably 3 Å or more and 10 Å or less.

On the other hand, each side region 32a of the nonmagnetic layer 32 is milled by ion-milling, and the thickness t5 at each side region 32a is smaller than the thickness t4 at the central region 32b. The thickness t5 at each side region 32a is made to be smaller than the thickness t4 at the central region 32b, in order to properly generate a ferromagnetic or an antiferromagnetic coupling between each side region and C of the free magnetic layer 28 and ferromagnetic layer 51 formed thereon with interposition of the nonmagnetic layer 32, and in order to effectively and tightly fix magnetization of each side region C of the free magnetic layer 28 in the track width direction (X-direction).

Since a part of each side region 32a of the nonmagnetic layer 32 is left behind as shown in FIG. 10, each side region and C of the free magnetic layer 28 is not damaged by ion-milling, and magnetic properties of the free magnetic layer 29 are never damaged.

Using low energy ion-milling permits each side region 32a of the nonmagnetic layer 32 to be left behind with a small thickness. The nonmagnetic layer 32 is intrinsically formed with a small thickness of preferably 3 Å to 20 Å, more preferably 3 Å to 10 Å, in the deposition process. Accordingly, the thickness of the nonmagnetic layer 32 can be sufficiently adjusted by low energy ion milling. The milling rate by low energy ion-milling is slow as compared with high energy of ion-milling, and control of milling such as stop of milling at the halfway of milling of the nonmagnetic layer 32 is relatively simple.

Low energy ion-milling is defined to be ion-milling using an ion beam with a beam voltage (acceleration voltage) of less than 1000 V, for example 100 to 500 V.

Accordingly, a part of the nonmagnetic layer 32 may be left behind on each side region C of the free magnetic layer 28 as shown in FIG. 10. The free magnetic layer 28 is not removed by ion-milling, and magnetic properties of the free magnetic layer 28 are never deteriorated by being damaged by ion-milling.

The thickness t6 of the ferromagnetic layer 51 is preferably 2 Å or more and 50 Å or less in the present invention.

A ferromagnetic coupling or an antiferromagnetic coupling can be effectively generated between each side region C of the free magnetic layer 28 and ferromagnetic layer even by forming a thin ferromagnetic layer 51 in the present invention. This is because each side region C of the free magnetic layer 28 maintains proper magnetic properties by being not affected by ion-milling. Forming the ferromagnetic layer 51 so thin as described above enables a large exchange coupling magnetic field to be generated between the ferromagnetic layer 51 and each second antiferromagnetic layer 52. Furthermore, deterioration of sensitivity of the free magnetic layer 28, caused by the effect of an excessive static magnetic field from the inner side region of the ferromagnetic layer 51 on the central region of the free magnetic layer 28, may be properly suppressed.

FIG. 11 is a partial cross section of the structure of the magnetic sensing element of the tenth embodiment of the present invention viewed from the opposed side face to a recording medium.

The structure of the magnetic sensing element shown in FIG. 11 differs from the structure shown in FIG. 10 in that the nonmagnetic layer 32 has a uniform thickness t7 on the central region and on each side regions C of the free magnetic layer 28.

A ferromagnetic coupling is readily applied between each ferromagnetic layer 51 and each side region C of the free magnetic layer 28, when the nonmagnetic layer 32 is formed with a thickness of 5 Å or less, preferably 3 Å or less.

An antiferromagnetic coupling is readily applied between each ferromagnetic layer 51 and each side region C of the free magnetic layer 28, when the nonmagnetic layer 32 is formed, for example, with a thickness of 5 Å to 15 Å, preferably 7 Å to 11 Å. The minimum value of the thickness t7 of the nonmagnetic layer 32 is restricted to 3 Å, because the free magnetic layer 28 cannot be properly protected from oxidation unless the nonmagnetic layer has a thickness of this order.

The magnetic sensing element shown in FIG. 11 is formed by the following two ways. The nonmagnetic layer 32 is not subjected to ion-milling in one of the methods.

In the second method, the surface of the nonmagnetic layer 32 is uniformly subjected to ion-milling after depositing the surface from the first antiferromagnetic layer 22 through the nonmagnetic layer 32 shown in FIG. 11. The thickness of the nonmagnetic layer 32 in the deposition process is 3 Å or more and 20 Å or less, more preferably 3 Å or more and 10 Å or less. The nonmagnetic layer 32 is milled to have the thickness t7 by ion-milling.

Since the materials and thickness of other layers are the same in FIG. 11 and FIG. 10 except the configuration of the nonmagnetic layer 32, FIG. 10 may be referenced with respect to the detailed descriptions of the other layers.

Figure 12:
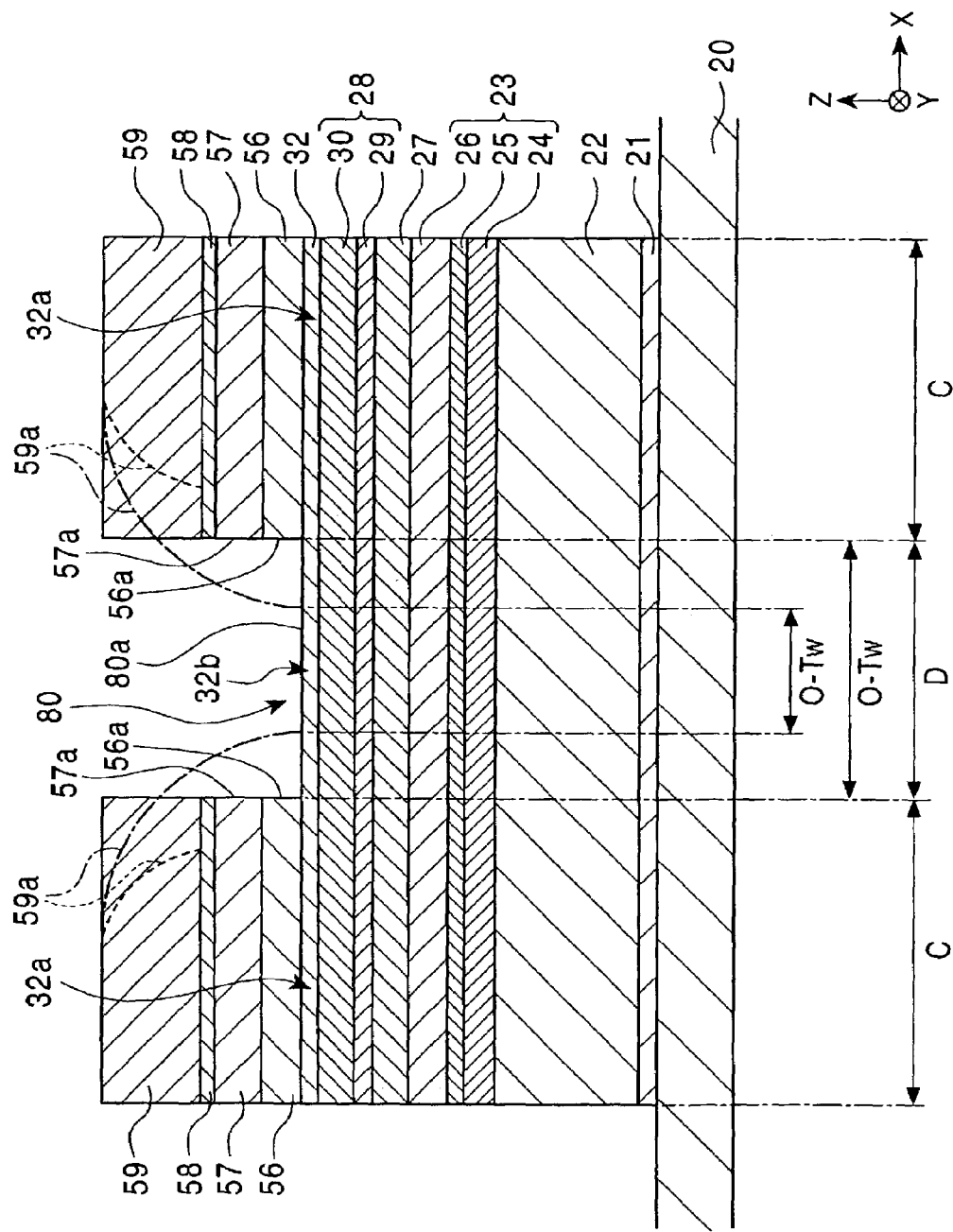
FIG. 12 is a partial cross section of the structure of the magnetic sensing element in a eleventh embodiment of the present invention viewed from an opposed face side to a recording medium.

FIG. 12 is a partial cross section of the magnetic sensing element of the fourth embodiment of the present invention viewed from the opposed side face to a recording medium.

In FIG. 12, the seed layer 21, first antiferromagnetic layer 22, pinned magnetic layer 23, nonmagnetic material layer 27, free magnetic layer 28 and nonmagnetic layer 32 are laminated on the substrate 20. The material of each layer is the same as that described in FIG. 1.

Each ferromagnetic layer 56 is formed on each side region 32a of the nonmagnetic layer 32, and each second antiferromagnetic layer 57 is formed on each ferromagnetic layer 56 in the embodiment shown in FIG. 12. Each electrode layer 59 is further formed on each second antiferromagnetic layer 57 with interposition of a protective layer (intermediate layer) 59 formed of Ta and the like. Protective layer 58 may be omitted.

The nonmagnetic layer 32 is preferably formed of a material that is hardly oxidized by exposure to the atmosphere, and properties as a ferromagnetic layer are preferably not deteriorated even when the elements constituting the nonmagnetic layer 32 are diffused into the free magnetic layer 28 and each ferromagnetic layer 56. For example, the nonmagnetic layer 32 is preferably formed of any at least one precious metal of Ru, Rh, Re, Pd, Os, Ir, Cr, Cu, Pt and Au.

Forming the nonmagnetic layer 32 with a thickness of 5 Å or less, preferably with a thickness of 3 Å or less permits a ferromagnetic coupling to act between the ferromagnetic layers 56 and 56 and each side region C of the free magnetic layer 28.

An antiferromagnetic coupling is also readily applied between each ferromagnetic layer 56 and each side region C of the free magnetic layer 28, by forming the nonmagnetic layer 32 with a thickness of, for example, 5 Å to 15 Å, preferably 7 Å to 11 Å.

A concave region 80 having an opening is provided on the surface of the second antiferromagnetic layer 57 in the embodiment shown in FIG. 12. The bottom face 80a of the concave region 80 is formed within the nonmagnetic layer 32. Each inner side region 56a of the second antiferromagnetic layer 57, and of the ferromagnetic 56 is formed by being extended in the direction perpendicular to the surface of the substrate 20. Such difference of the configuration is ascribed to the difference of the manufacturing method as will be described hereinafter.

Each inner side region 56a of the second antiferromagnetic layer 57, and of the ferromagnetic layer 56 may be formed as an inclined or curved face in FIG. 12 so that the distance between the inner side regions are gradually expanded from the lower face through the upper face.

The distance between the lower faces of the ferromagnetic layers 56 in the track width direction (X-direction) is also defined as the optical track width O-Tw in FIG. 12.

In the embodiment shown in FIG. 12, magnetization of each ferromagnetic layer 56 is fixed in the track width direction (X-direction) by an exchange coupling magnetic field generated between the ferromagnetic layer and second antiferromagnetic layer 57, and magnetization of the each side regions C of the free magnetic layer 28 is fixed in the track width direction by a ferromagnetic coupling between the free magnetic layer and ferromagnetic layer 56. On the other hand, magnetization at the central region D of the free magnetic layer 28 is weakly put into a single magnetic domain state to an extent capable of magnetic inversion against the external magnetic field, and the region serves as a region capable of magnetic inversion against the external magnetic field.

The direction of magnetization on the free magnetic layer 28 and at the central region D of the free magnetic layer 42 can be rapidly and readily changed by the external magnetic field (signal recording magnetic field) even at near the side regions C in the embodiments shown in this embodiment, by forming the magnetic material layer 30 with the NiFe layer, NiFeX layer, amorphous Co alloy layer or CoFeX layer that are magnetic materials having small exchange stiffness constants A.

Consequently, the width of the central region D of the free magnetic layer 28 of the magnetic sensing element shown in FIG. 12 is approximately equal to the optical track width O-Tw, and a high output of the sensed magnetic field can be maintained even when the magnetic sensing element has a narrow track width.

Each side region 59a of the electrode layers 59 may be formed by being extended onto the central region 32b of the nonmagnetic layer 32 formed on the central region D of the free magnetic layer 28 as shown by the dotted broken line. The distance in the track width direction between the lower faces of the electrode layers 59 is defined as the optical track width. The inner side faces 59a of the electrode layers 59 are formed from the halfway of the intermediate layer 58, and the distance between the side faces 59a of the electrode layers 59 may be wider than the distance between the inner side faces of the second antiferromagnetic layers 57 and ferromagnetic layers 56.

The nonmagnetic layer 32 having a uniform thickness is formed on the entire surface of the free magnetic layer 28 in the embodiment shown in FIG. 12. The thickness of the central region 32b of the nonmagnetic layer 32 may be smaller than the thickness of each side region 32a.

The structures of the magnetic sensing elements of other embodiments manufactured by the same method as in FIG. 12 will be described hereinafter.

Figure 13:
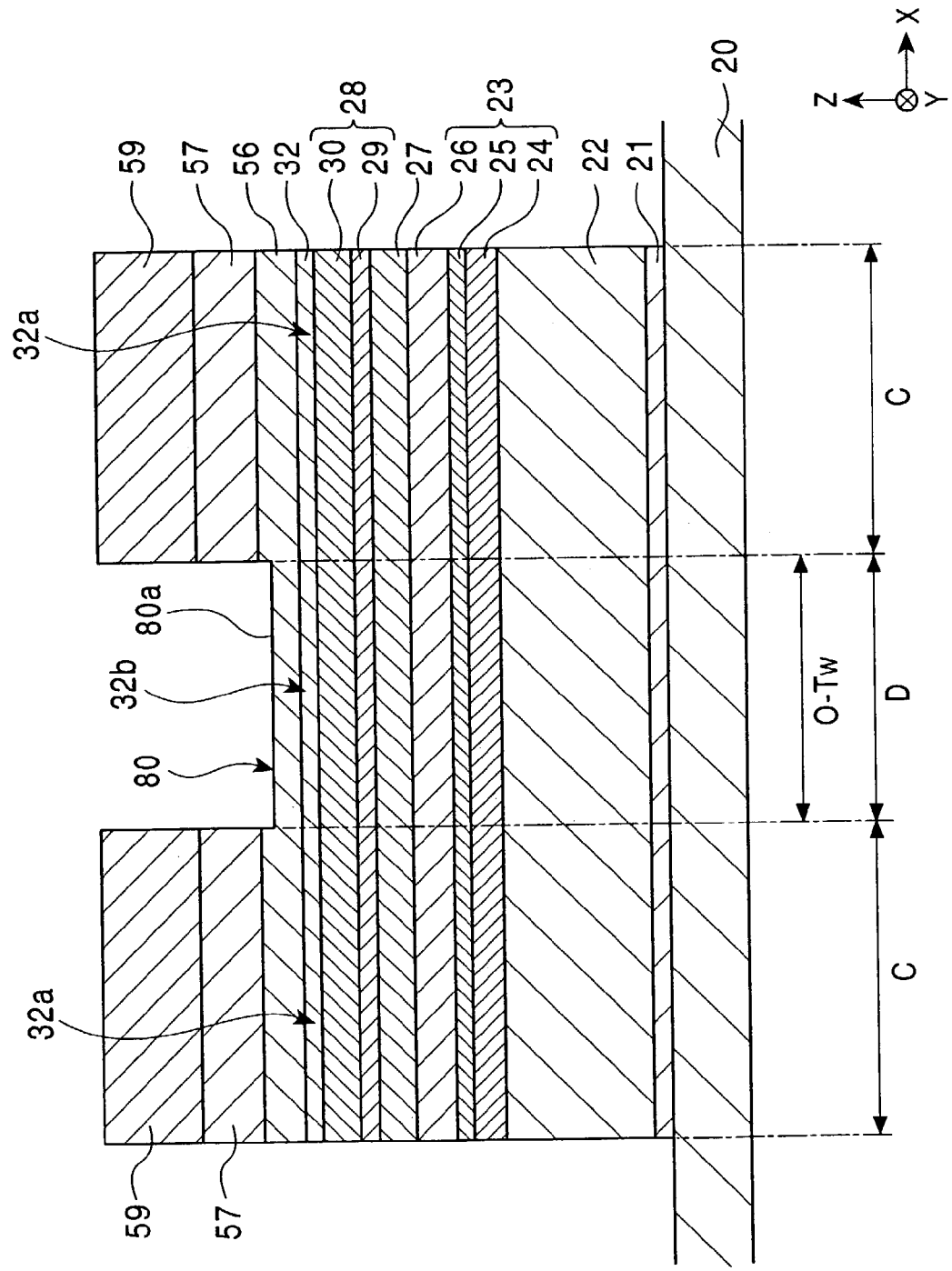
FIG. 13 is a partial cross section of the structure of the magnetic sensing element in a twelfth embodiment of the present invention viewed from an opposed face side to a recording medium.

FIG. 13 shows a partial cross section of the structure of the magnetic sensing element in the twelfth embodiment of the present invention viewed from the opposed face side to a recording medium.

The structure of the magnetic sensing element shown in FIG. 13 differs from that in FIG. 12 in that the bottom face 80a of the concave region 80 having an opening on the surface of the second antiferromagnetic layer 57 is formed within the ferromagnetic layer 56. In other words, the ferromagnetic layer 56 is also formed on the central region 32b of the nonmagnetic layer 32.

However, no second antiferromagnetic layer 57 is formed on the ferromagnetic layer 56 formed on the central region 32b of the nonmagnetic layer 32, magnetization of the ferromagnetic layer 56 formed at the central region D is not tightly fixed, and magnetization of the ferromagnetic layer 56 at the central region D is weakly put into a single magnetic domain state to an extent capable of magnetic inversion against the external magnetic field.

The distance between the lower faces of the second antiferromagnetic layers 57 in the track width direction (X-direction) is defined as the optical track width O-Tw in the embodiment shown in FIG. 13.

Each side region C of the ferromagnetic layer 56, and each side region C of the free magnetic layer 28 show a ferromagnetic or antiferromagnetic coupling with each other through the each side region 32a of the nonmagnetic layer 32, and magnetization at each side region C of the free magnetic layer 28 is tightly fixed in the same direction as, or in the antiparallel direction to, the direction of magnetization at each side region of the ferromagnetic layer 56.

On the other hand, magnetization at the central region D of the free magnetic layer 28 is weakly put into a single magnetic domain state to an extent capable of magnetic inversion, and the central region serves as a region capable of magnetic inversion against the external magnetic field.

The direction of magnetization at the central region D of the free magnetic layer 28 can be rapidly and readily changed by the external magnetic field (signal recording magnetic field) even at near the side regions C in this embodiment, by forming the magnetic material layer 30 with the NiFe layer, NiFeX layer, amorphous Co alloy layer or CoFeX layer that are magnetic materials having small exchange stiffness constants A.

Consequently, the width of the central region D of the free magnetic layer 28 of the magnetic sensing element shown in FIG. 13 is approximately equal to the optical track width O-Tw, and a high output of the sensed magnetic field can be maintained even when the magnetic sensing element has a narrow track width.

On the other hand, magnetization at the central region D of the free magnetic layer 28 is weakly put into a single magnetic domain state to an extent capable of sensitive magnetic inversion against the external magnetic field in the same direction as the direction of magnetization at the central region D of the ferromagnetic layers 56 and 56, and both the central region D of the free magnetic layer 28 and central region D of the ferromagnetic layer 56 are magnetically reversed together by invasion of the external magnetic field from the Y-direction, thereby reproducing the recording signal.

The thickness of each ferromagnetic layer 56 formed at the central region may be the same as the thickness of each ferromagnetic layer 56 formed at each side region C, or the former may be thinner than the latter.

FIG. 12 should be referenced with respect to the material and thickness of the nonmagnetic layer 32, since they are the same as those described therein.

Figure 14:
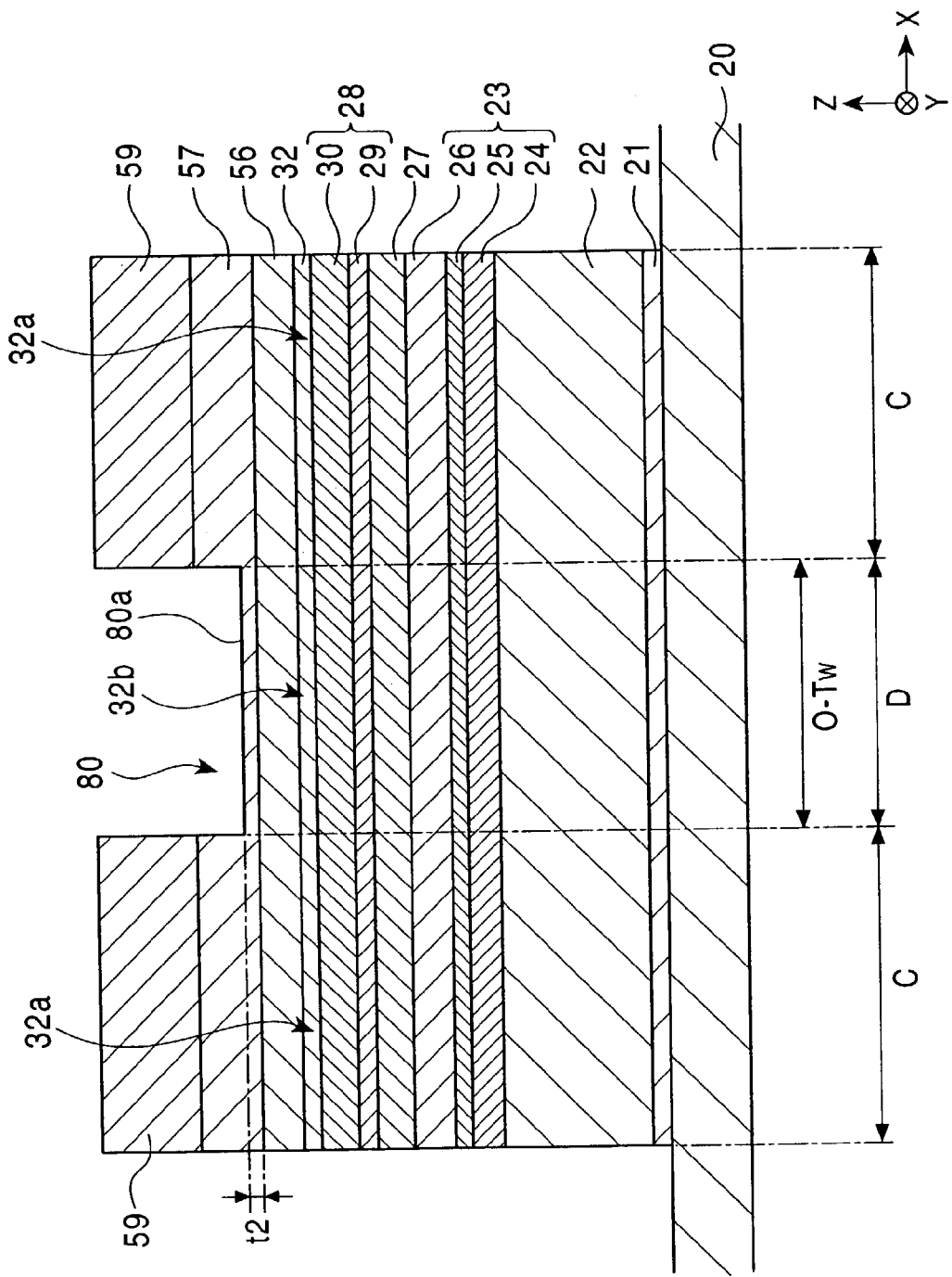
FIG. 14 is a partial cross section of the structure of the magnetic sensing element in a thirteenth embodiment of the present invention viewed from an opposed face side to a recording medium.

FIG. 14 shows a partial cross section of the structure of the magnetic sensing element in the thirteenth embodiment of the present invention viewed from the opposed side face to a recording medium.

The bottom face 80a of the concave region 80 having an opening on the surface of the second antiferromagnetic layer 57 is formed within the second antiferromagnetic layer 57 in FIG. 14. Accordingly, the ferromagnetic layer 56 is formed on the entire surface of the nonmagnetic layer 32 with a uniform thickness, and a thin second antiferromagnetic layer 57 is also formed on the central region 32b of the nonmagnetic layer 32 with interposition of the ferromagnetic layer 56.

The second antiferromagnetic layer 57 formed at the central region D has a smaller thickness t2 than the thickness of each second antiferromagnetic layer 57 formed at each side region C.

A small exchange coupling magnetic field, if any, is generated between the central region D of the second antiferromagnetic layer 57 and central region D of the ferromagnetic layers 56 and 56 by forming the second antiferromagnetic layer 57 formed at the central region D with a small thickness t2, and magnetization at the central region of the ferromagnetic layer 56 is not tightly fixed in the track width direction (X-direction).

The thickness t2 of the layer left behind on the central region of the second antiferromagnetic layer 57 is 50 Å or less, preferably 30 Å or less. When the thickness is larger than the thickness described above, a large exchange coupling magnetic field is generated between the central region D of the second antiferromagnetic layer 57 and the central region D of the ferromagnetic layer 56. Consequently, magnetization at the central region D of the ferromagnetic layer 56 is tightly fixed in the track width direction (X-direction), and magnetization at the central region of the free magnetic layer 28 is readily fixed in the track width direction (X-direction) or in the direction antiparallel to the track width direction, respectively, by a ferromagnetic coupling or antiferromagnetic coupling between the central region D of each ferromagnetic layer 56 and the central region D of the free magnetic layer 28, thereby lowering the reproductive sensitivity.

Each side region C of the ferromagnetic layer 56 and each side region C of the free magnetic layer 28 also exhibits an antiferromagnetic coupling through the nonmagnetic layer 32 in the embodiment shown in FIG. 14, as in the embodiments shown in FIGS. 12 and 13. Consequently, magnetization at each side region C of the free magnetic layer 28 is tightly fixed in the same direction as, or in the direction antiparallel to the direction of magnetization at each side region C of the ferromagnetic layer 56.

The distance in the track width direction (X-direction) between both side regions C of the second antiferromagnetic layer 57 is defined as the optical track width O-Tw in the embodiment shown in FIG. 14.

Magnetization at the central region D of the free magnetic layer 28 is weakly put into a single magnetic domain state to an extent capable of magnetic inversion against the external magnetic field, and the region serves as a region capable of magnetic inversion against the external magnetic field.

The direction of magnetization at the central region D of the free magnetic layer 28 can be rapidly and readily changed by the external magnetic field (signal recording magnetic field) even at near the side regions C in this embodiment, by forming the magnetic material layer 30 with the NiFe layer, NiFeX layer, amorphous Co alloy layer or CoFeX layer that are magnetic materials having small exchange stiffness constants A.

Consequently, the width of the central region D of the free magnetic layer 28 of the magnetic sensing element shown in FIG. 14 (the width capable of easy inversion of magnetization) is approximately equal to the optical track width O-Tw, and a high output of the sensed magnetic field can be maintained even when the magnetic sensing element has a narrow track width.

FIG. 12 should be referenced with respect to the material and thickness of the nonmagnetic layer 32.

The magnetic sensing elements in the embodiments shown in FIGS. 12 to 14 are formed by milling the central region D of the magnetic sensing element by ion-milling or reactive ion etching (RIE). The embodiments in FIGS. 12 to 14 are different with each other depending on the depth of milling of the central region D of the magnetic sensing element.

The nonmagnetic layer 32 is formed on each side region C of the free magnetic layer 28 in FIGS. 12 to 14, and the ferromagnetic layer 56 is formed thereon. Accordingly, the each side region C of the free magnetic layer 28 is not damaged by ion-milling. The nonmagnetic layer 32 formed of Ru and the like is formed to be very thin (preferably 3 Å or more and 20 Å or less, more preferably 3 Å or more and 10 Å or less) in the deposition process. Since low energy ion-milling is used in the process for adjusting the thickness of the nonmagnetic layer 32 by ion-milling, the milling process can be readily controlled so as to leave a part of the nonmagnetic layer 32 behind. Therefore, a part of the nonmagnetic layer 32 can be easily and properly left behind on the each side region C of the free magnetic layer 28. Ion-milling of the nonmagnetic layer 32 may be omitted.

The features of the free magnetic layer 28 in the present invention will be described hereinafter.

The side of the free magnetic layer 28 described above in contact with the nonmagnetic material layer 27 serves as the diffusion preventive layer 29 comprising CoFe and Co. The magnetic material layer 30 comprises at least one of the NiFe layer comprising $Ni_aFe_b$ (a and b represented by at %, and satisfy the relations of a>80 at % and a+b=100 at %), NiFeX layer (X is at least one element selected from Mn, Cu, Zn, Ti, Al, Ge, Si, Cr, V, Sn, Ir, Ru, Nb, Sb, W, Mo, Os and Ta), amorphous Co alloy layer comprising an amorphous Co based magnetic material, and CoFeX layer (X is one or at least two elements selected from Ti, Al, Mn, Si, V, Cr, Ta, Zn, Sb, Ge, Mo and W).

The free magnetic layer 28 may have a monolayer structure comprising only the magnetic material layer 30.

Figure 15:
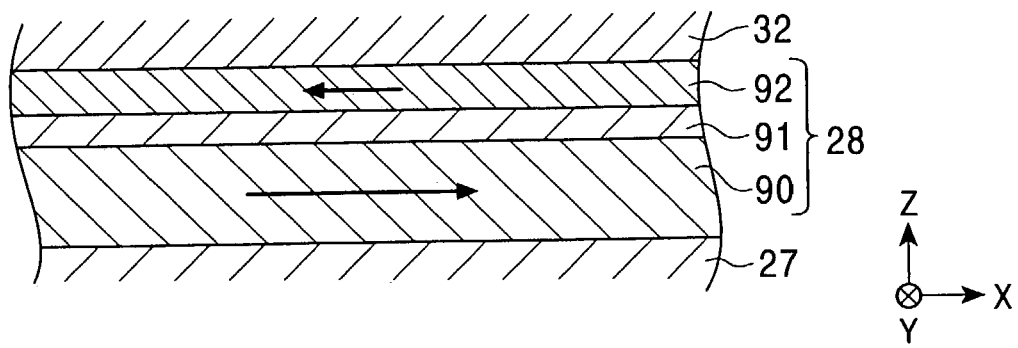
FIG. 15 is a partially magnified cross section of the free magnetic layer in an embodiment of the present invention viewed from an opposed face side to a recording medium.

FIG. 15 is a partially magnified cross section showing another embodiment of the free magnetic layer 28. The free magnetic layer 28 shown in FIG. 15 has a structure called a laminated ferrimagnetic structure. This structure enables effective magnetic thickness of the free magnetic layer 28 to be small without extremely reducing the physical thickness of the free magnetic layer 28, and sensitivity against the external magnetic field can be improved.

The reference numerals 90 and 92 denote magnetic layers, and the reference numeral 91 denotes a nonmagnetic intermediate layer.

The magnetic layer 90 and magnetic layer 92 comprise the NiFe layer comprising $Ni_aFe_b$ (a and b represented by at %, and satisfy the relations of a>80 at % and a+b=100 at %), NiFeX layer (X is at least one element selected from Mn, Cu, Zn, Ti, Al, Ge, Si, Cr, V, Sn, Ir, Ru, Nb, Sb, W, Mo, Os and Ta), amorphous Co alloy layer comprising an amorphous Co based magnetic material, and CoFeX layer (X is one or at least two elements selected from Ti, Al, Mn, Si, V, Cr, Ta, Zn, Sb, Ge, Mo and W).

The nonmagnetic intermediate layer 91 is preferably formed of at least one element of Ru, Rh, Ir, Cr, Re and Cu. The thickness of the magnetic layer 90 is, for example, about 35 Å, the thickness of the nonmagnetic intermediate layer 91 is, for example, about 9 Å, and the thickness of the magnetic layer 92 is, for example, about 15 Å.

A diffusion preventive layer made of CoFe or Co may be provided between the magnetic layer 90 and nonmagnetic material layer 27. A magnetic layer made of the CoFe alloy may be interposed between the magnetic layer 92 and nonmagnetic layer 32 or third antiferromagnetic layer 31.

Figure 16:
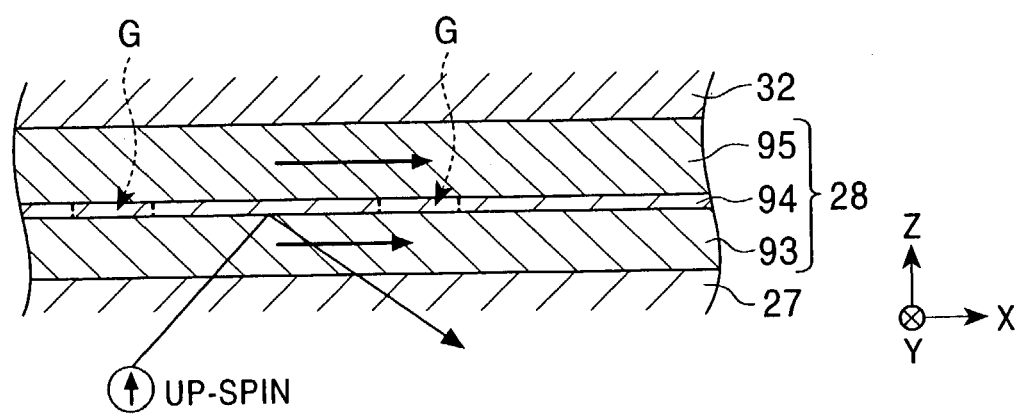
FIG. 16 is a partially magnified cross section of the free magnetic layer in another embodiment of the present invention viewed from an opposed face side to a recording medium.

FIG. 16 is a partially magnified cross section showing a different embodiment of the free magnetic layer 28 the present invention. A specular layer 94 is formed between the magnetic material layers 93 and 95 in the free magnetic layer 28 shown in FIG. 16. Defects (pin-holes) G as shown in FIG. 16 may be formed in the secular layer 94. The magnetic layer 93 and magnetic layer 95 interposing the specular layer (specular reflection layer) 94 are magnetized in the same direction (the direction of arrows) in the embodiment shown in FIG. 16.

The magnetic layer 93 and magnetic layer 95 contain the NiFe layer comprising $Ni_aFe_b$ (a and b represented by at %, and satisfy the relations of a>80 at % and a+b=100 at %), NiFeX layer (X is at least one element selected from Mn, Cu, Zn, Ti, Al, Ge, Si, Cr, V, Sn, Ir, Ru, Nb, Sb, W, Mo, Os and Ta), amorphous Co alloy layer comprising an amorphous Co based magnetic material, and CoFeX layer (X is one or at least two elements selected from Ti, Al, Mn, Si, V, Cr, Ta, Zn, Sb, Ge, Mo and W).

Conductive electrons (for example conductive electrons having up-spins) perform specular reflection while maintaining their spin state (energy and quantum state) when the specular layer 94 is formed in the free magnetic layer 28 as shown in FIG. 16. The conductive electrons having the up-spins after specular reflection change their direction of travel, and becomes possible to pass through the free magnetic layer.

Providing the specular layer 94 permits the mean free path $\lambda^+$ of the up-spin conductive electrons to be more extended than in the conventional art. Consequently, the difference between the mean free path $\lambda^+$ of the up-spin conductive electrons and mean free path $\lambda^-$ of the down-spin conductive electrons may be increased, and the rate of change of resistance ($\Delta R/R$) is improved with an improvement of the regenerative output.

The specular layer 94 is formed by depositing the layers up to the magnetic material layer 93, followed by oxidizing the surface of the magnetic material layer 93. The oxide layer can function as the specular layer 94. The magnetic material layer 95 is deposited on the specular layer 94.

Examples of the material of the specular layer 94 include Fe—O, Ni—O, Co—O, Co—Fe—O, Co—Fe—Ni—O, Al—O, Al-Q-O (Q is at least one element selected form B, Si, N, Ti, V, Cr, Mn, Fe, Co and Ni), oxide R—O(R is at least one element selected form Ti, V, Cr, Zr, Nb, Mo, Hf, Ta and W), Al—N, Al-Q-N (Q is at least one element selected form B, Si, N, Ti, V, Cr, Mn, Fe, Co and Ni), and nitride R—N(R is at least one element selected form Ti, V, Cr, Zr, Nb, Mo, Hf, Ta and W), and semi-metal whistler alloys.

Figure 17:
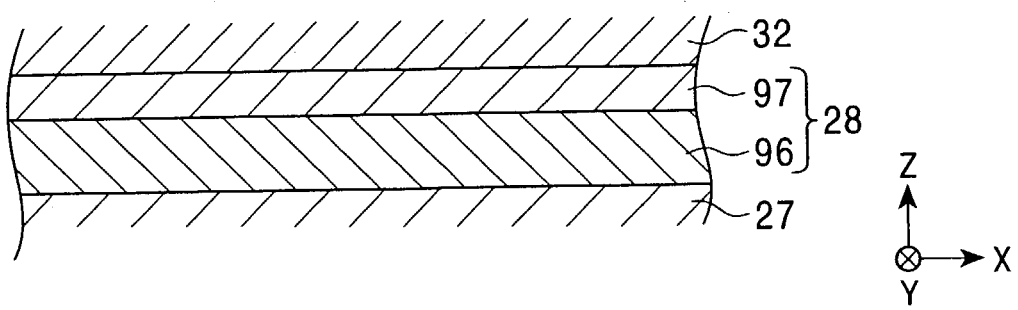
FIG. 17 is a partially magnified cross section of the free magnetic layer in a different embodiment of the present invention viewed from an opposed face side to a recording medium.

FIG. 17 is a partially magnified cross section showing a different embodiment of the free magnetic layer 28 according to the present invention.

A backed layer 97 is formed on the magnetic layer 96 in the free magnetic layer 28 shown in FIG. 17. The backed layer 97 is formed of, for example, Cu, Ag, Au or Ru.

The magnetic layer 96 contains $Ni_aFe_b$ (a and b represented by at %, and satisfy the relations of a>80 at % and a+b=100 at %), NiFeX layer (X is at least one element selected from Mn, Cu, Zn, Ti, Al, Ge, Si, Cr, V, Sn, Ir, Ru, Nb, Sb, W, Mo, Os and Ta), amorphous Co alloy layer comprising an amorphous Co based magnetic material, or CoFeX layer (X is one or at least two elements selected from Ti, Al, Mn, Si, V, Cr, Ta, Zn, Sb, Ge, Mo and W).

Forming the backed layer 97 permits the mean free path of the up-spin conductive electrons contributing to the magnetoresistive effect to be extended, and a large rate of change of resistance is obtained in the spin valve magnetic element by a so-called spin filter effect, thereby enabling the magnetic sensing element to comply with high density recording.

The method for manufacturing the magnetic sensing element shown in FIG. 1 will be described below.

Figure 18:
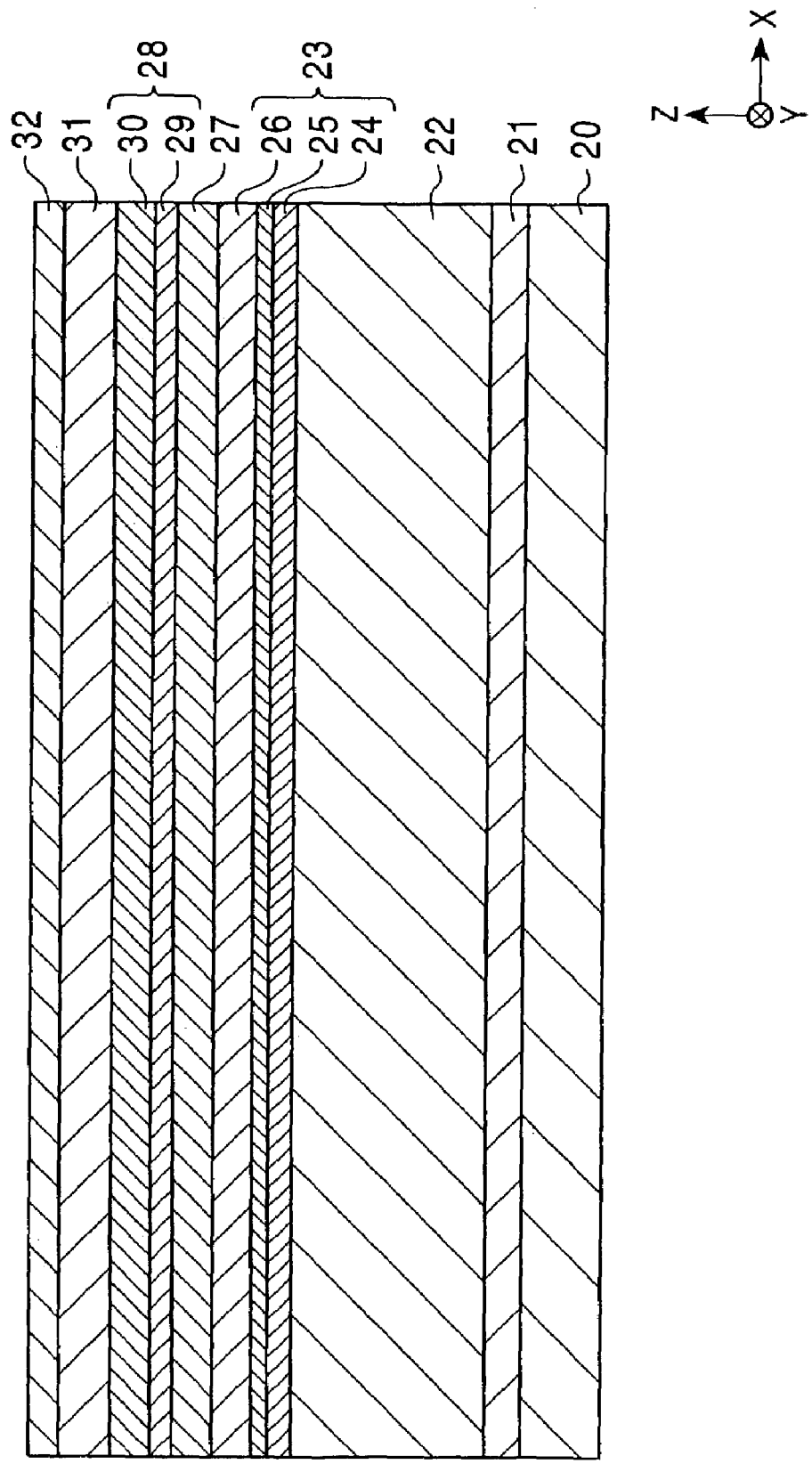
FIG. 18 shows a step of the manufacturing process of the magnetic sensing element shown in the embodiment in FIG. 1.
Figure 19:
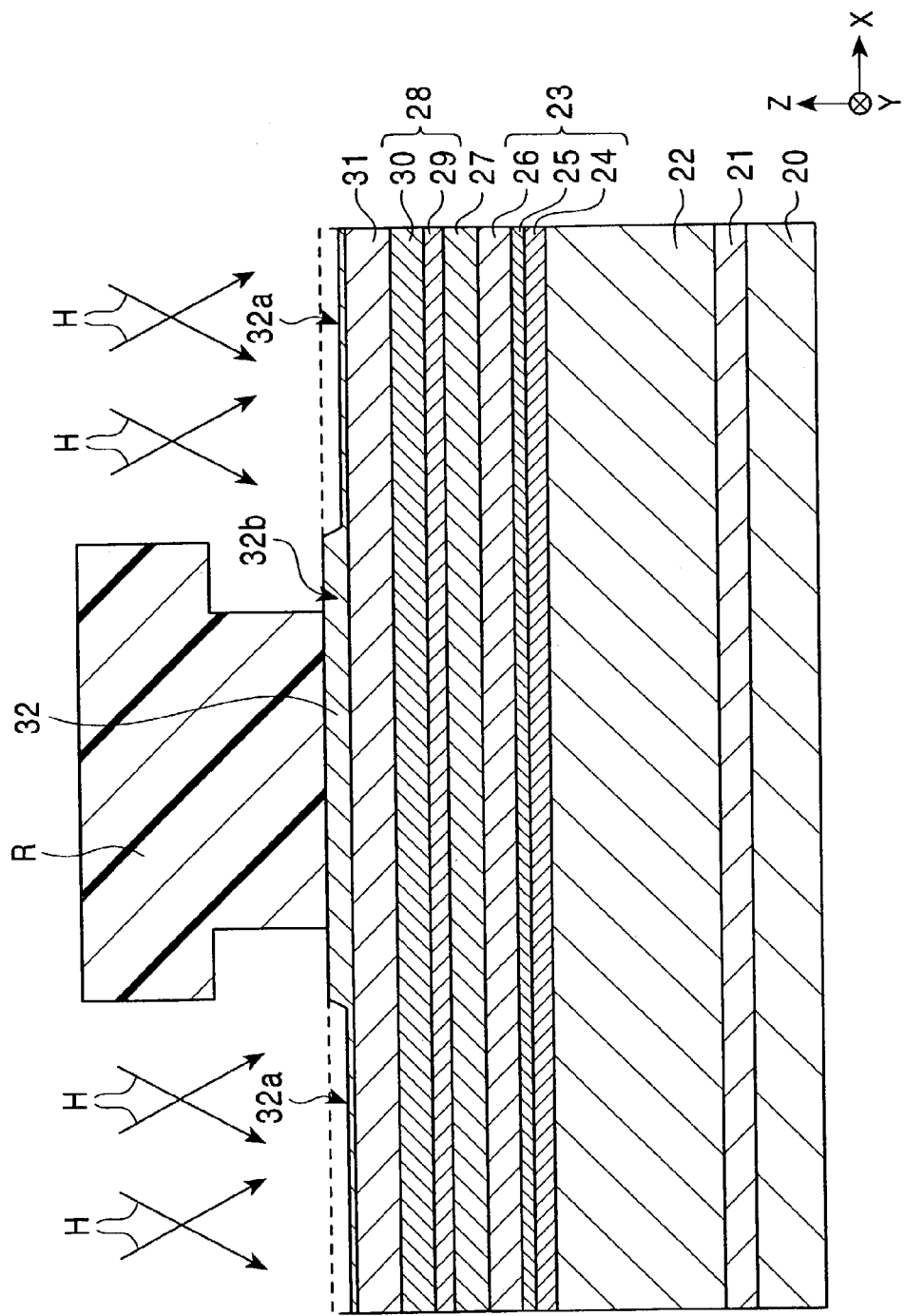
FIG. 19 shows a step following the step in FIG. 18.
Figure 20:
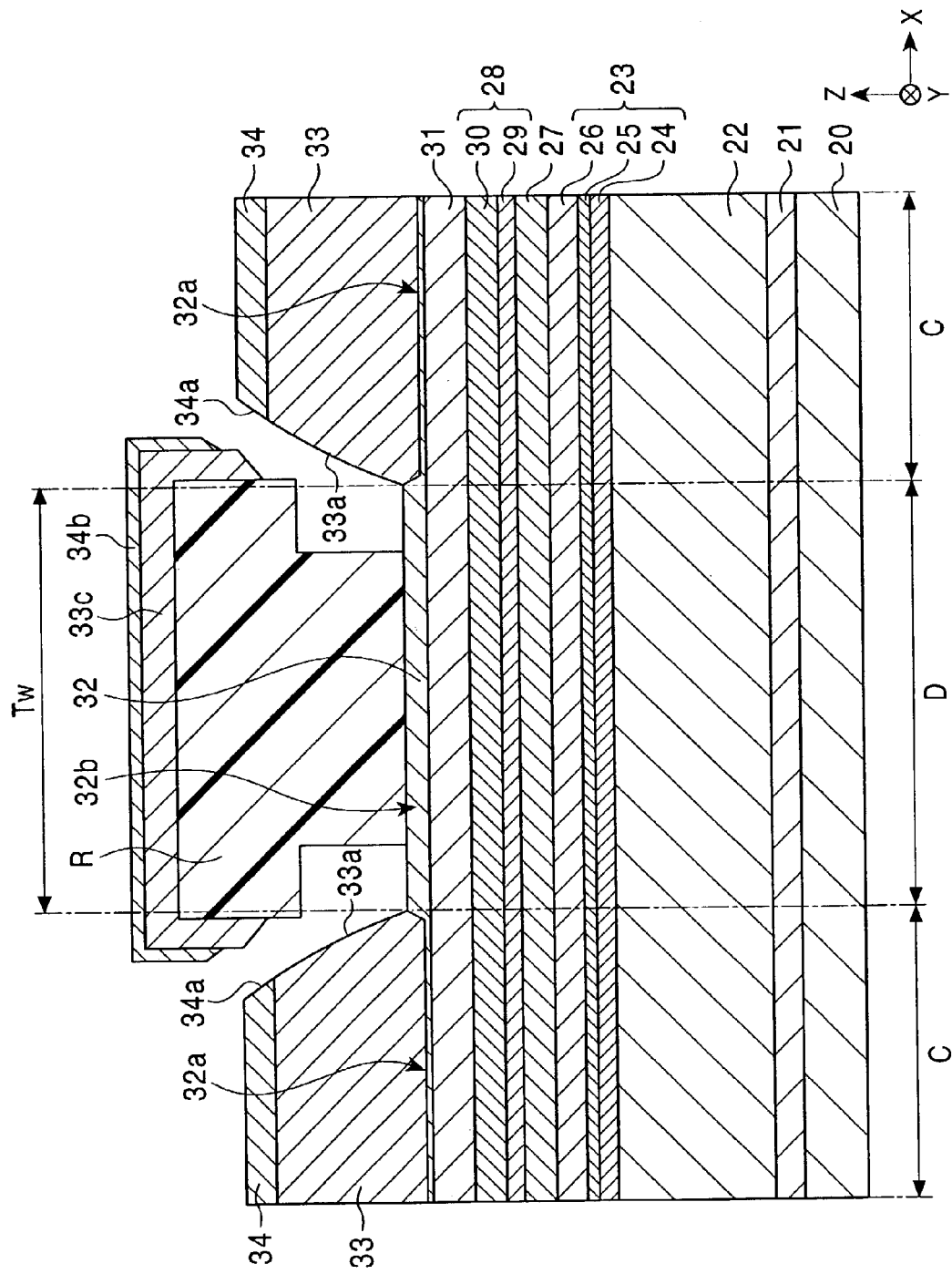
FIG. 20 shows a step following the step in FIG. 19.

FIGS. 18 to 20 show a series of manufacturing steps showing the method for manufacturing the magnetic sensing element shown in FIG. 1. Each step shown in FIGS. 18 to 20 is a partial cross section viewed from the opposed side face to a recording medium.

The seed layer 21, first antiferromagnetic layer 22, pinned magnetic layer 23, nonmagnetic material layer 27, free magnetic layer 28, third antiferromagnetic layer 31 and nonmagnetic layer 32 are continuously deposited on the substrate 20 in the step shown in FIG. 18. A sputtering method or vacuum deposition method is used for deposition. The pinned magnetic layer 23 shown in FIG. 18 has a laminated ferrimagnetic structure comprising the magnetic layers 24 and 26 formed of the CoFe alloy, and the nonmagnetic intermediate layer 25 such as a Ru layer interposing between the magnetic layers 24 and 26. The free magnetic layer 28 has a laminated structure comprising a diffusion preventive layer 29 such as the CoFe alloy layer, and the magnetic material layer 30 such as the NiFe alloy layer.

The first antiferromagnetic layer 22 and third antiferromagnetic layer 31 is preferably formed of the PtMn alloy, X—Mn alloy (X is any at least one element of Pd, Ir, Rh, Ru, Os, Ni and Fe), or Pt—Mn—X' alloy (X' is any at least one element of Pd, Ir, Rh, Ru, Au, Ag, Os, Cr, Ni, At, Ne, Xe and Kr) in the present invention.

Pt or X is preferably in the range of 37 to 73 at % in the alloy represented by the formula of PtMn or X—Mn. Pt or X is more preferably in the range of 47 to 57 at % in the alloy represented by the formula of PtMn or X—Mn. The range represented by "to" means the upper limit and lower limit, or "or less" or "or more", unless particularly specified.

The combined proportion of X and Pt is preferably in the range of 37 to 63 at % in the alloy represented by the formula of Pt—Mn—X'. The combined proportion of X and Pt is more preferably in the range of 47 to 57 at % in the alloy represented by the formula of Pt—Mn—X'. X' is preferably in the range of 0.2 to 10 at % in the alloy represented by the formula of Pt—Mn—X'. However, X' is preferably in the range of 0.2 to 40 at % when X' is any at least one element of Pd, Ir, Rh, Ru, Os, Ni and Fe.

The first antiferromagnetic later 22 is preferably formed with a thickness of 80 Å more and 300 Å or less. Forming the first antiferromagnetic later 22 with the thickness above permits a large exchange coupling magnetic field to be generated between the first antiferromagnetic layer 22 and pinned magnetic layer 23. Actually, an exchange coupling magnetic field of 48 kA/m or more, for example exceeding 64 kA/M, may be generated.

The third antiferromagnetic layer 31 is formed preferably with a thickness of 10 Å or more and 50 Å or less, more preferably 30 Å or more and 40 Å or less.

Forming the third antiferromagnetic layer 31 with a thickness as small as 50 Å or less allows the third antiferromagnetic layer 31 to have non-antiferromagnetic properties. Accordingly, since the third antiferromagnetic layer 31 is hardly transformed into an ordered structure, and a small exchange coupling magnetic field, if any, is generated between the third antiferromagnetic layer 31 and free magnetic layer 28, magnetization of the free magnetic layer 28 is not tightly fixed as in the pinned magnetic layer 23.

The third antiferromagnetic layer 31 is formed with a thickness of 10 Å or more, preferably 30 Å or more, because the side regions C of the third antiferromagnetic layer 31 hardly have antiferromagnetic properties even by forming the second antiferromagnetic layer 33 on the side regions of the third antiferromagnetic layer 31 in succeeding steps, and an exchange coupling magnetic field having a proper magnitude is not generated between the side regions C of the third antiferromagnetic layer 31 and both side regions C of the free magnetic layer 28, unless the third antiferromagnetic layer has a sufficient thickness, as described above.

The third antiferromagnetic layer 31 may be properly protected from being oxidized by exposing the laminate shown in FIG. 18 to the atmosphere, when the nonmagnetic layer 32 is formed on the third antiferromagnetic layer 31 as shown in the step in FIG. 18.

The nonmagnetic layer 32 should be a dense layer that is hardly oxidized by exposure to the atmosphere. The elements constituting the nonmagnetic layer 32 are required not to deteriorate the properties as the antiferromagnetic layer, even when the elements invaded into the third antiferromagnetic layer 31 by thermal diffusion.

The nonmagnetic layer 32 is preferably formed of at least one precious metal of Ru, Re, Pd, Os, Ir, Pt, Au and Rh.

The nonmagnetic layer 32 comprising the precious metals such as Ru is a dense layer hardly oxidized by exposure to the atmosphere. Accordingly, the third antiferromagnetic layer 31 may be properly protected from being oxidized by exposure to the atmosphere even when the nonmagnetic layer 32 is formed with a small thickness.

The nonmagnetic layer is preferably formed with a thickness as small as 3 Å or more and 10 Å or less in the present invention. Even with the nonmagnetic layer 32 being exceedingly thin, as described above, the third antiferromagnetic layer 31 is properly protected from being oxidized by exposure to the atmosphere.

Low energy ion milling is enabled in the step shown in FIG. 19 by forming the nonmagnetic layer 32 with a thickness so small as described above, and control of milling may be improved as compared with the prior art. This feature will be described in detail in the step shown in FIG. 19.

As shown in FIG. 18, each layer up to the nonmagnetic layer 32 is laminated on the substrate 20, and the laminate is annealed in a first magnetic field. The laminate is heat-treated at a first heat treatment temperature while applying the first magnetic field in the direction (Y-direction) perpendicular to the track width Tw direction (X-direction). An exchange coupling magnetic field is generated between the first antiferromagnetic layer 22 and the magnetic layer 24 constituting the pinned magnetic layer 23, and magnetization of the magnetic layer 24 is fixed in the Y-direction. Magnetization of the other magnetic layer 26 is fixed in a direction opposed to the Y-direction by an exchange coupling by RKKT interaction acting between the magnetic layers 24 and 26. For example, the first heat treatment temperature is 270° C., and the magnitude of the magnetic field is 800 kA/m.

A small exchange coupling magnetic field, if any, is generated between the third antiferromagnetic layer 31 and magnetic material 30 constituting the free magnetic layer 28 by annealing in the first magnetic field. This is because the third antiferromagnetic layer 31 is formed with a thickness as small as 50 Å or less, and has no antiferromagnetic properties.

Precious metal elements such as Ru constituting the nonmagnetic layer 32 are supposed to be diffused into the third antiferromagnetic layer 31 by annealing in the first magnetic field. Accordingly, the constituting elements in the vicinity of the surface of the third antiferromagnetic layer 31 after the heat treatment comprise the elements constituting the antiferromagnetic layer and precious metal elements. The content of the precious metal element diffused into the third antiferromagnetic layer 31 is larger at the surface side of the third antiferromagnetic layer 31 than at the lower face side of the third antiferromagnetic layer 31, and the composition ratio of the diffused precious metal elements is considered to be gradually decreased from the surface to the lower face of the third antiferromagnetic layer 31. Such gradient of the composition ratio can be confirmed by SIMS analyzer.

A resist layer is formed on the surface of the nonmagnetic layer 32 in the step shown in FIG. 19, and the resist layer R having the shape shown in FIG. 19 is left behind on the nonmagnetic layer 32 by exposure and development of the resist layer. This resist layer R is used, for example, as a lift-off resist layer.

A part of the side regions 32a of the nonmagnetic layer 32 not covered with the resist layer R is milled by ion-milling from the directions of the arrows H shown in FIG. 19 (the nonmagnetic layer 32 denoted by the dotted line in FIG. 19 is removed).

A part of the side regions 32a of the nonmagnetic layer 32 is milled because an antiferromagnetic interaction cannot be generated between the second antiferromagnetic layers 33, which are formed on the side regions 32a in the succeeding step, and both side regions C of the third antiferromagnetic layer 31 unless the side regions 32a are as thin as possible. The side regions C of the third antiferromagnetic layer 31 are not endowed with antiferromagnetic properties when the side regions 32a are not milled, thereby failing to tightly fix magnetization at both side regions of the free magnetic layer 28.

The thickness of each side region 32a of the nonmagnetic layer 32 is preferably reduced to 3 Å or less in the ion-milling step. Each side region 32a of the nonmagnetic layer 32 is thinned enough, as described above, to permit an antiferromagnetic interaction to be generated between each side region C of the third antiferromagnetic layer 31 and second antiferromagnetic layer 33, and each side region of the third antiferromagnetic layer 31 and second antiferromagnetic layer 33 can function as if they were an integrated antiferromagnetic layer. Consequently, each side region C of the third antiferromagnetic layer 31 can exhibit antiferromagnetic properties.

Low energy ion-milling is used in the milling step shown in FIG. 19, because the nonmagnetic layer 32 can be formed with a thickness of as small as 3 Å to 10 Å by ion-milling.

Figure 35:
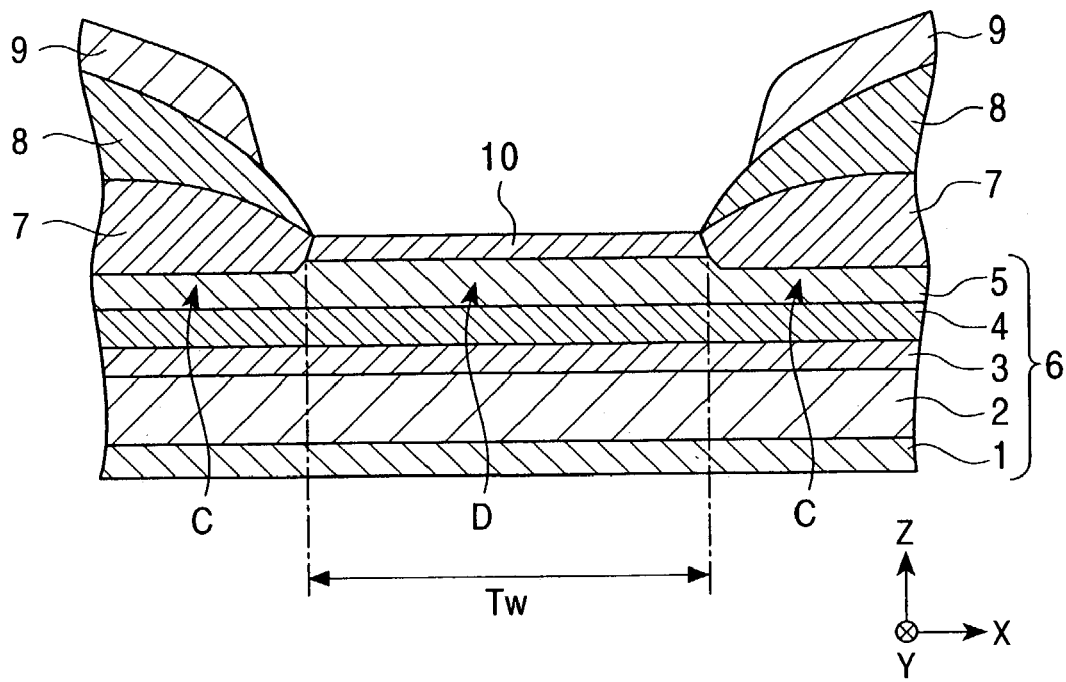
FIG. 35 shows a cross section of the conventional magnetic sensing element.
Figure 36:
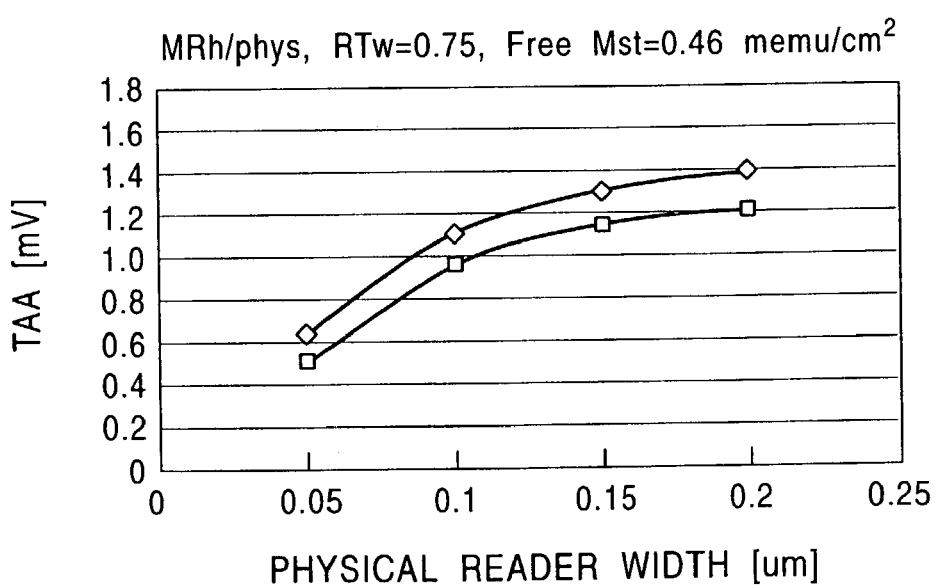
FIG. 36 is a graph showing the relation between the optical track width and the output of the sensed magnetic field in the conventional magnetic sensing element.

On the contrary, when a Ta layer 10 is used as in the conventional example shown in FIG. 35, the Ta layer itself is oxidized by exposure to the atmosphere. Accordingly, the layer under the Ta layer cannot be sufficiently protected from being oxidized unless the Ta layer has a thickness as large as 30 Å to 50 Å. In addition, the volume of the Ta layer 10 is increased by oxidation, and the Ta layer 10 is swelled to about 50 Å or more.

High energy ion-milling is necessary for removing the relatively thick Ta layer 10 described above. However, control of high energy ion-milling so that only the Ta layer 10 is removed is very difficult. The surface of the free magnetic layer 5 formed under the Ta layer is milled together with the Ta layer and the free magnetic layer 5 is damaged by ion-milling.

The nonmagnetic layer 32 formed of Ru with a thickness of as small as 3 Å to 10 Å is sufficient for protecting the third antiferromagnetic layer 31 from being oxidized in the present invention. Therefore, milling process can be easily controlled by using low energy ion-milling so as to stop ion-milling at the halfway of the nonmagnetic layer 32.

Low energy ion-milling may be used in the present invention as described above, and control of milling may be improved over the conventional process.

Low energy ion-milling is defined to be ion-milling using an ion beam with a beam voltage (acceleration voltage) of less than 1000 V, for example 100 to 500 V.

According to the experimental results to be described hereinafter, the milling time is in the range of 20 seconds to 40 seconds, and the milling angle is 30° to 70°, preferably 40° to 60°, inclined relative to the direction perpendicular to the surface of the substrate 20. It is confirmed that this milling process permits the antiferromagnetic interaction generated between the side regions C of the third antiferromagnetic layer 31 and second antiferromagnetic layer 33 formed thereon to be enhanced, and that the exchange coupling magnetic field generated between the side regions C of the third antiferromagnetic layer 31 and both side regions C of the free magnetic layer 28 is also enhanced.

Then, the step in FIG. 20 is applied. The second antiferromagnetic layers 33 and electrode layers 34 are continuously deposited on the side regions 32a of the nonmagnetic layer 32 in the step in FIG. 20. Sputtering or vacuum deposition is used for deposition. Inclined or curved faces are formed on the inner side regions 33a of the second antiferromagnetic layers 33 and inner side regions 34a of the electrode layers 34 so that the distance between the second antiferromagnetic layers 33 is expanded from the bottom face to the upper face (Z-direction).

The track width Tw is defined by the distance between the lower faces of the second antiferromagnetic layers 33.

The material used for the second antiferromagnetic layer 33 is preferably the same as the material used for the third antiferromagnetic layer 31.

The thickness of the second antiferromagnetic layer 33 is preferably adjusted so that the total thickness as a sum of the thickness of the second antiferromagnetic layer 33 and the thickness of each side region of the third antiferromagnetic layer 31 formed under the second antiferromagnetic layer is 80 Å or more and 300 Å or less in the step shown in FIG. 20.

Each side region C of the third antiferromagnetic layer 31 has antiferromagnetic properties, when the total thickness as a sum of the thickness of the second antiferromagnetic layer 33 and the thickness of each side region of the third antiferromagnetic layer 31 formed under the second antiferromagnetic layer is 80 Å or more and 300 Å or less.

As shown in FIG. 20, the resist layer R, on which a layer 33c of the antiferromagnetic material comprising the elements constituting the second antiferromagnetic layer 33 and a layer 34b of the electrode material comprising the elements constituting the electrode layer 34 are adhered, is removed by lift-off etching.

Then, annealing in the second magnetic field is applied. The direction of the magnetic field is in the track width direction (X-direction). The magnitude of the second magnetic field is adjusted to be smaller than the exchange anisotropic magnetic field of the first antiferromagnetic layer 22, and the heat treatment temperature is adjusted to be lower than the blocking temperature of the second antiferromagnetic layer 22 in the annealing step in the second magnetic field. The magnitude of the second magnetic field is preferably larger than the saturation magnetic field and demagnetization magnetic field of the free magnetic layer 28, because the exchange anisotropic magnetic field of the third antiferromagnetic layer 31 can be aligned in the track width direction (X-direction) while the exchange anisotropic magnetic field of the first antiferromagnetic layer 22 is aligned in the height direction (Y-direction). The second heat treatment temperature is, for example, 250° C., and the magnitude of the magnetic field is 24 kA/m.

The antiferromagnetic interaction between each side region C of the third antiferromagnetic layer 31 and second antiferromagnetic layer 33 is enhanced, by forming the second antiferromagnetic layer 33 on each side region C of the third antiferromagnetic layer 31 with interposition of the nonmagnetic layer 32. Each side region C of the third antiferromagnetic layer 31 that has no antiferromagnetic properties by itself has antiferromagnetic properties by forming the second antiferromagnetic layer as described above.

Accordingly, each side region C of the third antiferromagnetic layer 31 is transformed into an ordered structure by annealing in the second magnetic field, and a proper magnitude of the exchange coupling magnetic field is generated between each side region C of the third antiferromagnetic layer 31 and each region C of the free magnetic layer 28. Consequently, magnetization of each side region of the free magnetic layer 28 is fixed in the track width direction (X-direction).

On the other hand, a small exchange magnetic field, if any, is generated between the third antiferromagnetic layer 31 formed on the central region D of the free magnetic layer 28 and the central region D of the free magnetic layer 28, and magnetization of the central region of the free magnetic layer 28 is not tightly fixed in the track width direction as each side region C is.

Magnetization of the central region of the free magnetic layer 28 is weakly put into a single magnetic domain state to an extent capable of magnetic inversion against the external magnetic field.

The direction of magnetization at the central region D of the free magnetic layer 28 can be rapidly and readily changed by the external magnetic field (signal recording magnetic field) even at near the side regions C in this embodiment, by forming the magnetic material layer 30 with the NiFe layer, NiFeX layer, amorphous Co alloy layer or CoFeX layer that are magnetic materials having small exchange stiffness constants A.

Consequently, the width of the central region D of the free magnetic layer 28 of the magnetic sensing element shown in FIG. 1 (the width capable of easy inversion of magnetization) is approximately equal to the optical track width O-Tw, and a high output of the sensed magnetic field can be maintained even when the magnetic sensing element has a narrow track width.

The precious metal elements such as Ru constituting the nonmagnetic layer 32 are considered to be diffused into the third and second antiferromagnetic layers 31 and 33 by annealing in the second magnetic field. Therefore, the constituting elements in the third and second antiferromagnetic layers 31 and 33 comprise the elements constituting the antiferromagnetic layers and precious metal elements after the heat treatment. The content of the precious metal elements diffused into the third and second antiferromagnetic layers 31 and 33 is larger at the surface side of the third antiferromagnetic layer 31 than at the lower face side of the third antiferromagnetic layer 31, and is larger at the lower face side of the second antiferromagnetic layer 33 than at the surface side of the second antiferromagnetic layer 33. The composition ratio of the diffused precious metals is considered to be gradually reduced from the surface to the lower face of the third antiferromagnetic layer 31, and from the lower face to the surface of the second antiferromagnetic layer 33. Such gradient of the composition can be confirmed with a SIMS analyzer.

According to the manufacturing method of the present invention, magnetization of the free magnetic layer 28 can be more properly controlled than in the conventional method, and a magnetic sensing element excellent in regenerative sensitivity may be formed even when the sensing element has a narrow track width.

The magnetic sensing element shown in FIG. 1 can be manufactured by the manufacturing steps as described above.

While the magnetic sensing element shown in FIG. 3 is manufactured by the steps shown in FIGS. 18 to 20, each side region 32a of the nonmagnetic layer 32 formed of Ru and the like are completely removed in the ion milling step in FIG. 19. Since the nonmagnetic layer 32 is very thin in the deposition step, the nonmagnetic layer 32 can be milled using low energy ion-milling. Since the milling rate using low energy ion-milling is slower than the milling rate using high energy ion-milling, milling can be readily stopped at a time when just the side regions 32a of the nonmagnetic layer 32 have been removed. This means that control of milling becomes easier in this method than in the conventional method, and the surface of the third antiferromagnetic layer 31 exposed by removing the nonmagnetic layer 32 is less affected by ion-milling.

Accordingly, it is easy to control the milling step so that only each side region 32a of the nonmagnetic layer 32 is milled by ion-milling, and the third antiferromagnetic layer 31 under the nonmagnetic layer is not milled. The surface of the third antiferromagnetic layer 31 is never damaged by milling so long as the third antiferromagnetic layer 31 is not milled, and the third antiferromagnetic layer 31 can maintain good magnetic properties.

When the surface of the third antiferromagnetic layer 31 is slightly milled as shown by the dotted line E in FIG. 3, the surface of the third antiferromagnetic layer 31 is not so damaged by ion-milling because low energy ion-milling is used. Accordingly, each side region C of the third antiferromagnetic layer 31 and the second antiferromagnetic layer 33 can function as if they were an integrated antiferromagnetic layer by forming the second antiferromagnetic layer 33 on each side region C of the third antiferromagnetic layer 31 in the step shown in FIG. 20, and each side regions C of the third antiferromagnetic layer 31 is able to have antiferromagnetic properties. Consequently, each side region C of the third antiferromagnetic layer 31 can be transformed into an ordered structure, an exchange coupling magnetic field can be generated between each side region C of the third antiferromagnetic layer 31 and free magnetic layer 28, and magnetization at each side region C of the free magnetic layer 28 can be properly fixed in the track width direction (X-direction).

The magnetic sensing element shown in FIG. 4 can be manufactured by forming the resist R in the step shown in FIG. 19 after applying the steps shown in FIG. 18, followed by applying the step shown in FIG. 20. No ion-milling step is applied in the step shown in FIG. 19.

The nonmagnetic layer 32 has been already formed with a thickness as small as 3 Å or less in the step shown in FIG. 18 in the method for manufacturing the magnetic sensing element shown in FIG. 4. Or, the entire surface of the nonmagnetic layer 32 is adjusted to have a thickness of 3 Å or less in the step shown in FIG. 18, after forming the nonmagnetic layer 32 with a thickness of 3 Å to 10 Å.

The thickness of the nonmagnetic layer 32 of as small as 3 Å or less permits an antiferromagnetic interaction to be generated between each side region C of the third antiferromagnetic layer 31 and second antiferromagnetic layer 33 formed thereon with interposition of the nonmagnetic layer 32. Accordingly, it is not required to thin each side region 32a of the nonmagnetic layer 32 by applying ion-milling again in the step shown in FIG. 19, or to completely remove each side region 32a.

The nonmagnetic layer 32 having the same thickness at the central region 32b and each side region 32a may be left behind on the third antiferromagnetic layer 31 as shown FIG. 3 by the manufacturing method as described above.

While the methods for manufacturing the CIP magnetic sensing elements shown in FIGS. 1, 3 and 4 have been described above, the method for manufacturing the CCP magnetic sensing element shown in FIG. 8, particularly the steps different from the steps in the method for manufacturing the magnetic sensing element in FIG. 1, will be described in detail hereinafter.

Figure 21:
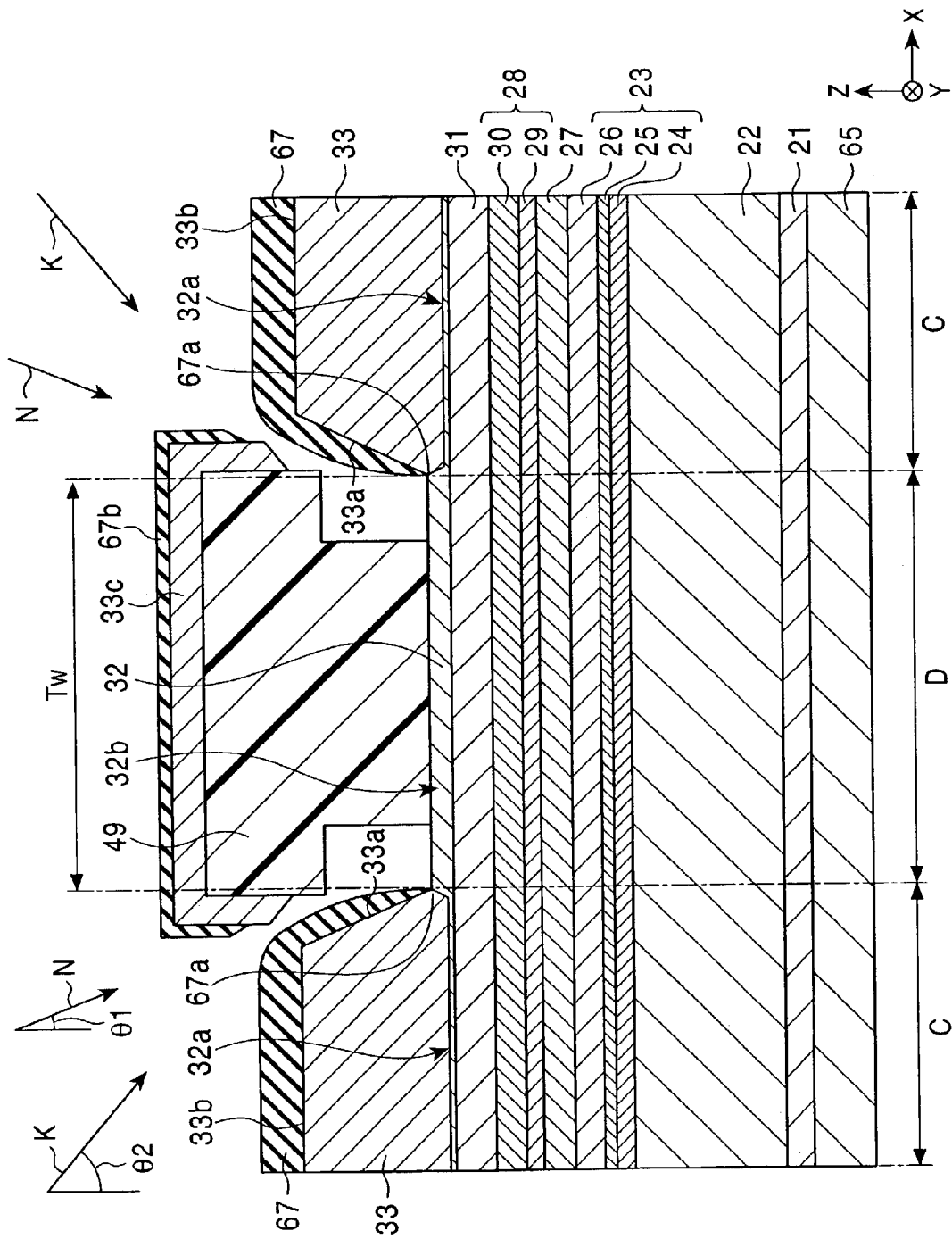
FIG. 21 shows a step of the manufacturing process of the magnetic sensing element shown in the embodiment in FIG. 8.

The steps shown in FIGS. 18 and 19 are applied at first in the method for manufacturing the magnetic sensing element shown in FIG. 8. Then, in the step shown in FIG. 21, the second antiferromagnetic layer 33 is deposited on each side region 32a of the nonmagnetic layer 32 by sputtering from the direction indicated by the arrows N at a sputtering angle of θ1 (the inclined angle to the Z-direction). Subsequently, the insulation layer 67 is deposited from on the surface 33b through the inner side region 33a of the second antiferromagnetic layer 33 from the direction indicated by the arrows K at a sputtering angle of θ$_2$ (the inclined angle to the Z-direction).

While θ1 and θ2 may be the same angle, θ1 is preferably smaller than θ2 (or θ1 is less inclined than θ2). As a result, the inner side region 67a of the insulation layer 67 is more readily formed to both side regions at the central region 32b of the nonmagnetic layer 32. The sputtering angles θ1 and θ2 are preferably inclined with an angle to a certain extent to the Z-axis.

Figure 22:
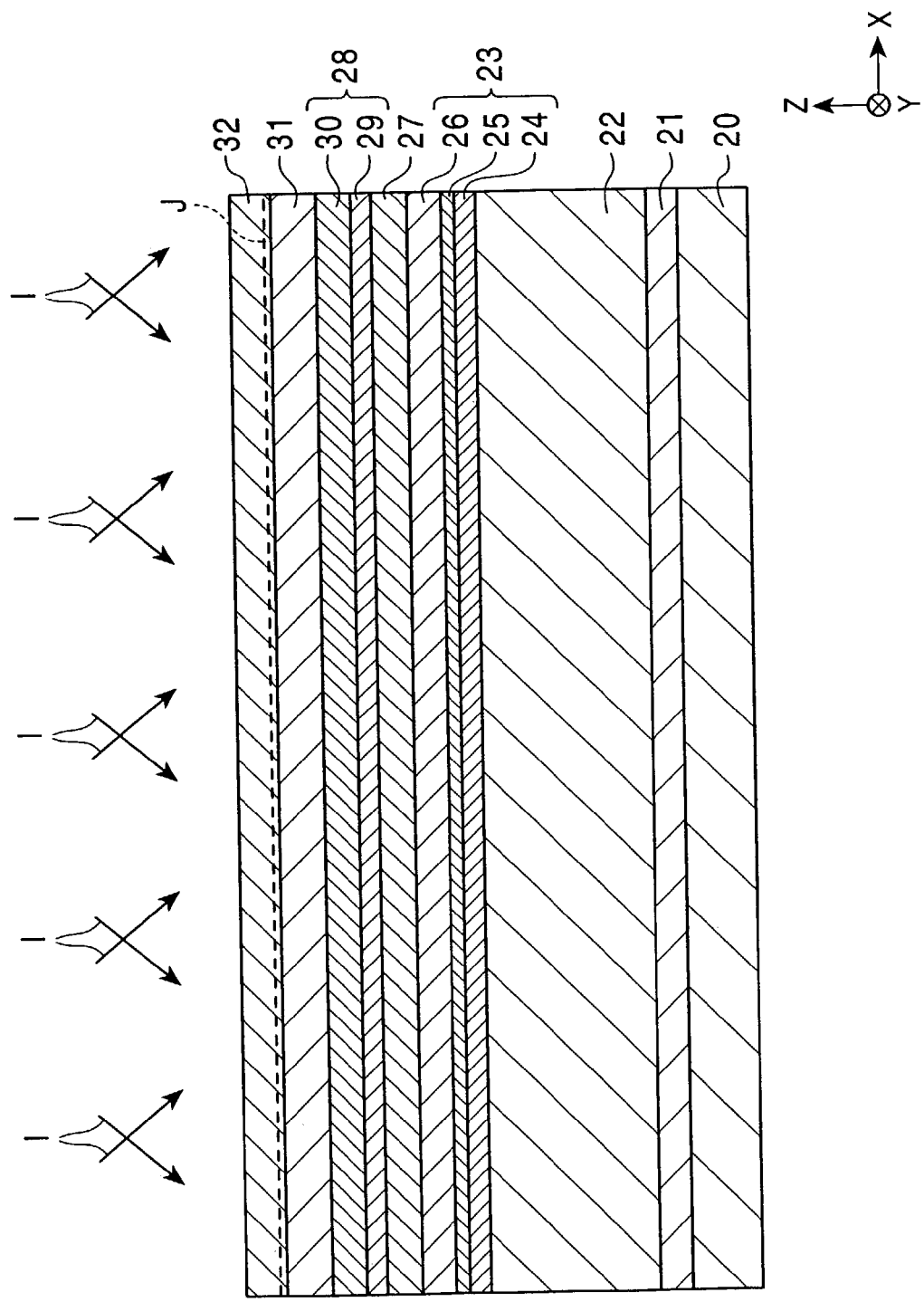
FIG. 22 shows a step of the manufacturing process of the magnetic sensing element shown in the embodiment in FIG. 5.
Figure 23:
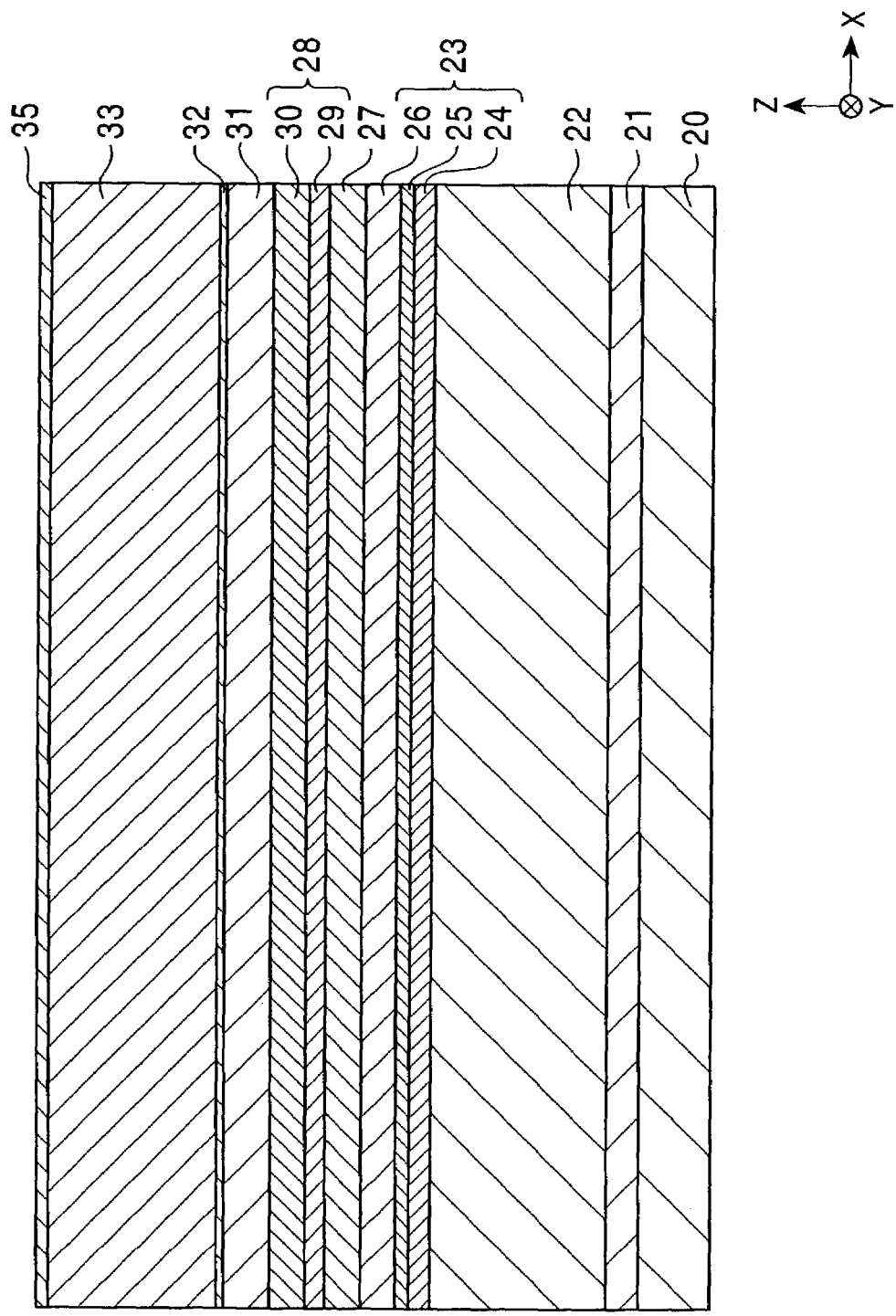
FIG. 23 shows a step following the step in FIG. 22.
Figure 24:
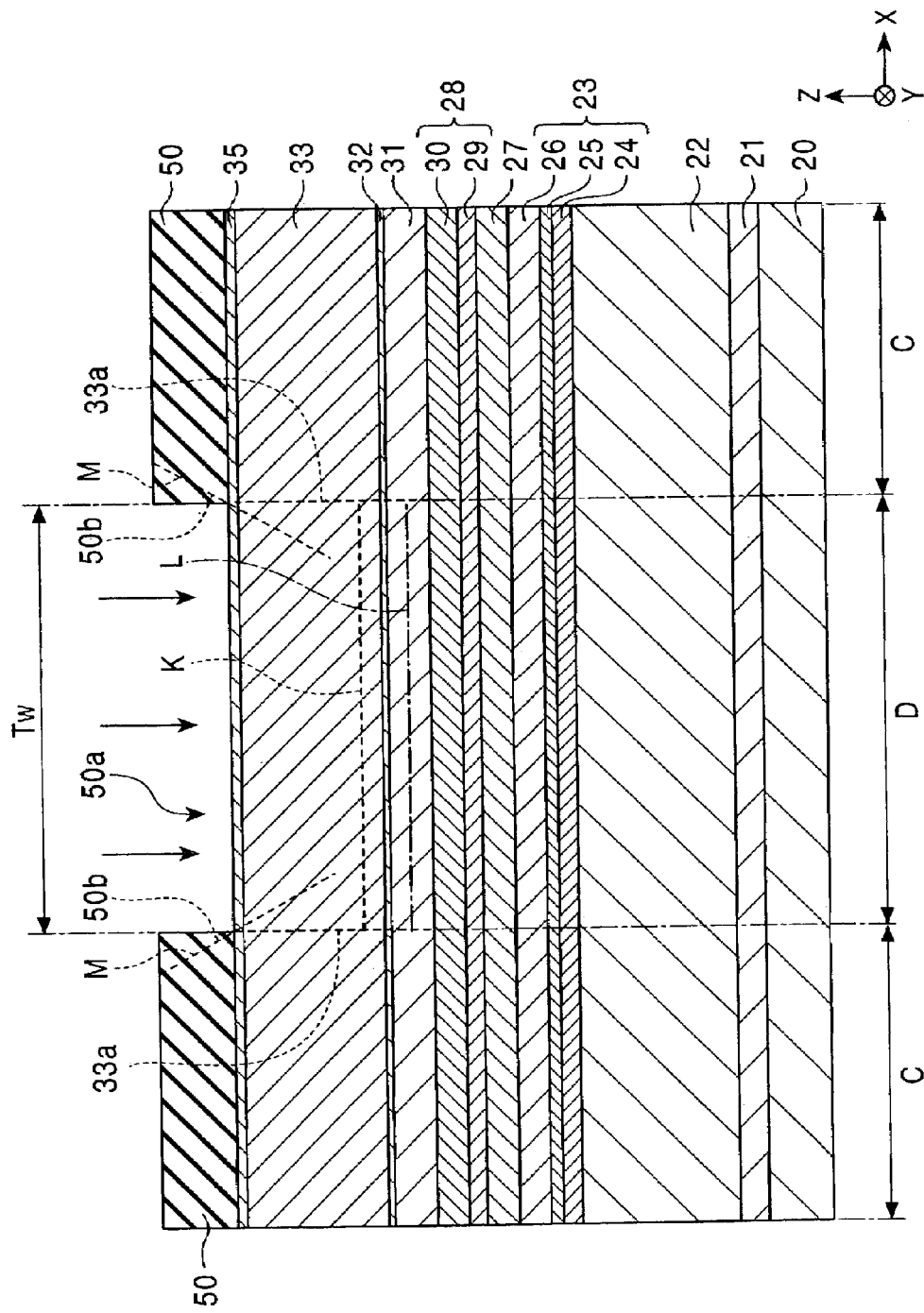
FIG. 24 shows a step following the step in FIG. 23.

FIGS. 22 to 24 show manufacturing steps of a method for manufacturing the magnetic sensing element in FIG. 5. Each drawing corresponds to a partial cross section viewed from the opposed side face to a recording medium.

In the step shown in FIG. 22, the seed layer 21, first antiferromagnetic layer 22, pinned magnetic layer 23, nonmagnetic material layer 27, free magnetic layer 28, third antiferromagnetic layer 31 and nonmagnetic layer 32 are continuously deposited on the substrate 20. The layers are deposited by sputtering or vacuum deposition. The material and thickness of each layer of the seed layer 21, first antiferromagnetic layer 22, pinned magnetic layer 23, nonmagnetic material layer 27, free magnetic layer 28, third antiferromagnetic layer 31 and nonmagnetic layer 32 are the same as those in FIG. 18.

The third antiferromagnetic layer 31 is preferably formed with a thickness of 10 Å or more and 50 Å or less, preferably 30 Å or more and 40 Å or less in the present invention.

Forming the third antiferromagnetic layer 31 with a thickness as small as 50 Å or less permits the third antiferromagnetic layer 31 to exhibit no antiferromagnetic properties; the third antiferromagnetic layer 31 to be hardly transformed into an ordered structure even by annealing in a magnetic field; and a small exchange coupling magnetic field, if any, to be generated between the third antiferromagnetic layer 31 and free magnetic layer 28. Consequently, magnetization of the free magnetic layer 28 is not tightly fixed as the pinned magnetic layer 23 is.

The third antiferromagnetic layer 31 is formed with a thickness of 10 Å or more, preferably 30 Å or more. This is because the each side region C of the third antiferromagnetic layer 31 hardly exhibits antiferromagnetic properties even by forming the second antiferromagnetic layer 33 on each side region of the third antiferromagnetic layer 31 in the succeeding step, and a proper magnitude of the exchange coupling magnetic field is not generated between each side region C of the third antiferromagnetic layer 31 and each side region C of the free magnetic layer 28, unless the third antiferromagnetic layer is formed with the thickness as described above.

Forming the nonmagnetic layer 32 on the third antiferromagnetic layer 31 as in the step in FIG. 22 permits the third antiferromagnetic layer 31 to be properly protected from being oxidized even when the multilayer shown in FIG. 22 is exposed to the atmosphere.

The nonmagnetic layer 32 should be a dense layer that is hardly oxidized by exposure to the atmosphere. The nonmagnetic layer 32 is also required to be made of a material that does not deteriorate the antiferromagnetic properties of the third antiferromagnetic layer 31 even when the material diffuses into the third antiferromagnetic layer.

The nonmagnetic layer 32 is preferably formed of any at least one precious metal of Ru, Re, Pd, Os and Ir.

The nonmagnetic layer 32 comprising a precious metal such as Ru is a dense layer that is hardly oxidized by exposure to the atmosphere. Accordingly, the third antiferromagnetic layer 31 can be properly protected from being oxidized by exposure to the atmosphere even when the thickness of the nonmagnetic layer 32 is small.

The nonmagnetic layer 32 is preferably formed with a thickness of 3 Å or more and 10 Å or less. The third antiferromagnetic layer 31 can be properly protected from being oxidized by exposure to the atmosphere with such small thickness of the nonmagnetic layer 32 as described above.

Such small thickness of the nonmagnetic layer 32 permits ion-milling in the next step to be properly and easily applied.

After laminating each layer up to the nonmagnetic layer 32 on the substrate 20 as shown in FIG. 22, the laminate is annealed in a first magnetic field. The laminate is heat treated at a first heat treatment temperature while alloying the first magnetic field in a direction (Y-direction) perpendicular to the track width direction (X-direction). Magnetization of the magnetic layer 24 is fixed in the Y-direction by generating an exchange coupling magnetic field between the first antiferromagnetic layer 22 and the magnetic layer 24 constituting the pinned magnetic layer 24. Magnetization of another magnetic layer 26 is fixed in an opposite direction to the Y-direction by an exchange coupling by a RKKY interaction between the magnetic layers 24 and 26. The first heat treatment temperature is, for example, 270° C., and the magnitude of the magnetic field is 800 kA/m.

The third antiferromagnetic layer 31 is hardly transformed into an ordered structure by annealing in the magnetic field due to its small thickness as described above. No exchange coupling magnetic field is generated between the third antiferromagnetic layer 31 and the material layer 30 constituting the free magnetic layer 28, because the third antiferromagnetic layer 31 is formed with a thickness as small as 50 Å or less, thereby failing to exhibit antiferromagnetic properties.

Precious metal elements such as Ru constituting the nonmagnetic layer 32 are considered to be diffused into the third antiferromagnetic layer 31 by annealing in the first magnetic field. Accordingly, the constituting elements in the third antiferromagnetic layer 31 after the heat treatment comprise the elements constituting the antiferromagnetic layer and precious metal elements. The content of the precious metal elements diffused into the third antiferromagnetic layer 31 is larger at the surface side of the antiferromagnetic layer 31 than at the lower face side of the antiferromagnetic layer 31, and the composition ratio of the diffused precious metal elements is considered to be gradually reduced from the surface to the lower face of the third antiferromagnetic layer 31. Such gradient of the composition may be confirmed with a SIMS analyzer.

The entire surface of the nonmagnetic layer 32 is ion-milled in the step in FIG. 22, and the nonmagnetic layer 32 is milled to the level indicated by the dotted line J.

A part of the nonmagnetic layer 32 is milled as described above because, an antiferromagnetic interaction is not generated between the second antiferromagnetic layers 33 formed on the side regions 32a of the nonmagnetic layer 32 and each side region C of the third antiferromagnetic layer 31 unless the nonmagnetic layer 32 is formed with a thickness as small as possible, and magnetization of the free magnetic layer 28 cannot be properly controlled.

The thickness of the nonmagnetic layer 32 is preferably adjusted to 0.2 Å (mean value) or more and 3 Å or less in the milling step in the present invention. Reducing the thickness of the side regions 32a of the nonmagnetic layer 32 permits an antiferromagnetic interaction to be generated between each side region C of the third antiferromagnetic layer 31 and second antiferrornagnetic layer 33, and each side region C of the third antiferromagnetic layer 31 and the second antiferromagnetic layer 33 can function as if they were an integrated antiferromagnetic layer. Consequently, the side regions C of the third antiferromagnetic layer 31 can exhibit antiferromagnetic properties.

Low energy ion-milling may be used in the ion-milling step shown in FIG. 22, since the nonmagnetic layer 32 is formed with a thickness as small as 3 Å to 10 Å in the deposition step. Accordingly, ion-milling can be readily stopped at the halfway of the nonmagnetic layer 32 by using low energy ion-milling, thereby enabling the accuracy of ion-milling to be more improved over the conventional method.

Low energy ion-milling is defined to be a ion-milling process using a beam voltage (beam acceleration voltage) of less than 1000 V, for example 100 to 500 V.

The second antiferromagnetic layer 33 is deposited on the nonmagnetic layer 32 in the next step shown in FIG. 23, and an intermediate layer (protective layer) comprising Ta is successively deposited on the second antiferromagnetic layer 33. The intermediate layer 35 is provided in order to protect the second antiferromagnetic layer 33 from being oxidized by exposure to the atmosphere.

The second antiferromagnetic layer 33 is preferably formed of the same material as the third antiferromagnetic layer 31.

It is preferable to adjust the thickness of the second antiferromagnetic layer 33 so that the total thickness as a sum of the thickness of the second antiferromagnetic layer 33 and the thickness of the third antiferromagnetic layer 31, formed under the second antiferromagnetic layer with interposition of the nonmagnetic layer 32, is as large as 80 Å or more and 300 Å or less.

The third antiferromagnetic layer 31 that does not exhibit antiferromagnetic properties by itself has antiferromagnetic properties, when the total thickness as a sum of the thickness of the third antiferromagnetic layer 31 and the thickness of the second antiferromagnetic layer 33 is as large as 80 Å or more and 300 Å or less.

In the step shown in FIG. 24, a mask layer 50 formed of, for example, an inorganic material with a given gap 50a apart in the track width direction (X-direction) is formed on the intermediate layer 35. The inorganic material may be selected from Ta, Ti, Si, Zr, Nb, Mo, Hf, W, Al—O, Al—Si—O and Si—O. The mask layer 50 can function as an electrode layer by leaving it behind after the manufacturing process, when the mask layer 50 is formed of a metallic material.

For forming the mask layer 50, a resist layer (not shown) is stood on the central region of the intermediate layer 35, for example, and a given gap 50a is formed in the mask layer 50. Or, the resist layer (not shown) is overlapped on the mask layer 50 after forming the mask layer 50 on the entire surface of the intermediate layer 35. Then, the mask layer 50 exposed in a hollow portion is milled by RIE after forming the hollow portion by exposure and development at the central region of the resist layer, thereby forming a given gap 50a in the mask layer 50.

The mask later 50 may be formed of a resist in the present invention.

The intermediate layer 35 exposed in the gap 50a of the mask layer 50 is milled by RIE or ion-milling in the step shown in FIG. 24 with additional milling of the second antiferromagnetic layer 33 under the intermediate layer 35 to the position indicated by the dotted line K. It is preferable herein to mill the second antiferromagnetic layer 33 until the total thickness as a sum of the thickness of the second antiferromagnetic layer 33 and the thickness of the third antiferromagnetic layer 31 under the dotted line K becomes 50 Å or less, more preferably 40 Å or less. This is because, when the thickness is larger than the thickness as described above, the central region D of the third antiferromagnetic layer 31 retains antiferromagnetic properties, an exchange coupling magnetic field is generated between the central region D of the third antiferromagnetic layer 31 and central region of the free magnetic layer 28, and magnetization of the free magnetic layer 28 is tightly fixed.

The magnetic sensing element shown in FIG. 6 is manufactured by milling the second antiferromagnetic layer 33 to the halfway thereof as shown by the dotted line K in FIG. 24, and by leaving the second antiferromagnetic layer 33 on the central region D of the free magnetic layer 28.

Otherwise, the second antiferromagnetic layer 33 exposed in the gap 50a of the mask layer 50 may be completely removed to expose the nonmagnetic layer 32 in the gap 50a. The nonmagnetic layer 32 may be milled to its halfway. The magnetic sensing element shown in FIG. 5 is formed by stopping milling when the nonmagnetic layer 32 is exposed in the gap 50a.

The magnetic sensing element shown in FIG. 7 is formed by stopping milling after completely milling the nonmagnetic layer 32, and by removing the third antiferromagnetic layer 31 formed under the nonmagnetic layer to the dotted broken line.

As shown in FIG. 24, since the second antiferromagnetic layer 33 is milled in the direction perpendicular to the surface of the substrate 20, the inner side regions 33a of the second antiferromagnetic layer 33 are formed in the direction (Z-direction) perpendicular to the surface of the substrate 20. Naturally, the inner side face of each layer after milling is formed in the direction perpendicular to the surface of the substrate 20, when milling is applied up to the layers formed under the second antiferromagnetic layer 33.

The second antiferromagnetic layer 33 has an opening on its surface 33a, and a concave region 75 having a width equal to the optical track width is formed.

When the inner side regions 50b of the mask layer 50 are formed as inclined or curved faces having a gap 50a gradually expanding from the bottom face to the top face as shown by the dotted line M in FIG. 24, or when the incident angle of ion-milling or reactive etching particles is inclined to the surface of the substrate, the inner side regions of the second antiferromagnetic layer 33 are also formed as inclined or curved faces.

The width of the gap 50a formed by milling in the track width direction (X-direction) becomes narrower toward the lower face, when the inner side regions 33a of the second antiferromagnetic layer 33 are formed as the inclined or curved surfaces. Consequently, the track width Tw can be more smaller than the width of the gap 50a of the mask layer 50, and a magnetic sensing element having a narrow track width can be manufactured.

Although the depth of milling is arbitrary, it is crucial not to leave an antiferromagnetic layer with a certain thickness behind to an extent that gives at least no antiferromagnetic properties to the central region D of the free magnetic layer 28, and to prevent the free magnetic layer 28 from being milled by RIE or ion-milling. It is not preferable to mill the free magnetic layer 28 by ion-milling, since the free magnetic layer 28 is damaged by milling and magnetic properties are liable to be deteriorated as in the conventional art.

After completing the RIE or ion-milling step, the laminate is annealed in the second magnetic field. The direction of the magnetic field is in the track width direction (X-direction). The magnitude of the second magnetic field applied for annealing in the second magnetic field is smaller than the magnitude of the exchange anisotropic magnetic field of the first antiferromagnetic layer 22, and the heat treatment temperature is lower than the blocking temperature of the first antiferromagnetic layer 22. It is more preferable that the magnitude of the second magnetic field is larger than the saturation magnetic field and demagnetization magnetic field of the free magnetic layer 28, because the exchange anisotropic magnetic field of the side regions of the third antiferromagnetic layer 31 can be directed in the track width direction (X-direction) while directing the exchange anisotropic magnetic field of the first antiferromagnetic layer 22 in the height direction (Y-direction). The second heat treatment temperature is, for example, 250° C., and the magnitude of the magnetic field is 24 kA/m.

Since the side regions C of the third antiferromagnetic layer 31 have antiferromagnetic properties by an antiferromagnetic interaction generated between the third antiferromagnetic layer and second antiferromagnetic layer 33 formed thereon, each side region C of the third antiferromagnetic layer 31 is transformed into an ordered structure by annealing in the second magnetic field, and a large exchange anisotropic magnetic field is generated between each side region C of the third antiferromagnetic layer 31 and each side region C of the free magnetic layer 28. Consequently, magnetization of the side regions C of the free magnetic layer 28 is fixed in the track width direction (X-direction).

On the other hand, only an antiferromagnetic layer with a thickness to an extent not exhibiting antiferromagnetic properties is formed on the central region D of the free magnetic layer 28, the central region D of the third antiferromagnetic layer 31 formed on the central region D of the free magnetic layer 28 is not transformed into an ordered structure, and a small exchange coupling magnetic field, if any, is generated between the central region D of the third antiferromagnetic layer 31 and central region D of the free magnetic layer 28. As a result, magnetization of the central region of the free magnetic layer 28 is not tightly fixed in the track width direction as are the side regions C.

The magnetization of the central region D of the free magnetic layer 28 is weakly put into a single magnetic domain state to an extent capable of magnetic inversion against the external magnetic field.

The direction of magnetization at the central region D of the free magnetic layer 28 can be rapidly and readily changed by the external magnetic field (signal recording magnetic field) even at near each side region C in this embodiment, by forming the magnetic material layer 30 with the NiFe layer, NiFeX layer, amorphous Co alloy layer or CoFeX layer that are magnetic materials having small exchange stiffness constants A.

Consequently, the width of the central region D of the free magnetic layer 28 of the magnetic sensing element shown in FIG. 5 (the width capable of easy inversion of magnetization) is approximately equal to the optical track width O-Tw, and a high output of the sensed magnetic field can be maintained even when the magnetic sensing element has a narrow track width.

Magnetization of the free magnetic layer 28 can be more properly controlled in the present invention as compared with the conventional art, and a magnetic sensing element having excellent sensitivity can be manufactured even when the element has a narrow track width.

Precious metal elements such as Ru constituting the nonmagnetic layer 32 are considered to be diffused into the third antiferromagnetic layer 31 and second antiferromagnetic layer 33 by annealing in the second magnetic field. Accordingly, the constituting elements in the third antiferromagnetic layer 31 and second antiferromagnetic layer 33 after the heat treatment comprise the elements constituting the antiferromagnetic layers and precious metal elements. The contents of the precious metal elements diffused into the third antiferromagnetic layer 31 and second antiferromagnetic layer 31 are larger at the surface side of the antiferromagnetic layer 31 than at the lower face side of the antiferromagnetic layer 31, and larger at the lower face side of the second antiferromagnetic layer 33 than at the surface side thereof The composition ratio of the diffused precious metal elements is considered to be gradually reduced from the surface to the lower face of the third antiferromagnetic layer 31, and from the lower face to the surface of the second antiferromagnetic layer 33. Such gradient of the composition may be confirmed with a SIMS analyzer.

Annealing in the second magnetic field may be applied after the step in FIG. 20, or after depositing the second antiferromagnetic layer 33 and intermediate layer 35 on the nonmagnetic layer 32. Since the third antiferromagnetic layer 31 exhibits antiferromagnetic properties by forming the second antiferromagnetic layer 33 thereon, the third antiferromagnetic layer 31 is transformed into an ordered structure by annealing in the second magnetic field, a large exchange coupling magnetic field is generated between the third antiferromagnetic layer 31 and free magnetic layer 28, and magnetization of the entire free magnetic layer 28 is readily fixed in the track width direction. However, the exchange coupling magnetic field generated between the free magnetic layer and the antiferromagnetic layer formed on the central region D of the free magnetic layer 28 is weakened by milling the central region D of the second antiferromagnetic layer 33 and the central region D of the third antiferromagnetic layer 31, and the fixed state of magnetization of the central region D of the free magnetic layer 28 may be changed to a weakly fixed magnetization to an extent capable of magnetic inversion.

When the mask layer 50 shown in FIG. 24 is a layer that cannot serve as an electrode layer by leaving it behind, the electrode layer 34 is formed on the second antiferromagnetic layer 33 after removing the mask layer 50.

While the methods for manufacturing the CIP magnetic sensing elements shown in FIGS. 5 to 7 have been described, the method for manufacturing the CPP magnetic sensing element shown in FIG. 9, particularly the portions different from those in the methods for manufacturing the CIP magnetic sensing elements shown in FIGS. 5 to 7, will be describe din detail hereinafter.

After the step in FIG. 22, a first insulation layer 70 is formed on the second antiferromagnetic layer 33 by continuous sputtering.

A resist layer having a hollow portion at the central region in the track width direction (X-direction) is formed by exposure and development on the first insulation layer 70.

Then, the first insulation layer 70 and second antiferromagnetic layer 33 not covered with the resist layer is milled by ion-milling.

The central region D of the second antiferromagnetic layer 33 not covered with the first insulation layer 70 may be milled using the first insulation layer 70 as a mask after forming the first insulation layer 70 on both side regions C of the second antiferromagnetic layer 33.

Figure 25:
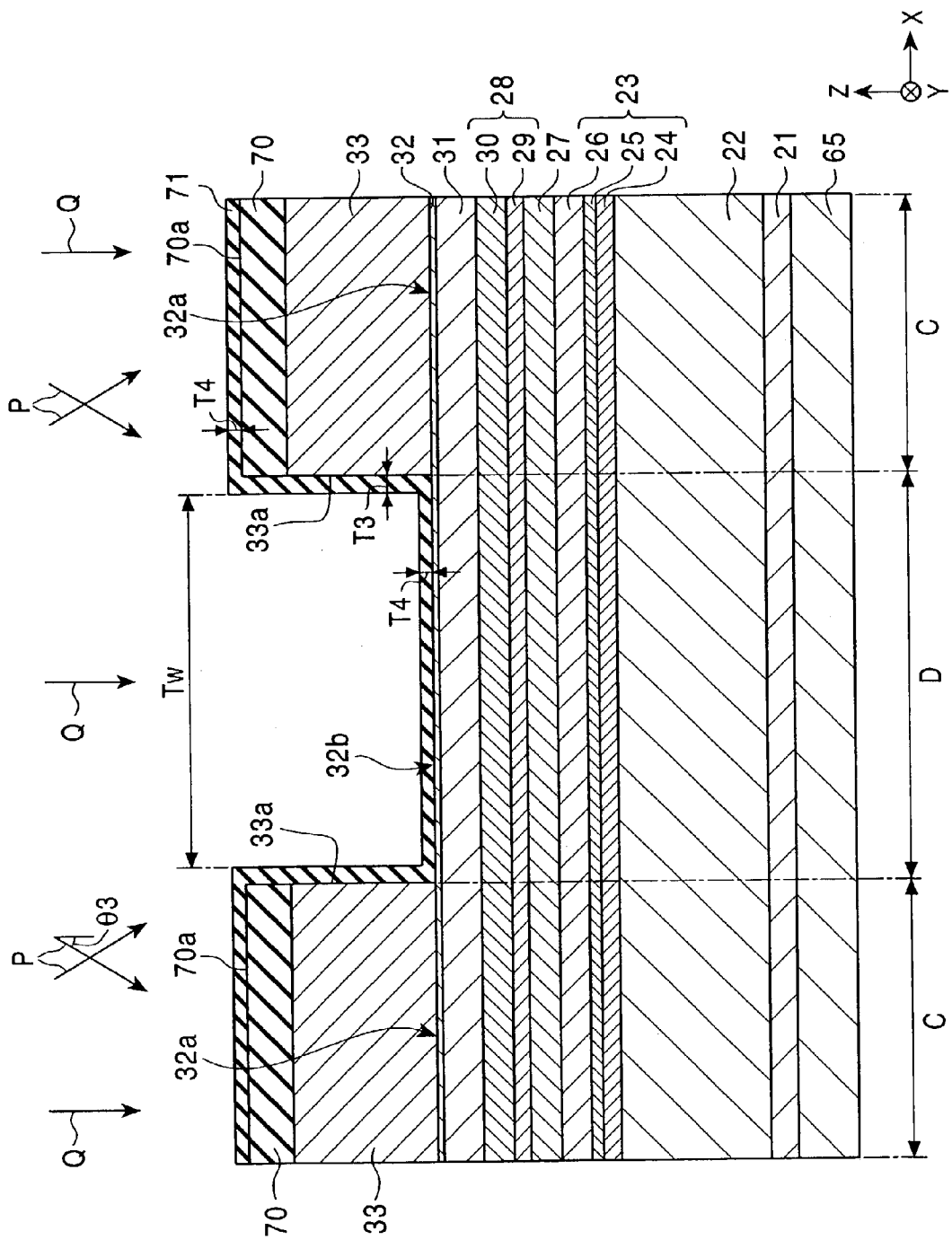
FIG. 25 shows a step of the manufacturing process of the magnetic sensing element shown in the embodiment in FIG. 9.

A second insulation layer 71 comprising $Al_2O_3$, $SiO_2$, AlN, Al—Si—O—N, Al—Si—O, $Ti_2O_3$ or $Ti_2O_5$ is deposited by sputtering from on the first insulation layer 70 through the inner side regions of the second antiferromagnetic layer 33 and first insulation layer 70 to the central region of the magnetic sensing element in the step shown in FIG. 25. The sputtering method available includes an ion beam sputtering method, a long throw sputtering method and a collimation sputtering method.

The sputtering angle θ3 (an inclination angle from the Z-axis) for forming the second insulation layer 71 should be noted herein. While the sputtering direction P shown in FIG. 25 has a sputtering angle θ3 to the direction perpendicular to the surface of each layer of the multilayer as shown in FIG. 25, it is preferable in the present invention that the sputtering angle θ3 is as large as possible (more inclined) in order to easily deposit the second insulation layer 71 on the inner side regions of the second antiferromagnetic layer 33. For example, the sputtering angle θ3 is 50 to 70°.

Increasing the sputtering angle θ3 as described above permits the thickness T3 of the second insulation layer 71 formed on the inner side regions 33a of the second antiferromagnetic layer 33 to be larger than the thickness T4 of the second insulation layer 71 formed on the surface of the magnetic sensing element and first insulation layer 70 in the track width direction (X-direction). The second insulation layer 71 formed on the inner side regions 33a of the second antiferromagnetic layer 33 is completely removed by ion-milling in the next step, unless the thickness of the second insulation layer 71 is adjusted as described above. Or, the thickness of the second insulation layer 71 becomes so small even when the layer is left behind that the layer cannot function as an insulation layer for properly decreasing the shunt loss.

Ion-milling Q is applied from a direction perpendicular to the surface of each layer of the multilayer (the direction parallel to the Z-direction), or from a direction almost perpendicular to the surface of each layer (an inclined angle of 0 to 20° to the direction perpendicular to the surface of each layer). Ion-milling is applied until the second insulation layer 71 formed on the central region D of the magnetic sensing element is properly removed. The second insulation layer 71 formed on the surface 70a of the first insulation layer 70 is also removed by this ion-milling. On the other hand, while the second insulation layer 71 formed on the inner side regions 33a of the second antiferromagnetic layer 33 is also slightly milled, the second insulation layer 71 formed on the inner side regions 33a of the second antiferromagnetic layer 33 is hardly milled as compared with the second insulation layer 71 formed on the central region D of the magnetic sensing element, because the second insulation layer 71 formed on the side regions 33a of the second antiferromagnetic layer 33 has a larger thickness T3 than the second insulation layer 71 formed on the central region D of the magnetic sensing element thickness, and the milling direction Q of ion-milling is inclined to the second insulation layer 71 formed on the inner side regions 33a of the second antiferromagnetic layer 33. Consequently, the second insulation layer 71 having a proper thickness is left behind on the inner side regions 33a of the second antiferromagnetic layer 33.

The thickness T3 of the second insulation layer 71 left behind on the inner side regions 33a of the second antiferromagnetic layer 33 in the track width direction is preferably about 5 to 10 nm.

Figure 26:
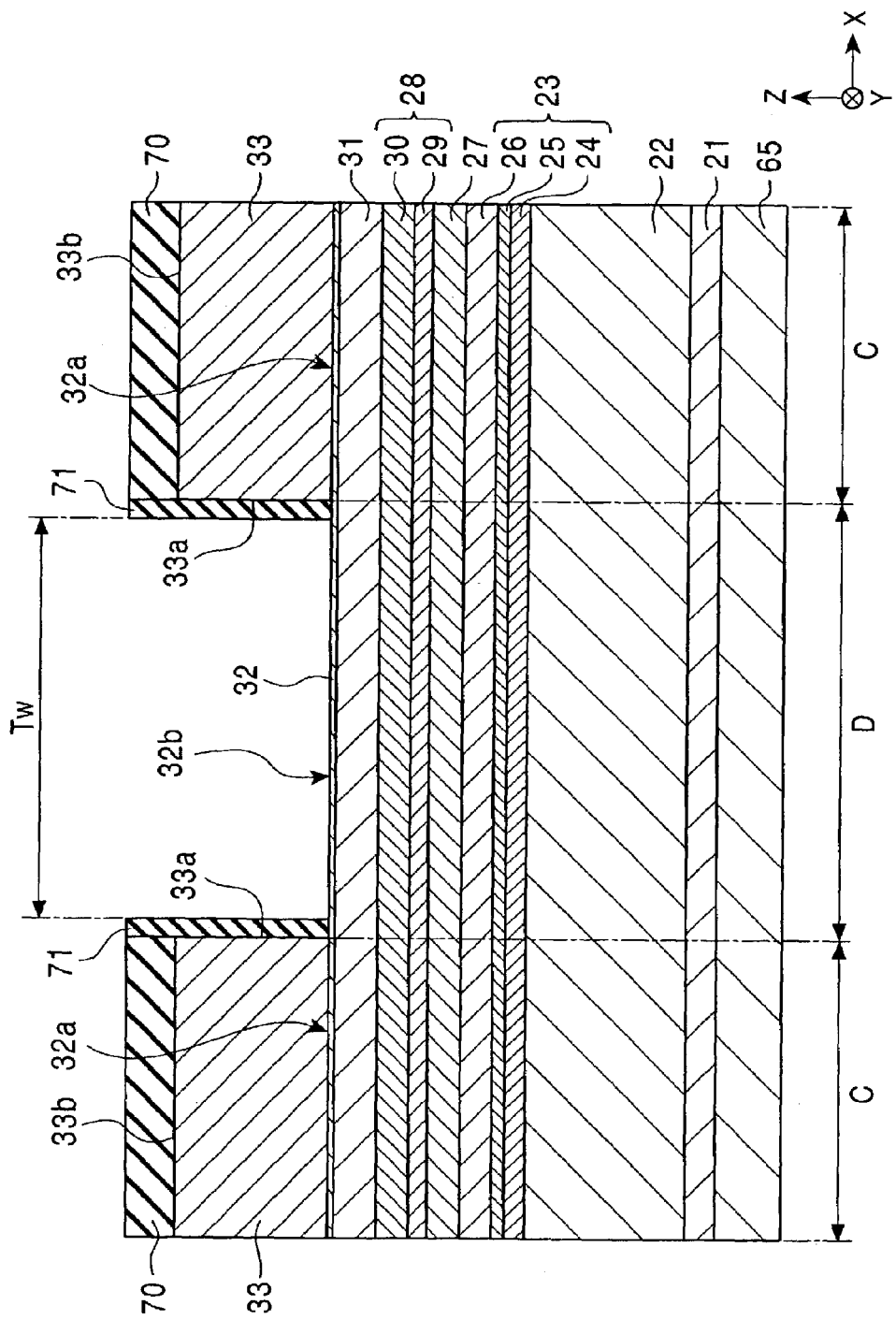
FIG. 26 shows a step following the step in FIG. 25.

The surface 33b of the second antiferromagnetic layer 33 is covered with the first insulation layer 70 as shown in FIG. 26, and the inner side regions 33a of the second antiferromagnetic layer 33 are covered with the second insulation layer 71. An upper electrode layer 68 that also serves as an upper shield is formed by plating, if necessary, after forming the nonmagnetic layer 69 shown in FIG. 9 from the insulation layers 70 and 71 through the central region D of the magnetic sensing element.

The surface 33b and the inner side regions 33a of the second antiferromagnetic layer 33 are properly covered with the insulation layers 70 and 71 in the magnetic sensing element formed as described above, and shunt loss of the electric current flowing from the seed layer can be properly suppressed in the CPP magnetic sensing element.

For manufacturing the magnetic sensing elements shown in FIGS. 10 and 11, the nonmagnetic layer 32 is deposited on the free magnetic layer 28 without depositing the third antiferromagnetic layer in the step shown in FIG. 18, and the ferromagnetic layers 51 and 51, second antiferromagnetic layers 52 and 52, and electrode layers 53 and 53 may be deposited after the step in FIG. 19 while remaining the resist R behind. Other conditions such as the annealing condition for generating an exchange coupling magnetic field between each ferromagnetic layer 51 and second antiferromagnetic layer 52 are the same as in the manufacturing method of the magnetic sensing element in FIG. 1.

Annealing in the first magnetic field is applied while directly laminating the magnetic layer 32 on the free magnetic layer 28 for forming the magnetic sensing elements shown in FIGS. 12 to 14. Then, after removing the oxide layer on the nonmagnetic layer 32 by low energy ion-milling, the ferromagnetic layer 56, second antiferromagnetic layer 57 and intermediate layer 58 are laminated as flat layers. Subsequently, annealing in the second magnetic field and the step for forming a concave portion 80 are applied. The steps for annealing in the first magnetic field, applying low energy ion-milling, annealing in the second magnetic field and forming the concave portion 80 are the same as the steps in the method for manufacturing the magnetic sensing element shown in FIG. 5.

When the free magnetic layer 28 is formed with a laminated ferrimagnetic structure shown in FIG. 15, the layers up to the magnetic layer 92 constituting the free magnetic layer 28 may be milled by ion-milling. Consequently, the nonmagnetic intermediate layer 91 is exposed at the central region D, and one layer of the magnetic layer 90 functions as the free magnetic layer at the central region. The free magnetic layer 28 maintains the laminated ferrimagnetic structure at the side regions C and C. Therefore, unidirectional exchange bias magnetic field is more enhanced, and magnetization of each side region C of the free magnetic layer 28 can be more reliably fixed in the track width direction, thereby enabling a magnetic sensing element capable of suppressing side-reading to be manufactured.

When the free magnetic layer 28 is formed in the embodiment having the backed layer 97 shown in FIG. 17, the backed layer 97 may be exposed at the central region D.

The nonmagnetic material layer 27 may be formed of a nonmagnetic conductive material such as Cu in the magnetic sensing element shown in FIG. 9, or the nonmagnetic material layer 27 may be formed of an insulation material such as $Al_2O_3$ and $SiO_2$. The former magnetic sensing element has a structure called a spin-valve GMR magnetoresistive element, while the latter magnetic sensing element has a structure called a tunnel magnetoresistive element.

Resistance changes are caused by taking advantage of a tunnel effect in the tunnel magnetoresistive element. The resistance becomes maximum when magnetization of the magnetic layer 26 is antiparallel to magnetization of the free magnetic layer 28 because the tunnel current hardly flows through the nonmagnetic material layer 27, while the resistance becomes minimum when magnetization of the magnetic layer 26 is parallel to magnetization of the free magnetic layer 28 because the tunnel current readily flows.

The varying electrical resistance is sensed as voltage change or current change caused by variation of magnetization of the free magnetic layer 28 under the influence of the external magnetic field by taking advantage of the principle above, and the leak magnetic field from the recording medium is sensed.

The lower electrode layer 65 and upper electrode layer 68 are formed in contact with the surface and bottom face of the multilayer, respectively, in the CPP magnetic sensing elements shown in FIGS. 8 and 9 to allow the electrode layers to function as shield layers. Such construction makes it unnecessary to independently form the electrode layers and shield layers, and the method for manufacturing the CCP magnetic sensing element is thus simplified.

Furthermore, the gap length G1 defined by the distance between the shield layers can be reduced by allowing the electrode layer to serve both the electrode function and shield function (see FIG. 25; the gap length G1 is determined including the thickness of the nonmagnetic layer 69 when the nonmagnetic layer 69 is provided). Consequently, a magnetic sensing element capable of properly complying with high density recording in the future can be manufactured.

However, electrode layers comprising Au, W, Cr or Ta may be provided on the surface and/or under the multilayer, and the shield layer made of a magnetic material may be provided on the electrode layer at the opposed side of the multilayer with interposition of a gap layer.

Alternatively, the CPP magnetic sensing element may be constructed by forming the upper and lower electrode layers on and under the magnetic sensing elements, respectively shown in FIGS. 10 to 14.

When a magnetic head is constructed using the CIP magnetic sensing element as described above, a lower gap layer comprising an insulation material, and a lower shield layer comprising a magnetic alloy laminated under the lower gap layer are formed under the magnetic sensing element, and an upper gap layer comprising an insulation material, and an upper shield layer comprising a magnetic alloy laminated on the upper gap layer are formed under the magnetic sensing element. The lower electrode layer that also serves as the lower shield layer, and the upper electrode layer that also serves as the upper shield layer have been already formed in the CPP magnetic sensing element. An inductive writing element may be laminated on the upper shield layer or upper electrode layer.

The magnetic sensing element according to the present invention can be used for the magnetic head integrated in a hard disk device as well as for a magnetic sensor.

The present invention is also applicable to a so-called top-spin valve magnetic sensing element in which the free magnetic layer is formed under the pinned magnetic layer, and the second antiferromagnetic layer is formed under the free magnetic layer 28 with a distance apart in the track width direction.

EXAMPLE

Figure 27:
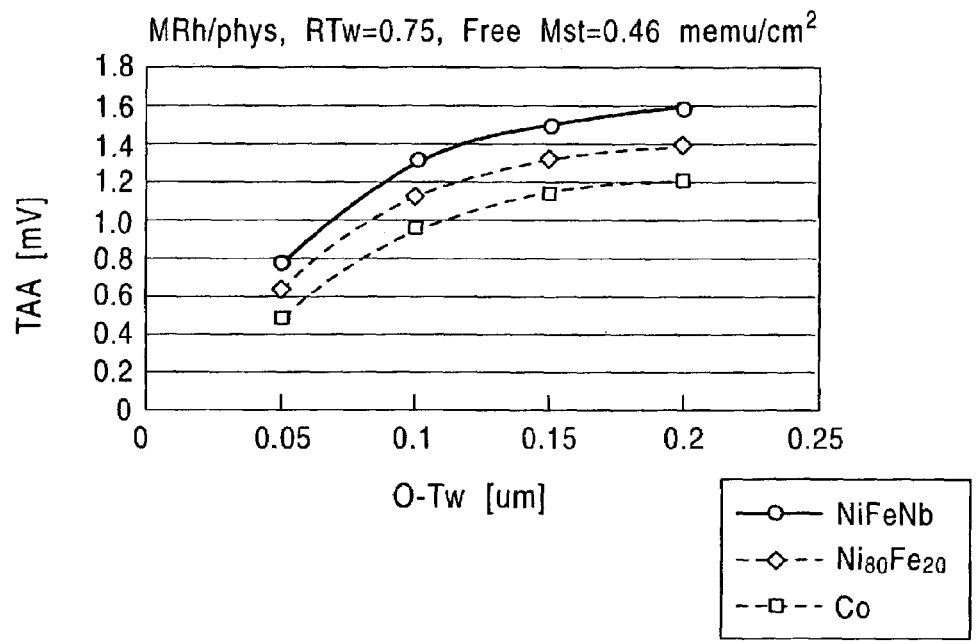
FIG. 27 is a graph showing the relation between the optical track width and output of the sensed magnetic field of the magnetic sensing element according to the present invention.

FIG. 27 is a graph showing the relation between the optical track width O-Tw and output of the sensed magnetic field in the exchange bias magnetic sensing element.

The output of the sensed magnetic field was measured by changing the optical track width O-Tw using three kinds of exchange bias magnetic sensing elements having the layer structure shown in FIG. 1 in which the materials of the magnetic material layer 30 of the free magnetic layer 28 are different with each other.

The height MRh of the element was adjusted to 0.75 times the optical track width O-Tw, and the thickness of the free magnetic material layer was adjusted depending on the materials of the magnetic material layer 30 so that the magnetic moment Mst per unit area of the free magnetic layer is a constant value of 0.46 memu/cm2 (5.8 T·nm).

In the graph in FIG. 27, the dotted line connecting the marks (◇) indicates the results when the magnetic material layer 30 of the free magnetic layer 28 is formed of a conventionally used $Ni_{80}Fe_{20}$ alloy, and the dotted line connecting the marks (□) indicates the results when the magnetic material layer 30 of the free magnetic layer 28 is formed of conventionally used CO.

The solid line connecting the marks (○) indicates the results when the magnetic material layer 30 of the free magnetic layer 28 is formed of the NiFeNb alloy, which is the example of the present invention.

The exchange stiffness constant A of the $Ni_{80}Fe_{20}$ alloy is about $1 \times 10^{-6}$ erg/cm, the exchange stiffness constant A of Co is about $2 \times 10^{-6}$ erg/cm, and the exchange stiffness constant A of the NiFeNb alloy is about $5 \times 10^{-7}$ erg/cm.

FIG. 27 shows that the output of the sensed magnetic field decreases as the size of the optical track width is reduced by forming the free magnetic layer 28 using any of the magnetic materials. In particular, the output of the sensed magnetic field rapidly decreases when the optical track width is 0.12 μm or less, particularly 0.1 μm or less.

However, it is evident that the magnetic sensing element in which the magnetic material layer 30 is formed using the NiFeNb alloy (examples of the composition have been described above) having a smaller stiffness constant A than the $Ni_{80}Fe_{20}$ alloy and Co has always larger output of the sensed magnetic field than the magnetic sensing element in which the magnetic material layer 30 is formed of the $Ni_{80}Fe_{20}$ alloy and Co, provided that the optical track width is the same.

For example, the output of the sensed magnetic field is 1.3 mv in the magnetic sensing element in which the magnetic material layer 30 is formed of the $Ni_{80}Fe_{20}$ alloy, and the output of the sensed magnetic field is 1.1 mv in the magnetic sensing element in which the magnetic material layer 30 is formed of Co, when the optical track width is 0.15 μm. On the contrary, the output of the sensed magnetic field is 1.5 mV in the magnetic sensing element in which the magnetic material layer 30 is formed of the NiFeNb alloy.

Likewise, the output of the sensed magnetic field of the magnetic sensing element is 1.2 mV, 1.0 mV or 1.4 mV when the material for forming the magnetic layer 30 is the $Ni_{80}Fe_{20}$ alloy, Co, or NiFeNb alloy, respectively, at the optical track width of 0.12 μm.

Furthermore, the output of the sensed magnetic field of the magnetic sensing element is 1.1 mV, 0.9 mV or 1.3 mV when the material for forming the magnetic layer 30 is the $Ni_{80}Fe_{20}$ alloy, Co, or NiFeNb alloy, respectively, at the optical track width of 0.1 μm.

Accordingly, a magnetic sensing element capable of maintaining a high output of the sensed magnetic field even at a small optical track width can be provided by using a magnetic material having a smaller exchange stiffness constant A than conventional $Ni_{80}Fe_{20}$ alloy and Co for the material of the free magnetic layer 28.

Figure 28:
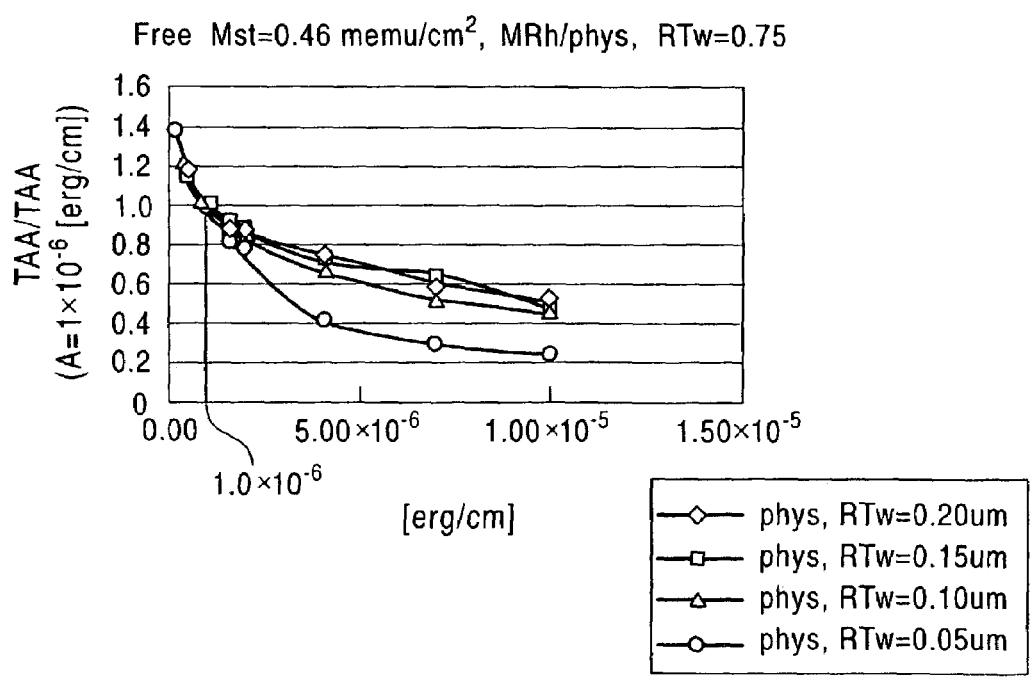
FIG. 28 is a graph showing the relation between the exchange stiffness constant of the free magnetic layer and output of the sensed magnetic field of the magnetic sensing element.

FIG. 28 is a graph showing the change of the output of the sensed magnetic field when the exchange stiffness constant A of the magnetic material for forming the magnetic material layer 30 constituting the free magnetic layer 28 is changed in the layer structure of the magnetic sensing element shown in FIG. 1.

In this experiment, the output is measured with respect to four kinds of magnetic sensing elements having the optical track widths of 0.05 μm (○), 0.10 μm (Δ), 0.15 μm (□) and 0.20 μm (◇). The output of the sensed magnetic field when the exchange stiffness constant A is $1.0 \times 10^{-6}$ erg/cm ($1.0 \times 10^{-11}$ J/m) is normalized as a unit.

The graph in FIG. 28 shows that the output of the sensed magnetic field increases when the exchange stiffness constant A is reduced in any of the optical track width.

In particular, the output of the sensed magnetic field increases as an exponential function when the exchange stiffness constant A is smaller than $1.0 \times 10^{-6}$ erg/cm that is the value of the exchange stiffness constant A of the $Ni_{80}Fe_{20}$ alloy that has been used for forming the magnetic material layer 30 of the conventional free magnetic layer 28, showing a large effect of decreasing the exchange stiffness constant A of the magnetic material 30.

Subsequently, compositions for reducing the exchange stiffness constant A of the magnetic material 30 of the free magnetic layer 28 have been considered. The exchange stiffness constant A of the magnetic material can be measured by a spin resonance method.

Figure 29:
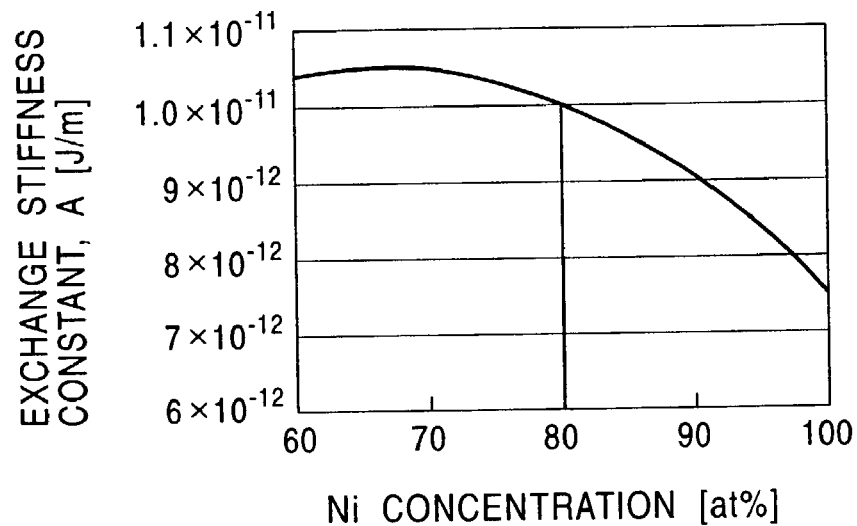
FIG. 29 is a graph showing the relation between the Ni concentration in the NiFe layer and exchange stiffness constant.

FIG. 29 is a graph showing the relation between the concentration of Ni in a NiFe alloy (permalloy) and exchange stiffness constant A.

FIG. 29 shows that the Ni concentration in the NiFe alloy may be increased to 80 at % or more for reducing the exchange stiffness constant A of the NiFe alloy to be smaller than $1.0 \times 10^{-6}$ erg/cm ($1.0 \times 10^{-11}$ J/m) that is the exchange stiffness constant A of the $Ni_{80}Fe_{20}$ alloy that has been used for forming the magnetic material layer 30 of the conventional free magnetic layer 28. The magnetic material layer 30 of the conventional free magnetic layer 28 may be formed using a magnetic material having a Ni concentration of 100 at %.

For the reasons above, the free magnetic layer magnetic layer was determined to be composed of the NiFe layer having a composition formula of $Ni_aFe_b$ (a and b are represented by at % and satisfy the relation of a>80 with a+b=100).

Figure 30:
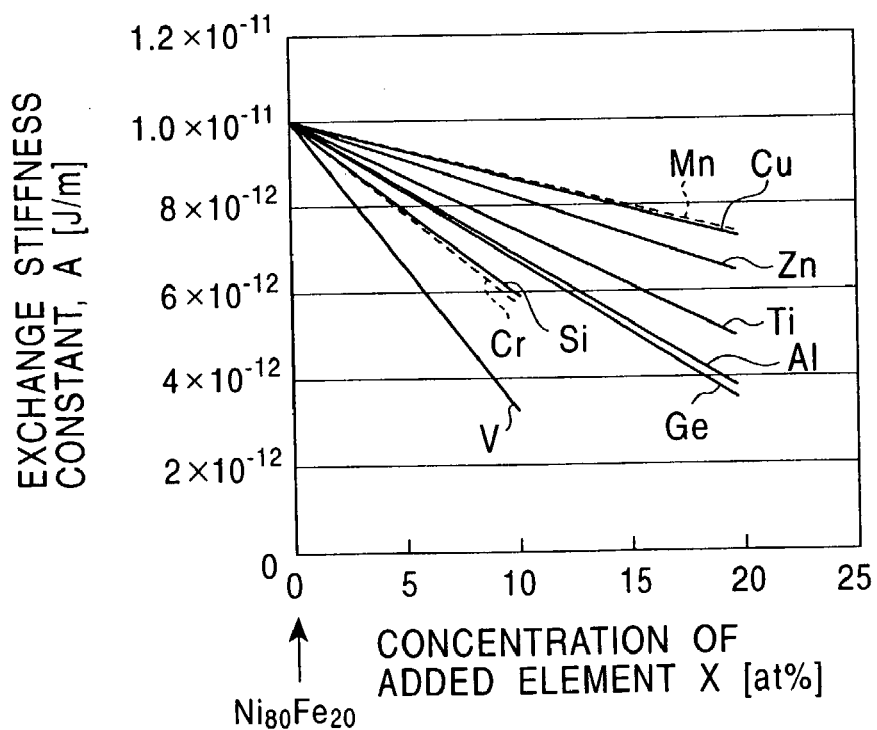
FIG. 30 is a graph showing the relation between the concentration of the added element X in the NiFeX layer and exchange stiffness constant.
Figure 31:
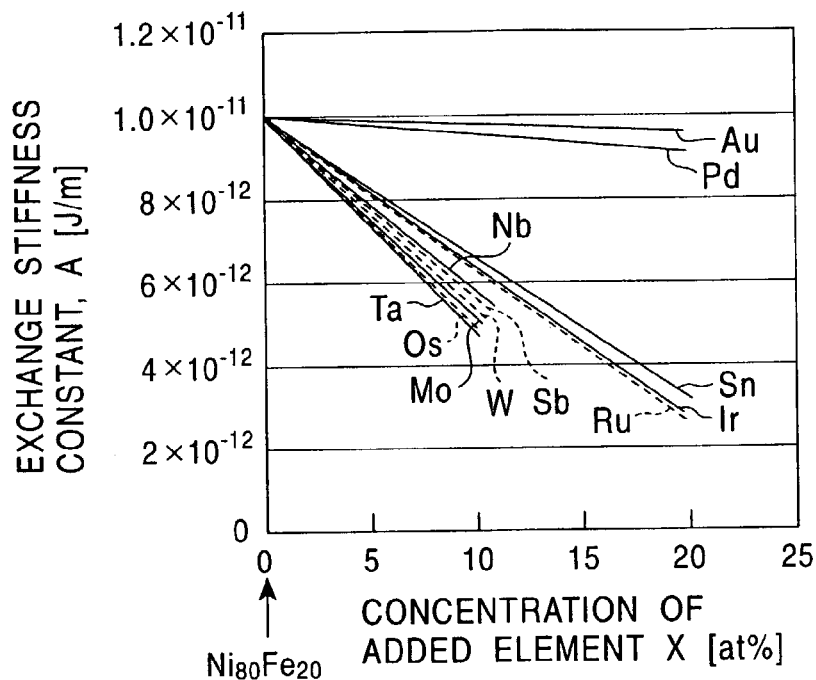
FIG. 31 is a graph showing the relation between the concentration of the added element X in the NiFeX layer and exchange stiffness constant.

FIGS. 30 and 31 show the relation between the exchange stiffness constant A and the concentration of the element X in a magnetic material represented by a composition formula of NiFeX (X is at least one element selected from Mn, Cu, Zn, Ti, Al, Ge, Si, Cr, V, Sn, Ir, Ru, Nb, Sb, W, Mo, Os and Ta).

FIGS. 30 and 31 show that the magnetic material $(Ni_{0.8}Fe_{0.2})_cX_d$ (X is an element selected from Mn, Cu, Zn, Ti, Al, Ge, Si, Cr, V, Sn, Ir, Ru, Nb, Sb, W, Mo, Os and Ta; c and d are represented by at %, and satisfy the relations of d>0 and c+d=100) prepared by adding the element X in $Ni_{80}Fe_{20}$ has a smaller exchange stiffness constant A than the magnetic material $Ni_{80}Fe_{20}$ containing no additive element. It may be conjectured that the exchange stiffness constant A is reduced by adding at least two elements selected from Mn, Cu, Zn, Ti, Al, Ge, Si, Cr, V, Sn, Ir, Ru, Nb, Sb, W, Mo, Os and Ta to be smaller than the exchange stiffness constant A before adding these elements FIG. 31 shows that the exchange stiffness constant is not substantially decreased by adding Au or Pd in the $Ni_{80}Fe_{20}$ alloy.

Since the magnetic material having the composition of NiFeX (X is at least one element selected from Mn, Cu, Zn, Ti, Al, Ge, Si, Cr, V, Sn, Ir, Ru, Nb, Sb, W, Mo, Os and Ta) does not show as large an increase of the coercive force and magnetostriction as compared with the NiFe alloy in which the element X is not added, the material is preferable as the magnetic material for forming the NiFeX layer of the present invention as a part of the free magnetic layer.

Figure 32:
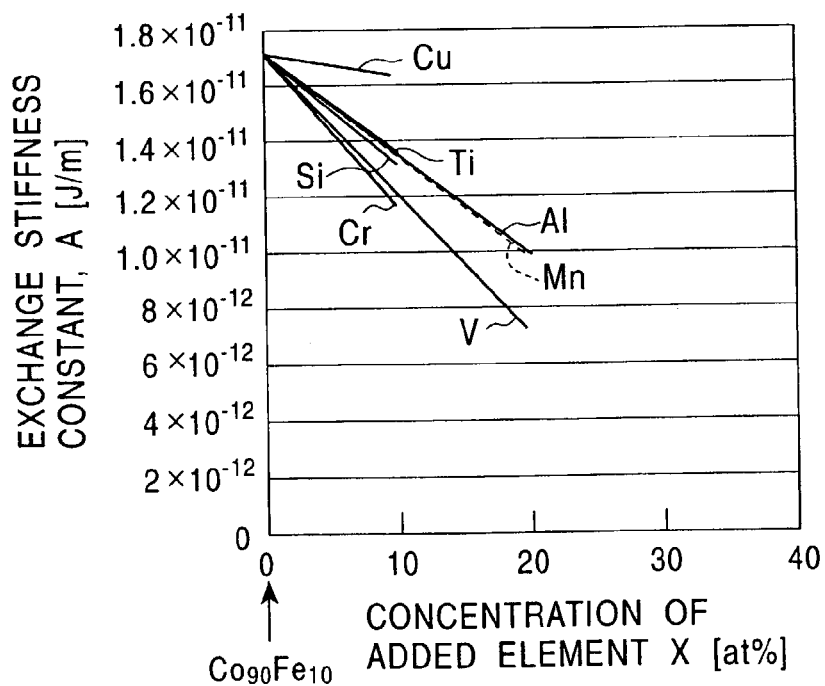
FIG. 32 is a graph showing the relation between the concentration of the added element X in the CoFeX layer and exchange stiffness constant.
Figure 33:
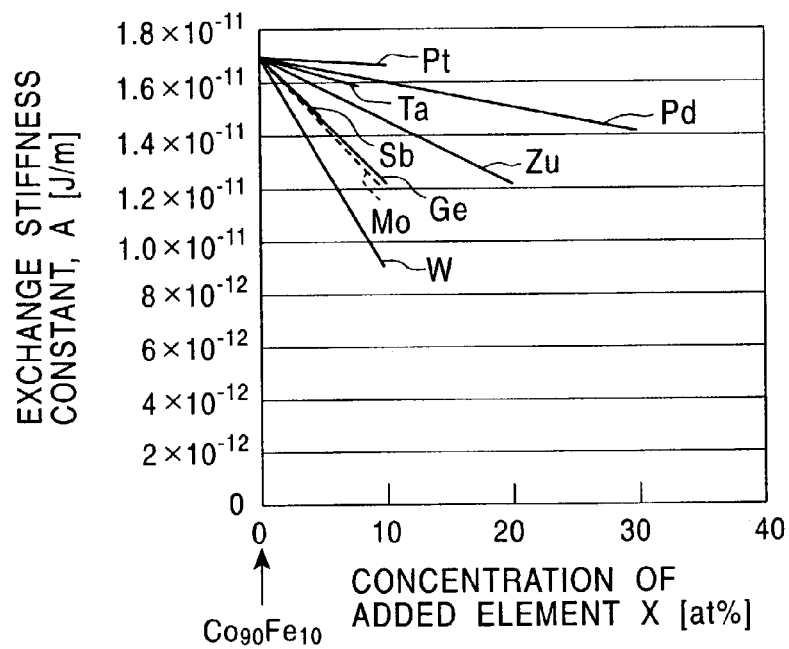
FIG. 33 is a graph showing the relation between the concentration of the added element X in the CoFeX layer and exchange stiffness constant.

FIGS. 32 and 33 is a graph showing the relation between the exchange stiffness constant A and the concentration of the element X in the magnetic material having a composition of CoFeX (X is one or at least two elements selected from Ti, Al, Mn, Si, V, Cr, Ta, Zn, Sb, Ge, Mo and W).

FIGS. 32 and 33 show that the magnetic material $(Co_{0.9}Fe_{0.1})_eX_f$ (X is an element selected from Ti, Al, Mn, Si, V, Cr, Ta, Zn, Sb, Ge, Mo and W; e and f are represented by at %, and satisfy the relations of f>0 and e+f=100) in which the element X is added to the $Co_{90}Fe_{10}$ alloy has a smaller exchange stiffness constant than the magnetic material $Co_{90}Fe_{10}$ in which no additive elements are added. In particular, the rate of decrease of the exchange stiffness constant A becomes larger when V, Cr, Mo and W are used as the additive element X.

It may be conjectured from these results that the exchange stiffness constant A is more reduced in the magnetic material in which at least two elements selected from Ti, Al, Mn, Si, V, Cr, Ta, Zn, Sb, Ge, Mo and W are added as compared with the magnetic material before adding these elements.

As shown in FIGS. 32 and 33, the degree of decrease of the exchange stiffness constant is small even by adding Cu, Pt or Pd in $Co_{90}Fe_{10}$, suggesting that these elements are not suitable as the additive element X in the present invention.

In Table 1, the exchange stiffness constants A of various amorphous Co alloys are compared with the exchange stiffness constants A of the magnetic materials $Ni_{80}Fe_{20}$ and $Co_{90}Fe_{10}$ that have been used for forming the conventional free magnetic layer.

TABLE 1

| AMORPHOUS ALLOY [at %] | A (J/m) |
| --- | --- |
| $Co_{70.3}Fe_{4.7}Si_{15}B_{10}$ | $9.2 \times 10^{-12}$ |
| $Co_{72}Fe_3P_{16}B_6Al_3$ | $8.3 \times 10^{-12}$ |
| $Co_{65.7}Fe_{4.3}Si_{17}B_{13}$ | $5.4 \times 10^{-12}$ |
| $Co_{61.6}Fe_{4.2}Ni_{4.2}Si_{10}B_{20}$ | $6.2 \times 10^{-12}$ |
| $Co_{69.6}Fe_{4.6}Mo_{1.8}Si_8B_{16}$ | $9.3 \times 10^{-12}$ |
| $Co_{70}Mn_6B_{24}$ | $9.2 \times 10^{-12}$ |
| $Co_{82}Mo_{12}Zr_6$ | $8.2 \times 10^{-12}$ |
| $Co_{77}Mo_{17}Zr_6$ | $5.1 \times 10^{-12}$ |
| CONVENTIONAL EXAMPLE | |
| $Co_{90}Fe_{10}$ | $1.7 \times 10^{-11}$ |
| $Ni_{80}Fe_{20}$ | $1.0 \times 10^{-11}$ |

Table 1 shows that the exchange stiffness constants A of the CoFeSiB alloy and CoFeSiBM alloy (M is an element selected from Ni and Mo), CoFePBAl alloy, CoMnB alloy and CoMoZr alloy that are amorphous Co alloys are smaller than the exchange stiffness constants A of the $Ni_{80}Fe_{20}$ alloy and $Co_{90}Fe_{10}$ alloy.

Accordingly, it was proved that a magnetic sensing element that can maintain a high output of the sensed magnetic field can be provided by forming the free magnetic layer using the magnetic materials such as $Ni_aFe_b$ alloy (a and b are represented in at %, and satisfy the relations of a>80 at % and a+b=100%), NiFeX alloy (X is at least one element selected from Mn, Cu, Zn, Ti, Al, Ge, Si, Cr, V, Sn, Ir, Ru, Nb, Sb, W, Mo, Os and Ta), amorphous Co alloy and CoFeX alloy (X is one or at least two elements selected from Ti, Al, Mn, Si, V, Cr, Ta, Zn, Sb, Ge, Mo and W) having the exchange stiffness constants A than the conventional $Ni_{80}Fe_{20}$ alloy and Co in the present invention.

The exchange stiffness constants A of magnetic materials other than those shown in FIGS. 30 to 33 may be estimated from the Curie temperatures of these magnetic materials.

With reference to "Physics of Ferromagnetic Material pp 132–135, vol. 1, Shokabo, 1984" by Satonobu Chikakau, the relation between the exchange integral J that is a constant representing the magnitude of the spin interaction of atoms in a magnetic material, and Curie temperature $\Theta_f$ is represented by the following equation (k represent a Boltzsmann constant):

$$J \propto k\Theta_f$$

Accordingly, the exchange stiffness constant a can be determined from the following equation:

$$A = \left(\frac{1}{c}\right) \cdot \left(\frac{n \cdot S^2}{a}\right) k \cdot \Theta_f \quad (5)$$

C is a constant depending on the crystal structure of the magnetic material. For example, the values of C predicted from various statistical theories are 2 to 4 in the body centered cubic lattice, and 3 to 6 in the face centered cubic lattice.

When the uppermost layer or lowermost layer of the free magnetic layer closest to the second antiferromagnetic layer is the $(Co_{0.9}Fe_{0.1})_eCr_f$ layer (e and f are represented in at %, and satisfy the relation of $0<f<20$ and $e+f=100$), the magnitude of the exchange coupling magnetic field acting between the second antiferromagnetic layer and free magnetic layer is increased, and the direction of magnetization of the free magnetic layer at both side regions overlapping the second antiferromagnetic layer is tightly fixed. Consequently, side-reading caused by changes of the direction of magnetization at the region outside of the optical track width O-Tw of the magnetic sensing element may be suppressed.

Figure 34:
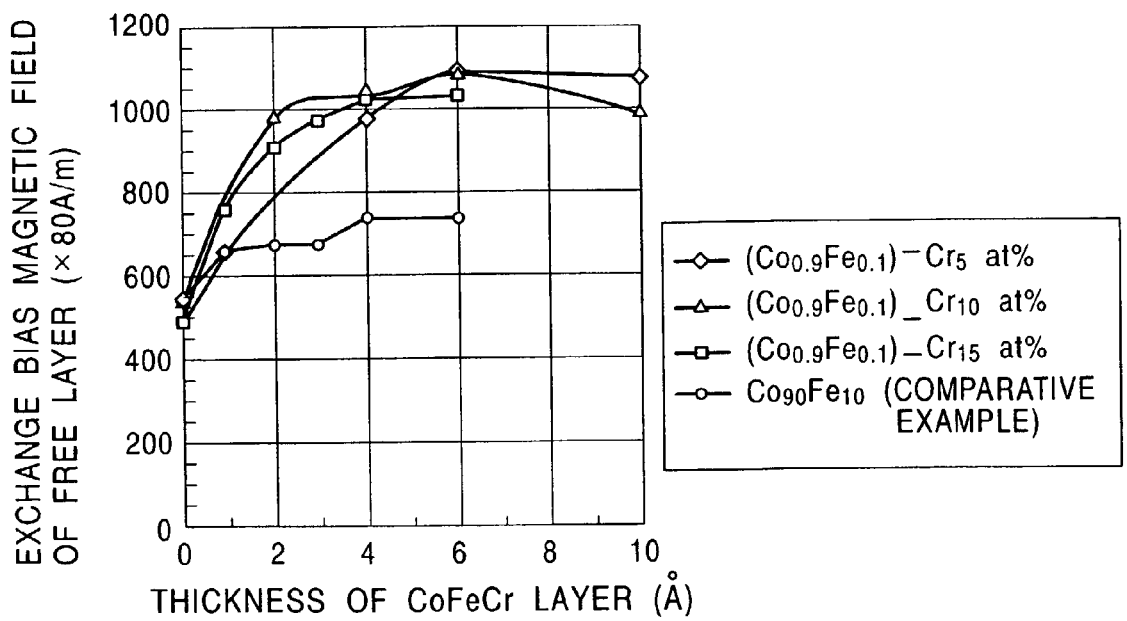
FIG. 34 is a graph showing the relation between the thickness of the CoFeCr layer formed by being laminated on the second antiferromagnetic layer and the exchange coupling magnetic field generated between the second antiferromagnetic layer and CoFeCr layer.

FIG. 34 is a graph showing the relation between the thickness of the CoFe layer and exchange coupling magnetic field between the antiferromagnetic layer comprising PtMn and CoFe layer as a comparative example, and the relation between the thickness of CoFeCr layer and exchange coupling magnetic field between the antiferromagnetic layer comprising PtMn and CoFeCr layer as an example.

The following thin layer laminate was used in the experiment:

Silicon substrate/alumina (1000 Å)/$(Ni_{0.8}Fe_{0.2})_{60}Cr_{40}$ (60 Å)/$Pt_{50}Mn_{50}$ (120 Å)/$Co_{90}Fe_{10}$ (14 Å)/Ru (8.7 Å)/$Co_{90}Fe_{10}$ (20 Å)/Cu (21 Å)/$Co_{90}Fe_{10}$ (10 Å)/$Ni_{80}Fe_{20}$ (30 Å)/$(Co_{0.9}Fe_{0.1})Cr$ or $Co_{90}Fe_{10}/Pt_{50}Mn_{50}$ (300 Å)/Ta (50 Å). Each layer is formed to have a flat surface.

The free magnetic layer has a three layer structure comprising/$Co_\pi Fe_{10}$ (10 Å)/$Ni_{80}Fe_{20}$ (30 Å)/$(Co_{0.9}Fe_{0.1})Cr$ or $Co_{90}Fe_{10}$/in the example and comparative example, and the exchange coupling magnetic field is generated by direct contact between the $(Co_{0.9}Fe_{0.1})Cr$ or $Co_{90}Fe_{10}$ layer as the uppermost layer and the $Pt_{50}Mn_{50}$ layer as the second antiferromagnetic layer.

FIG. 34 shows that the magnitude of the exchange coupling magnetic field between the $Pt_{50}Mn_{50}$ layer and $Co_\pi Fe_{10}$ layer is 52 kA/m, when the uppermost layer of the free magnetic layer in contact with the second antiferromagnetic layer ($Pt_{50}Mn_{50}$ layer) is the $Co_\pi Fe_{10}$ layer having a thickness of 1 Å. The magnitude of the exchange coupling magnetic field between the $Pt_{50}Mn_{50}$ layer and $Co_\pi Fe_{10}$ layer maintain the constant value of about 52 kA/m, when the thickness of the $Co_{90}Fe_{10}$ layer is in the range of 1 Å to 3 Å. The magnitude of the exchange coupling magnetic field between the $Pt_{50}Mn_{50}$ layer and $Co_{90}Fe_{10}$ layer starts to increase again when the thickness of the $Co_\pi Fe_{10}$ layer exceeds 3 Å, and the magnitude of the exchange coupling magnetic field maintains a constant value of 58 kA/m when the thickness exceeds 4 Å.

When the uppermost layer of the free magnetic layer in contact with the second antiferromagnetic layer ($Pt_{50}Mn_{50}$ layer) is $(Co_{0.9}Fe_{0.1})_{95}Cr_5$ layer, the exchange coupling magnetic field between the $Pt_{50}Mn_{50}$ layer and $(Co_{0.9}Fe_{0.1})_{95}Cr_5$ layer maintains a constant value of about 86 kA/m when the thickness of the $(Cu_{0.9}Fe_{0.1})_{95}Cr_5$ layer exceeds 6 Å.

A large exchange coupling magnetic field can be obtained by increasing the Cr concentration in the $(Co_{0.9}Fe_{0.1})Cr$ layer even when the thickness of the $(Co_{0.9}Fe_{0.1})Cr$ layer is small.

The magnitude of the exchange coupling magnetic field between the $Pt_{50}Mn_{50}$ layer and $(Co_{0.9}Fe_{0.1})_{90}Cr_{10}$ layer is 78 kA/m, when the uppermost layer of the free magnetic layer in contact with the second antiferromagnetic layer ($Pt_{50}Mn_{50}$ layer) is the $(Co_{0.9}Fe_{0.1})_{90}Cr_{10}$ layer with a thickness of 2 Å. The magnitude of the exchange coupling magnetic field itself increases when the thickness of the $(Co_{0.9}Fe_{0.1})_{90}Cr_{10}$ layer is larger than 2 Å, although the rate of increase of the exchange coupling magnetic field decreases. The magnitude of the exchange coupling magnetic field maintains a constant value of 86 kA/m when the thickness of the $(Co_{0.9}Fe_{0.1})_{90}Cr_{10}$ layer exceeds 4 Å.

The magnitude of the exchange coupling magnetic field is 72 kA/m when the uppermost layer of the free magnetic layer in contact with the second antiferromagnetic layer ($Pt_{50}Mn_{50}$ layer) is the $(Co_{0.9}Fe_{0.1})_{85}Cr_{15}$ layer with a thickness of 2 Å, and the magnitude of the exchange coupling magnetic field is 77 kA/m when the thickness of the $(Co_{0.9}Fe_{0.1})_{85}Cr_{15}$ layer is 3 Å. The magnitude of the exchange coupling magnetic field maintains a constant value of about 82 kA/m when the thickness of the $(Co_{0.9}Fe_{0.1})_{85}Cr_{15}$ layer is in the range of 4 Å to 6 Å. The magnitude of the exchange coupling magnetic field is 82 kA/m when the thickness of the $(Co_{0.9}Fe_{0.1})_{85}Cr_{15}$ layer is 6 Å.

However, it is not preferable that the concentration of Cr is too high, because the saturation magnetization and Curie temperature of the CoFeCr layer itself and the NiFeX layer under the CoFeCr layer are so largely decreased that magnetic properties are lost in extreme cases. On the other hand, magnetostriction of the free magnetic layer increases when the thickness of the CoFeCr layer is too large.

When the $(Co_{0.9}Fe_{0.1})Cr$ layer or $Co_{90}Fe_{10}$ layer is not formed on at the uppermost layer of the free magnetic layer, or when the free magnetic layer comprises a two layer structure of /$Co_{90}Fe_{10}$ (10 Å)/$Ni_{80}Fe_{20}$ (30 Å) and in direct contact with the second antiferromagnetic layer ($Pt_{50}Mn_{50}$ layer), the magnitude of the exchange coupling magnetic field generated between the $Ni_{80}Fe_{20}$ layer and second antiferromagnetic layer ($Pt_{50}Mn_{50}$ layer) is in the range of 38 to 42 kA/m.

These results show that the exchange coupling magnetic field acting between the second antiferromagnetic layer and free magnetic layer becomes larger than the value in the conventional art when the uppermost layer or lowermost layer of the free magnetic layer closest to the second antiferromagnetic layer is the CoFeCr layer. Consequently, side-reading caused by changes of the direction of magnetization of the free magnetic layer at the region outside of the optical track width O-Tw of the magnetic sensing element may be suppressed.

The CoFeCr layer is preferably formed of the $(Co_xFe_y)_e Cr_f$ layer (x and y are represented in at % and $x+y=1$, and e and f satisfy the relations of $0<f<20$ and $e+f=100$) from the results shown in FIG. 34.

More preferably, the CoFeCr layer is formed of the $(Co_xFe_y)_eCr_f$ layer (x and y are represented in at % and x+y=1, and e and f satisfy the relations of 5<f<15 and e+f=100).

For increasing the magnitude of the exchange coupling magnetic field between the CoFeCr layer and second antiferromagnetic layer, the thickness of the CoFeCr layer is preferably 2 Å or more and 10 Å or more, more preferably 3 Å or more and 6 Å or less.

A sufficient magnetite of the exchange coupling magnetic field may be generated, when the CoFeCr layer is the $(Co_{0.9}Fe_{0.1})_eCr_f$ layer (e and f are represented in at %, and satisfy the relation of 10<f<15 and e+f=100), even when the thickness thereof is 2 Å or more and 6 Å or less, or 2 Å or more and 4 Å or less.

While the magnitude of the exchange coupling magnetic field between the free magnetic layer and second antiferromagnetic layer increases by forming the CoFeCr layer at the uppermost of lowermost layer of the free magnetic layer, sensitivity of the magnetic sensing element decreases due to an increase of the magnetic moment Ms×t per unit are over the entire free magnetic layer, or stability of the regenerative waveform becomes poor due to an increase of magnetostriction. Accordingly, the thickness of the CoFeCr layer is preferably 2 Å or more and 6 Å or less, or 2 Å or more and 4 Å or less, from the view point of maintaining the stability of the regenerative waveform.

The exchange stiffness constant A of $4 \times 10^{-12}$ J/m is preferable, because the Curie temperature becomes 100° C. or more at the exchange stiffness constant A of $4 \times 10^{-12}$ J/m, and the magnetic material can be used for forming a magnetic sensing element having stable properties against heating.

The present invention provides a magnetic sensing element comprising a pair of the second antiferromagnetic layer formed by being laid on at least both side regions of the free magnetic layer in the track width direction with a distance apart in the track width direction. The free magnetic layer comprises at least one of the NiFe layer comprising the $Ni_aFe_b$ alloy (a and b are represented in at %, and satisfy the relation of a>80 and a+b=100), the NiFeX layer (X is at least one element selected from Mn, Cu, Zn, Ti, Al, Ge, Si, Cr, V, Sn, Ir, Ru, Nb, Sb, W, Mo, Os and Ta), the amorphous Co alloy layer comprising the amorphous Co based magnetic material, and the CoFeX layer.

A high output of the sensed magnetic field can be maintained in the present invention even by forming the exchange bias magnetic sensing element having a narrow track width, by forming the free magnetic layer with the NiFe layer, NiFeX layer, amorphous Co alloy layer or CoFeX layer having a small exchange stiffness constant.

Variation of the direction of magnetization of the free magnetic layer over the entire track width region is facilitated, and a high output of the sensed magnetic field is maintained even in the magnetic sensing element having a narrow track width, by using a magnetic material having a small exchange stiffness constant A such as the NiFe layer, NiFeX layer, amorphous Co alloy layer or CoFeX layer for the material of the free magnetic layer.

Since the magnetic material having the exchange stiffness constant A also has a low saturation magnetization Ms at room temperature, the magnetic moment Ms×t per unit area of the NiFe layer, NiFeX layer, amorphous Co alloy layer or CoFeX layer formed using the magnetic material having the small exchange stiffness constant is also decreased. Consequently, the direction of magnetization of the free magnetic layer comprising the NiFe layer, NiFeX layer, amorphous Co alloy layer or CiFeX layer is readily changed by the external magnetic field (recording magnetic field), and the output of the sensed magnetic field is improved.

What is claimed is:

1. A magnetic sensing element having a multilayer comprising a first antiferromagnetic layer, a pinned magnetic layer, a nonmagnetic material layer and a free magnetic layer laminated in this order, a pair of second antiferromagnetic layers formed with a distance therebetween in a track width direction so as to be stacked at least on both side regions of the free magnetic layer in the track width direction, said free magnetic layer including at least one of a $Ni_aFe_b$ layer, a NiFeX layer, an amorphous Co alloy layer containing an amorphous Co based magnetic material, and a CoFeX layer, wherein a and b in $Ni_aFe_b$ represented by at % satisfy the relation of a>80 with a+b=100, wherein X in the NiFeX layer represents at least one element selected from Mn, Cu, Zn, Ti, Al, Ge, Si, Cr, V, Sn, Ir, Ru, Nb, Sb, W, Mo, Os and Ta, wherein X in the CoFeX layer represents at least one element selected from Ti, Al, Mn, Si, V, Cr, Ta, Zn, Sb, Ge, Mo and W, wherein the free magnetic layer comprises a $(Co_xFe_y)_eCr_f$ layer as one of an uppermost layer and lowermost layer closest to the second antiferromagnetic layer, x and y are represented by an at % ratio of Co to Fe satisfying the relation of x+y=1, and e and f are represented by at % satisfying the relations of 0<f<20 and e+f=100.

2. The magnetic sensing element according to claim 1, wherein an optical track width O-Tw defined by the distance between the second antiferromagnetic layers in the track width direction is at most 0.15 μm.

3. The magnetic sensing element according to claim 2, wherein the optical track width is at most 0.12 μm.

4. The magnetic sensing element according to claim 3, wherein the optical track width is at most 0.10 μm.

5. The magnetic sensing element according to claim 1, wherein the free magnetic layer has a structure in which a magnetic layer containing Co is laminated on at least one of the $Ni_aFe_b$ layer and NiFeX layer.

6. The magnetic sensing element according to claim 1, wherein the free magnetic layer has at least a structure comprising at least one of the amorphous Co alloy layer comprising the amorphous Co based magnetic material and the CoFeX layer, and a laminated structure of both layers.

7. The magnetic sensing element according to claim 6, wherein one of a magnetic layer having a smaller resistivity than a resistivity of the amorphous Co alloy layer is laminated under the amorphous Co alloy layer and a magnetic layer having a smaller resistivity than a resistivity of the CoFeX layer is laminated under the CoFeX layer.

8. The magnetic sensing element according to claim 7, wherein the magnetic layer having the small resistivity comprises at least one of the NiFe layer and NiFeX layer.

9. The magnetic sensing element according to claim 1, wherein e and f are represented by at % satisfying the relation of 5<f<15.

10. The magnetic sensing element according to claim 9, wherein the $(Co_xFe_y)_eCr_f$ layer has a thickness of at least 2 Å and at most 10 Å.

11. The magnetic sensing element according to claim 10, wherein the $(Co_xFe_y)_eCr_f$ layer has a thickness of at least 3 Å and at most 6 Å.

12. The magnetic sensing element according to claim 1, wherein the $(Co_xFe_y)_eCr_f$ layer has a thickness of at least 2 Å and at most 10 Å.

13. The magnetic sensing element according to claim 12, wherein the $(Co_xFe_y)_eCr_f$ layer has a thickness of at least 3 Å and at most 6 Å.

14. The magnetic sensing element according to claim 1, wherein exchange stiffness constants of the magnetic materials constituting the $Ni_aFe_b$ layer, NiFeX layer, amorphous Co alloy layer, and CoFeX layer are smaller than an exchange stiffness constant of a magnetic material represented by a composition formula of $Ni_{80}Fe_{20}$.

15. The magnetic sensing element according to claim 1, wherein a second nonmagnetic layer comprising one of Cr and Cu is formed between the second antiferromagnetic layer and free magnetic layer.

16. The magnetic sensing element according to claim 1, wherein a ferromagnetic layer is formed one of between the second antiferromagnetic layer and free magnetic layer and between the second antiferromagnetic layer and nonmagnetic layer.

17. The magnetic sensing element according to claim 1, wherein a surface of the second antiferromagnetic layer comprises an opening, and a groove having a prescribed width is formed in the track width direction.

18. The magnetic sensing element according to claim 17, wherein a side face of the groove is perpendicular to the surface of the second antiferromagnetic layer.

19. The magnetic sensing element according to claim 18, wherein a bottom face of the groove is provided within the second antiferromagnetic layer.

20. The magnetic sensing element according to claim 19, wherein a thickness of the second antiferromagnetic layer in a region overlapping the bottom face of the groove is at least 10 Å and at most 50 Å.

21. The magnetic sensing element according to claim 19, wherein a third antiferromagnetic layer is laminated between the second antiferromagnetic layer and free magnetic layer, and
one of a thickness of the second antiferromagnetic layer in a region overlapping the bottom face of the groove and a combined thickness of the second antiferromagnetic layer and third antiferromagnetic layer in the region overlapping the bottom face of the groove is at least 10 Å and at most 50 Å.

22. The magnetic sensing element according to claim 18, wherein a third antiferromagnetic layer is laminated between the second antiferromagnetic layer and free magnetic layer, and a bottom face of the groove is provided within the third antiferromagnetic layer.

23. The magnetic sensing element according to claim 22, wherein a thickness of the third antiferromagnetic layer in a region overlapping the bottom face of the groove is at least 10 Å and at most 50 Å.

24. The magnetic sensing element according to claim 18, wherein a second nonmagnetic layer comprising a precious metal is formed between the second antiferromagnetic layer and free magnetic layer and a bottom face of the groove is provided within the second nonmagnetic layer.

25. The magnetic sensing element according to claim 18, wherein a second nonmagnetic layer comprising one of Cr and Cu is formed between the second antiferromagnetic layer and free magnetic layer and a bottom face of the groove is provided within the second nonmagnetic layer.

26. The magnetic sensing element according to claim 18, wherein a ferromagnetic layer is formed one of between the second antiferromagnetic layer and free magnetic layer and between the second antiferromagnetic layer and nonmagnetic layer, and a bottom face of the groove is provided within the ferromagnetic layer.

27. The magnetic sensing element according to claim 18, wherein a third antiferromagnetic layer is laminated between the second antiferromagnetic layer and free magnetic layer,
a second nonmagnetic layer comprising a precious metal is formed one of between the second antiferromagnetic layer and free magnetic layer and between the second antiferromagnetic layer and third antiferromagnetic layer, and
a bottom face of the groove is provided within the second nonmagnetic layer.

28. The magnetic sensing element according to claim 18, wherein a third antiferromagnetic layer is laminated between the second antiferromagnetic layer and free magnetic layer,
a second nonmagnetic layer comprising one of Cr and Cu is formed one of between the second antiferromagnetic layer and free magnetic layer and between the second antiferromagnetic layer and third antiferromagnetic layer, and
a bottom face of the groove is provided within the second nonmagnetic layer.

29. The magnetic sensing element according to claim 17, wherein a bottom face of the groove is provided within the second antiferromagnetic layer.

30. The magnetic sensing element according to claim 29, wherein a thickness of the second antiferromagnetic layer in a region overlapping the bottom face of the groove is at least 10 Å and at most 50 Å.

31. The magnetic sensing element according to claim 29, wherein a third antiferromagnetic layer is laminated between the second antiferromagnetic layer and free magnetic layer, and
one of a thickness of the second antiferromagnetic layer in a region overlapping the bottom face of the groove and a combined thickness of the second antiferromagnetic layer and third antiferromagnetic layer in the region overlapping the bottom face of the groove is at least 10 Å and at most 50 Å.

32. The magnetic sensing element according to claim 17, wherein a third antiferromagnetic layer is laminated between the second antiferromagnetic layer and free magnetic layer, and a bottom face of the groove is provided within the third antiferromagnetic layer.

33. The magnetic sensing element according to claim 32, wherein a thickness of the third antiferromagnetic layer in a region overlapping the bottom face of the groove has a thickness of at least 10 Å and at most 50 Å.

34. The magnetic sensing element according to claim 17, wherein a second nonmagnetic layer comprising a precious metal is formed between the second antiferromagnetic layer and free magnetic layer and a bottom face of the groove is provided within the second nonmagnetic layer.

35. The magnetic sensing element according to claim 17, wherein a second nonmagnetic layer comprising one of Cr and Cu is formed between the second antiferromagnetic layer and free magnetic layer and a bottom face of the groove is provided within the second nonmagnetic layer.

36. The magnetic sensing element according to claim 17, wherein a ferromagnetic layer is formed one of between the second antiferromagnetic layer and free magnetic layer and between the second antiferromagnetic layer and nonmagnetic layer, and a bottom face of the groove is provided within the ferromagnetic layer.

37. The magnetic sensing element according to claim 17, wherein a third antiferromagnetic layer is laminated between the second antiferromagnetic layer and free magnetic layer,
a second nonmagnetic layer comprising a precious metal is formed one of between the second antiferromagnetic layer and free magnetic layer and between the second antiferromagnetic layer and third antiferromagnetic layer, and
a bottom face of the groove is provided within the second nonmagnetic layer.

38. The magnetic sensing element according to claim 17, wherein a third antiferromagnetic layer is laminated between the second antiferromagnetic layer and free magnetic layer,
a second nonmagnetic layer comprising one of Cr and Cu is formed one of between the second antiferromagnetic layer and free magnetic layer and between the second antiferromagnetic layer and third antiferromagnetic layer, and
a bottom face of the groove is provided within the second nonmagnetic layer.

39. The magnetic sensing element according to claim 1, further comprising a second nonmagnetic layer comprising a precious metal formed between the second antiferromagnetic layer and free magnetic layer, the second nonmagnetic layer formed with a uniform thickness from a central region through both side regions.

40. The magnetic sensing element according to claim 1, wherein electrode layers are provided in the track width direction on both side regions of a second multilayer comprising the free magnetic layer, nonmagnetic layer and pinned magnetic layer, and a sense current flows in a direction parallel to a surface of each layer in the second multilayer.

41. The magnetic sensing element according to claim 40, wherein the nonmagnetic layer comprises a nonmagnetic conductive material.

42. The magnetic sensing element according to claim 1, wherein upper electrode layers and lower electrode layers are provided on and under the multilayer, respectively, comprising the free magnetic layer, nonmagnetic layer and pinned magnetic layer, and a sense current flows in a direction perpendicular to the surface of the multilayer.

43. The magnetic sensing element according to claim 42, wherein the nonmagnetic layer comprises a nonmagnetic conductive material.

44. The magnetic sensing element according to claim 42, wherein the nonmagnetic layer comprises an insulating material.

45. A magnetic sensing element having a multilayer comprising a first antiferromagnetic layer, a pinned magnetic layer, a nonmagnetic material layer and a free magnetic layer laminated in this order,
a pair of second antiferromagnetic layers formed with a distance therebetween in a track width direction so as to be stacked at least on both side regions of the free magnetic layer in the track width direction,
said free magnetic layer including at least one of a $Ni_aFe_b$ layer, a NiFeX layer, an amorphous Co alloy layer containing an amorphous Co based magnetic material, and a CoFeX layer,
wherein a and b in $Ni_aFe_b$ represented by at % satisfy the relation of a>80 with a+b=100,
wherein X in the NiFeX layer represents at least one element selected from Mn, Cu, Zn, Ti, Al, Ge, Si, Cr, V, Sn, Ir, Ru, Nb, Sb, W, Mo, Os and Ta,
wherein X in the CoFeX layer represents at least one element selected from Ti, Al, Mn, Si, V, Cr, Ta, Zn, Sb, Ge, Mo and W, and
wherein a third antiferromagnetic layer is laminated between the second antiferromagnetic layer and free magnetic layer.

46. The magnetic sensing element according to claim 45, wherein the third antiferromagnetic layer has a thickness of at least 10 Å and at most 50 Å.

47. A magnetic sensing element having a multilayer comprising a first antiferromagnetic layer, a pinned magnetic layer, a nonmagnetic material layer and a free magnetic layer laminated in this order,
a pair of second antiferromagnetic layers formed with a distance therebetween in a track width direction so as to be stacked at least on both side regions of the free magnetic layer in the track width direction,
said free magnetic layer including at least one of a $Ni_aFe_b$ layer, a NiFeX layer, an amorphous Co alloy layer containing an amorphous Co based magnetic material, and a CoFeX layer,
wherein a and b in $Ni_aFe_b$ represented by at % satisfy the relation of a>80 with a+b=100,
wherein X in the NiFeX layer represents at least one element selected from Mn, Cu, Zn, Ti, Al, Ge, Si, Cr, V, Sn, Ir, Ru, Nb, Sb, W, Mo, Os and Ta,
wherein X in the CoFeX layer represents at least one element selected from Ti, Al, Mn, Si, V, Cr, Ta, Zn, Sb, Ge, Mo and W,
wherein a second nonmagnetic layer comprising a precious metal is formed between the second antiferromagnetic layer and free magnetic layer, and
the second nonmagnetic layer has a smaller thickness at both side regions than a thickness at a central region.

48. The magnetic sensing element according to claim 47, wherein the second nonmagnetic layer comprises at least one of Ru, Rh, Pd, Ir, Os, Re, Pt and Au.

49. The magnetic sensing element according to claim 47, wherein the central region of the second nonmagnetic layer has a thickness of at least 3 Å and at most 20 Å.

* * * * *

UNITED STATES PATENT AND TRADEMARK OFFICE
CERTIFICATE OF CORRECTION

| | |
|---|---|
| PATENT NO. | : 6,995,961 B2 |
| APPLICATION NO. | : 10/400946 |
| DATED | : February 7, 2006 |
| INVENTOR(S) | : Naoya Hasegawa et al. |

It is certified that error appears in the above-identified patent and that said Letters Patent is hereby corrected as shown below:

<u>In the Claims</u>

Column 62, in claim 33, line 50, after "of the groove" delete "has a".

Column 62, in claim 33, line 51, before "at least 10" delete "thicknes of" and substitute --is-- in its place.

Column 64, in claim 47, line 42, after "Mo and W," insert --and--.

Signed and Sealed this

Twelfth Day of December, 2006

JON W. DUDAS
*Director of the United States Patent and Trademark Office*